United States Patent
Whetsel

(10) Patent No.: US 7,529,996 B2
(45) Date of Patent: May 5, 2009

(54) DDR INPUT INTERFACE TO IC TEST CONTROLLER CIRCUITRY

(75) Inventor: Lee D. Whetsel, Parker, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/774,269

(22) Filed: Jul. 6, 2007

(65) Prior Publication Data

US 2008/0034262 A1    Feb. 7, 2008

Related U.S. Application Data

(60) Provisional application No. 60/821,315, filed on Aug. 3, 2006.

(51) Int. Cl.
*G01R 31/28* (2006.01)
(52) U.S. Cl. ........................ 714/731; 714/729
(58) Field of Classification Search .......... 714/726–731
See application file for complete search history.

(56) References Cited

U.S. PATENT DOCUMENTS 6,938,225 B2 *   8/2005   Kundu ........................ 716/1

OTHER PUBLICATIONS

Double edge triggered devices: Speed and power constraints Hossain et al., A. Circuits and Systems, 1993., ISCAS '93, 1993 IEEE International Symposium on May 1993, pp. 1491-1494, vol. 3.*

* cited by examiner

*Primary Examiner*—Cynthia Britt
(74) *Attorney, Agent, or Firm*—Lawrence J. Bassuk; W. James Brady; Frederick J. Telecky, Jr.

(57) ABSTRACT

A device test architecture and a reduced device test interface are provided to enable efficient testing of embedded cores and other circuits within devices. The reduced device test interface is achieved using a double data rate (DDR) signaling technique between the tester and the device. The DDR test interface allows the tester to interface to test circuits within the device, such as IEEE 1500 and/or IEEE 1149.1 test circuits, to provide high test data bandwidth to the test circuits using a minimum of test interface signals. The test architecture includes compare circuits that allow for comparison of test response data to be performed within the device. The test architecture further includes a memory for storing the results of the test response comparisons. The test architecture includes a programmable test controller to allow for various test control operations by simply inputting an instruction to the programmable test controller from the external tester. Additional features and embodiments of the device test architecture and reduced test interface are also disclosed.

4 Claims, 49 Drawing Sheets

FIG. 14A
{
MODE 2:1:0 = 0:0:0 - LOAD TAM INSTRUCTION
MODE 2:1:0 = 0:0:1 - INSTRUCTION DEFINED OPERATION
MODE 2:1:0 = 0:1:0 - INSTRUCTION DEFINED OPERATION
MODE 2:1:0 = 0:1:1 - INSTRUCTION DEFINED OPERATION
MODE 2:1:0 = 1:0:0 - INSTRUCTION DEFINED OPERATION
MODE 2:1:0 = 1:0:1 - INSTRUCTION DEFINED OPERATION
MODE 2:1:0 = 1:1:0 - INSTRUCTION DEFINED OPERATION
MODE 2:1:0 = 1:1:1 - INSTRUCTION DEFINED OPERATION
}

FIG. 14B
{
MODE 2:1:0 = 0:0:0 - LOAD WIR SCAN INSTRUCTION
MODE 2:1:0 = 0:0:1 - CAPTURE WIR
MODE 2:1:0 = 0:1:0 - SHIFT WIR
MODE 2:1:0 = 0:1:1 - UPDATE WIR
MODE 2:1:0 = 1:0:0 - RESET WRAPPER
MODE 2:1:0 = 1:0:1 - NO-OP
MODE 2:1:0 = 1:1:0 - NO-OP
MODE 2:1:0 = 1:1:1 - NO-OP
}

FIG. 14C
{
MODE 2:1:0 = 0:0:0 - LOAD WBR SCAN INSTRUCTION
MODE 2:1:0 = 0:0:1 - CAPTURE WBR
MODE 2:1:0 = 0:1:0 - SHIFT WBR
MODE 2:1:0 = 0:1:1 - UPDATE WBR
MODE 2:1:0 = 1:0:0 - RESET WRAPPER
MODE 2:1:0 = 1:0:1 - NO-OP
MODE 2:1:0 = 1:1:0 - NO-OP
MODE 2:1:0 = 1:1:1 - NO-OP
}

FIG. 14D
{
MODE 2:1:0 = 0:0:0 - LOAD PARALLEL SCAN TEST INSTRUCTION
MODE 2:1:0 = 0:0:1 - LOAD STIMULUS DATA
MODE 2:1:0 = 0:1:0 - LOAD EXPECTED DATA
MODE 2:1:0 = 0:1:1 - LOAD MASK DATA
MODE 2:1:0 = 1:0:0 - SHIFT SCAN PATHS AND COMPARE RESPONSE
MODE 2:1:0 = 1:0:1 - CAPTURE RESPONSE INTO SCAN PATHS
MODE 2:1:0 = 1:1:0 - RESET SCAN CYCLE COUNTER AND FIFOs
MODE 2:1:0 = 1:1:1 - NO-OP
}

FIG. 14E
{
MODE 2:1:0 = 0:0:0 - LOAD FAIL DATA SCAN INSTRUCTION
MODE 2:1:0 = 0:0:1 - CAPTURE FAIL DATA
MODE 2:1:0 = 0:1:0 - SHIFT FAIL DATA
MODE 2:1:0 = 0:1:1 - NO-OP
MODE 2:1:0 = 1:0:0 - NO-OP
MODE 2:1:0 = 1:0:1 - NO-OP
MODE 2:1:0 = 1:1:0 - NO-OP
MODE 2:1:0 = 1:1:1 - NO-OP
}

FIG. 14F
{
MODE 2:1:0 = 0:0:0 - LOAD WIR AND WBR SCAN INSTRUCTION
MODE 2:1:0 = 0:0:1 - CAPTURE WIR
MODE 2:1:0 = 0:1:0 - SHIFT WIR
MODE 2:1:0 = 0:1:1 - UPDATE WIR
MODE 2:1:0 = 1:0:0 - CAPTURE WBR
MODE 2:1:0 = 1:0:1 - SHIFT WBR
MODE 2:1:0 = 1:1:0 - UPDATE WBR
MODE 2:1:0 = 1:1:1 - RESET WRAPPER
}

FIG. 16A
- MODE 2:1:0 = 0:0:0 - INSTRUCTION DEFINED OPERATION
- MODE 2:1:0 = 0:0:1 - INSTRUCTION DEFINED OPERATION
- MODE 2:1:0 = 0:1:0 - INSTRUCTION DEFINED OPERATION
- MODE 2:1:0 = 0:1:1 - INSTRUCTION DEFINED OPERATION
- MODE 2:1:0 = 1:0:0 - INSTRUCTION DEFINED OPERATION
- MODE 2:1:0 = 1:0:1 - INSTRUCTION DEFINED OPERATION
- MODE 2:1:0 = 1:1:0 - INSTRUCTION DEFINED OPERATION
- MODE 2:1:0 = 1:1:1 - INSTRUCTION DEFINED OPERATION

FIG. 16B
- MODE 2:1:0 = 0:0:0 - CAPTURE WIR
- MODE 2:1:0 = 0:0:1 - SHIFT WIR
- MODE 2:1:0 = 0:1:0 - UPDATE WIR
- MODE 2:1:0 = 0:1:1 - RESET WRAPPER
- MODE 2:1:0 = 1:0:0 - NO-OP
- MODE 2:1:0 = 1:0:1 - NO-OP
- MODE 2:1:0 = 1:1:0 - NO-OP
- MODE 2:1:0 = 1:1:1 - NO-OP

FIG. 16C
- MODE 2:1:0 = 0:0:0 - CAPTURE WBR
- MODE 2:1:0 = 0:0:1 - SHIFT WBR
- MODE 2:1:0 = 0:1:0 - UPDATE WBR
- MODE 2:1:0 = 0:1:1 - RESET WRAPPER
- MODE 2:1:0 = 1:0:0 - NO-OP
- MODE 2:1:0 = 1:0:1 - NO-OP
- MODE 2:1:0 = 1:1:0 - NO-OP
- MODE 2:1:0 = 1:1:1 - NO-OP

FIG. 16D
{
MODE 2:1:0 = 0:0:0 - LOAD STIMULUS DATA
MODE 2:1:0 = 0:0:1 - LOAD EXPECTED DATA
MODE 2:1:0 = 0:1:0 - LOAD MASK DATA
MODE 2:1:0 = 0:1:1 - SHIFT SCAN PATHS AND COMPARE RESPONSE
MODE 2:1:0 = 1:0:0 - CAPTURE RESPONSE INTO SCAN PATHS
MODE 2:1:0 = 1:0:1 - RESET SCAN CYCLE COUNTER AND FIFOs
MODE 2:1:0 = 1:1:0 - NO-OP
MODE 2:1:0 = 1:1:1 - NO-OP
}

FIG. 16E
{
MODE 2:1:0 = 0:0:0 - CAPTURE FAIL DATA
MODE 2:1:0 = 0:0:1 - SHIFT FAIL DATA
MODE 2:1:0 = 0:1:0 - NO-OP
MODE 2:1:0 = 0:1:1 - NO-OP
MODE 2:1:0 = 1:0:0 - NO-OP
MODE 2:1:0 = 1:0:1 - NO-OP
MODE 2:1:0 = 1:1:0 - NO-OP
MODE 2:1:0 = 1:1:1 - NO-OP
}

FIG. 16F
{
MODE 2:1:0 = 0:0:0 - CAPTURE WIR
MODE 2:1:0 = 0:0:1 - SHIFT WIR
MODE 2:1:0 = 0:1:0 - UPDATE WIR
MODE 2:1:0 = 0:1:1 - CAPTURE WBR
MODE 2:1:0 = 1:0:0 - SHIFT WBR
MODE 2:1:0 = 1:0:1 - UPDATE WBR
MODE 2:1:0 = 1:1:0 - RESET WRAPPER
MODE 2:1:0 = 1:1:1 - NO-OP
}

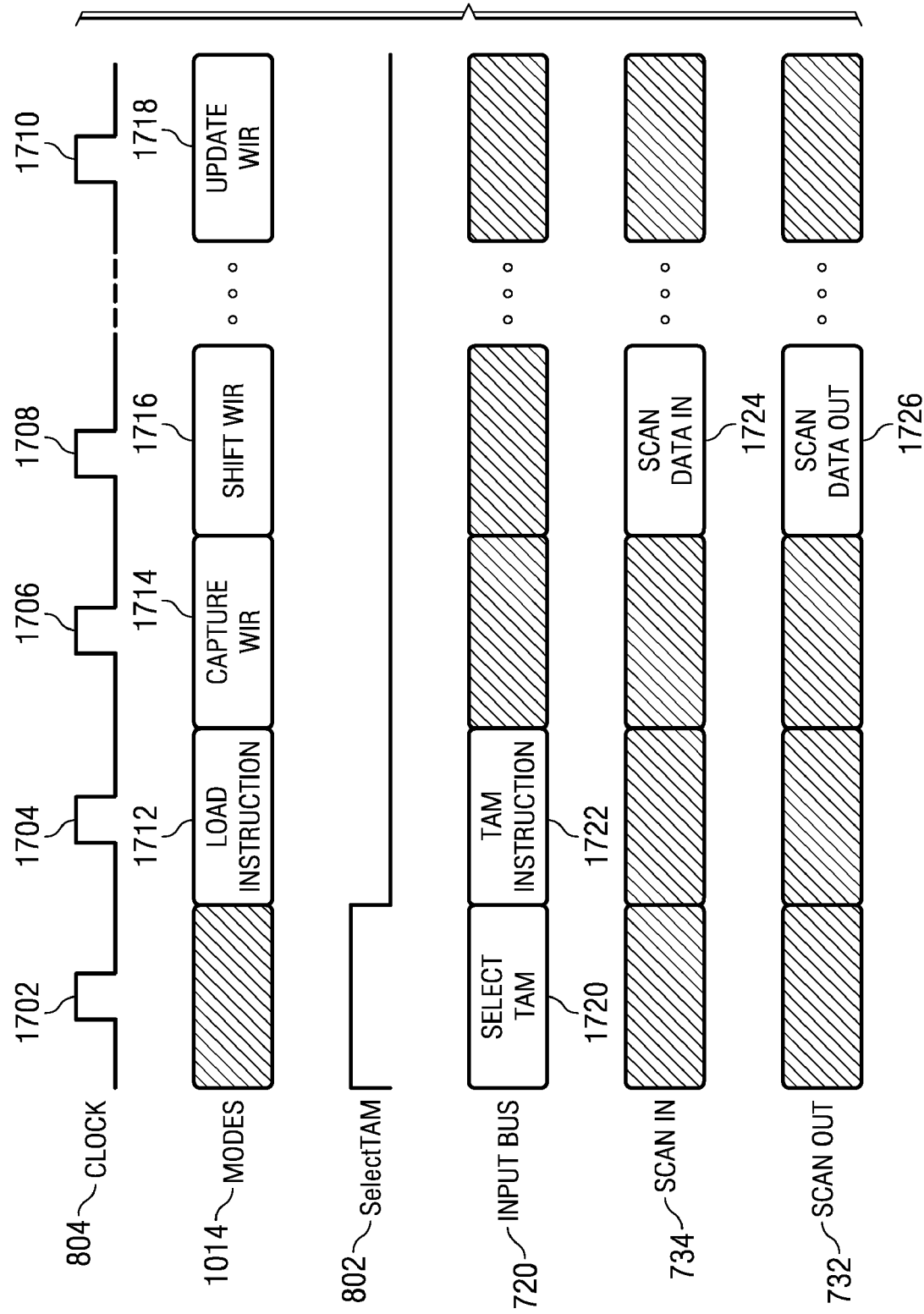

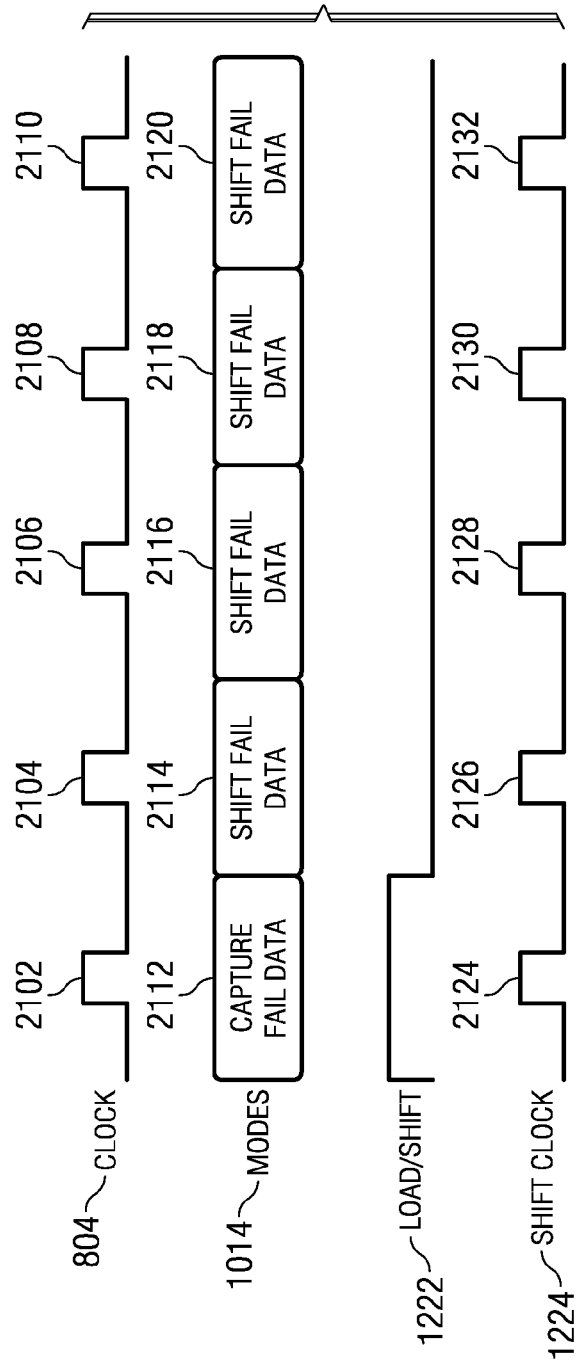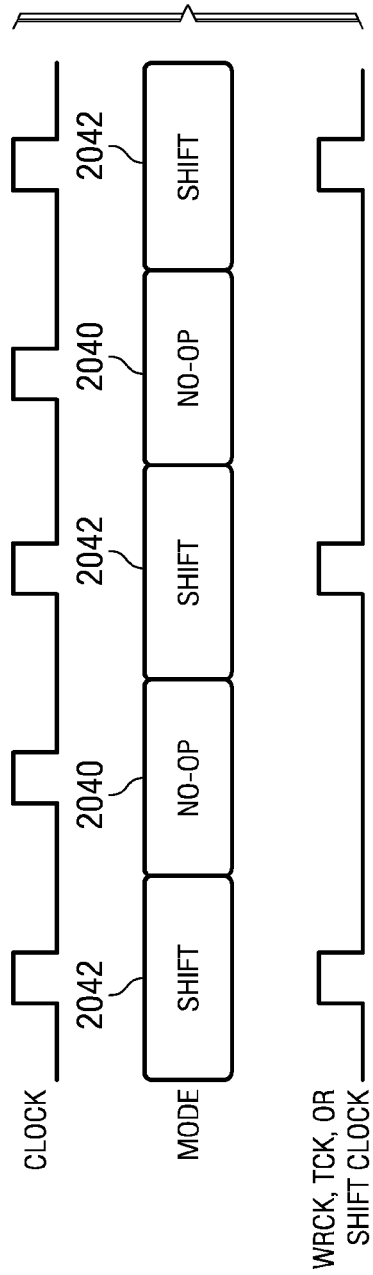

DDR INPUT INTERFACE TO IC TEST CONTROLLER CIRCUITRY

This application claims priority from Provisional Application No. 60/821,315.

FIELD OF THE INVENTION

DESCRIPTION OF RELATED ART

FIG. 1 illustrates the test wrapper architecture 102 defined in IEEE standard 1500. The wrapper architecture is used to perform internal testing of a core circuit 104 embedded within and integrated circuit. The wrapper architecture is also used to perform external testing of the interconnects to other embedded core circuits connected to the embedded core circuit 104. The wrapper architecture is very similar to the boundary scan test architecture defined in IEEE 1149.1, in that it includes: (1) a wrapper instruction register (WIR) 106 for storing test instructions, (2) a wrapper bypass register (WBY) 108 for providing an abbreviated scan path through the wrapper, and a wrapper boundary register (WBR) 110 for controlling the core outputs, controlling the core inputs, observing the core outputs, and observing the core inputs. When the core is in normal mode, the external core inputs 116 are coupled to the internal core inputs 118 via the WBR, and the internal core outputs 122 are coupled to the external core outputs 120 via the WBR. When the core is in external test mode, the external core inputs 116 can be observed by the WBR and external core outputs 120 can be controlled by the WBR. When the core is in internal test mode, the internal core inputs 118 can be controlled by the WBR and the internal core outputs 122 can be observed by the WBR.

The wrapper architecture has a wrapper serial input (WSI) 126 and a wrapper serial output (WSO) 128. WSI and WSO are similar to the TDI and TDO signals of the 1149.1 test architecture and are used to input instruction and data to the architecture. The wrapper architecture has control signals 124 consisting of: a wrapper clock (WRCK) for timing instruction and data scan operations, a capture wrapper signal (CaptureWR) for capturing data into the WIR, WBR, WBY, or data register scan paths 112 of the core circuit, a shift wrapper signal (ShiftWR) for controlling the shifting of the WIR, WBR, WBY, or data register scan paths, an update wrapper signal (UpdateWR) for updating data from the WIR, WBR, or data register scan paths, an optional transfer data register signal (TransferDR) for performing at speed tests using the WBR, a select wrapper instruction register signal (SelectWIR) for selecting either the WIR, or the WBR, WBY, or a selected data register scan path for serial access via WSI and WSO, and a wrapper reset signal (WRST) to reset the WIR and other circuits in the wrapper. These control signals 124 are input to a wrapper control interface 114. In response to these control signals, the wrapper control interface outputs instruction register (IR) control to operate the instruction register or data register (DR) control to operate the WBR and/or data register scan paths. The IEEE standard 1500 test wrapper architecture of FIG. 1 is well known.

FIG. 2 illustrates one example implementation of a wrapper control interface 114 for receiving the control signals 124. As seen the WRCK, ShiftWR, CaptureWR, UpdateWR, and SelectWIR control signals are input to a selector circuit 202 which is controlled by the SelectWIR signal. When the SelectWIR signal input to selector circuit 202 is low, the WRCK drives ClockDR, ShiftWR drives ShiftDR, CaptureWR drives CaptureDR, and UpdateWR drives UpdateDR. The ClockDR, ShiftDR, CaptureDR, and UpdateDR signals form the DR control bus that controls the WBR 110 and/or data register scan paths 112 of FIG. 1. When the SelectWIR signal input to selector circuit 202 is high, the WRCK drives ClockIR, ShiftWR drives ShiftIR, CaptureWR drives CaptureIR, and UpdateWR drives UpdateIR. The ClockIR, ShiftIR, CaptureIR, and UpdateIR signals form the IR control bus that controls the WIR 106 of FIG. 1. The WRST control signal drives a Reset signal that is used to initialize the WIR and other circuits within the test architecture. The optional TransferDR control signal, if used, passes through the wrapper control interface to the WBR.

FIG. 3 illustrates a simplified view of the test wrapper architecture 102 of FIG. 1 that includes only the core data register scan paths 112 and wrapper control interface 114. This wrapper test mode is enabled by loading the WIR with a core test instruction. As seen, and as described in the IEEE 1500 standard, the serial input of each data register scan path 112 may be coupled to a wrapper parallel input (WPI) signal 302 and the serial data output of each data register scan path 112 may be coupled to a wrapper parallel output (WPO) signal 304. In this arrangement, parallel scan testing is achieved by inputting stimulus to each data register scan path via a WPI input and outputting response data from each data register scan path via a WPO output. The control inputs 124 to the wrapper control interface 114 control the capture and shift operations of the parallel data register scan paths 112. This type of parallel scan testing is used to test combinational logic and is well known.

FIG. 4 illustrates a simplified view of the test wrapper architecture 102 of FIG. 1 that includes only the core data register scan paths 112, WBR input sections 402, WBR output sections 404, and wrapper control interface 114. This wrapper test mode is enabled by loading the WIR with a core test instruction. As seen in FIG. 4, and as described in the IEEE 1500 standard, the WBR 110 of FIG. 1 may be partitioned into smaller length WBR sections 402 and 404. The WBR sections can be placed in series with a core data register 112 to form a scan path 406 that includes both WBR scan cells and core data register scan cells. As with the data register scan paths of FIG. 3, the serial input of each scan path 406 may be coupled to a WPI signal 302 and the serial data output of each scan path 406 may be coupled to a WPO signal 304. In this arrangement, parallel scan testing is achieved by inputting stimulus to each scan path 406 via a WPI input and outputting response data from each scan path 406 via a WPO output. The control inputs 124 to the wrapper control interface 114 control the capture and shift operations of the parallel scan paths 406. During the parallel scan test, external inputs 116 and internal outputs 122 to the WBR sections are observable and internal inputs 118 and external outputs 120 from the WBR sections are controllable. Being able to control and observe the core boundary input and output signals during parallel scan testing of the core improves the ability to fully test the core. This type of parallel scan testing is similar to the one described in FIG. 3 with the exception that WBR sections are included in series with the data register scan paths 112.

FIG. 5 illustrates a device under test (DUT) 502, such as a packaged integrated circuit, a die singulated from a wafer, or die on a wafer, coupled to a tester 504 for testing. The DUT contains a number of embedded cores 1-N, each including the IEEE 1500 wrapper architecture of FIG. 1. As seen, the tester has output circuitry 506 to drive stimulus data to the WPIs 510 of each core wrapper, input circuitry 508 to receive response data from the WPOs 512 of each core wrapper, control outputs 514 to drive the control signal inputs 124 of each core wrapper, an output 516 to drive the WSI input 126 of the DUT, and an input 518 to receive WSO output 128 from the DUT.

As seen, the core wrappers are daisychained between the DUT's WSI input 126 and WSO output 128. While not shown, the DUT will also have a test enable input from the tester that is used to switch the DUT from its functional architectural configuration into the test architectural configuration shown in FIG. 5. The tester starts the test by outputting control to control bus 124 to scan a test instruction into the WIRs of each core wrapper via WSI and WSO. The test instructions, in this example, configure each core wrapper for parallel scan testing via WPI and WPO as described in FIG. 3 or 4. During the test, the tester outputs control to control bus 124 to cause the core wrappers to perform parallel scan testing by inputting WPI stimulus data from output circuits 506 and outputting WPO response data to input circuits 508, according to conventional capture and shift scan operations. As seen, testing all cores at the same time requires the tester to have an output circuit 506 and an input circuit 508 for each core wrapper. Each tester output circuit 506 typically includes a stimulus data memory to drive stimulus data to the WPI of each core wrapper. Each tester input circuit 508 typically includes a mask data memory, an expected data memory, and a compare circuit to compare unmasked expected data with the response data from WPO. With conventional testers, it is possible to use a single output circuit 506 to simultaneously broadcast WPI stimulus data to all cores within a DUT. However, conventional testers will require a separate input circuit 508 to receive the response data from each core to enable detection of core specific fail response data. Testers, like tester 504, that include a sufficient number of output 506 and input 508 circuits for testing large numbers of embedded cores as described above are very costly. The tester cost problem worsens significantly when multiple DUTs 502 need to be tested simultaneously, such as at wafer level testing where multiple die (DUTs) need to be contacted and simultaneously tested to reduce semiconductor manufacturing cost.

FIG. 6 illustrates a DUT 602 coupled to a tester 604 for testing. The DUT contains a number of embedded cores 1-N, each including the IEEE 1500 wrapper architecture of FIG. 1. The DUT of FIG. 6 differs from the DUT of FIG. 5 in that it includes a user defined test access mechanism (TAM). User defined TAMs are mentioned in IEEE standard 1500, but the standard does not provide standardization of such circuits. As the name implies the user defines the operation and function of TAM circuits. In this example, a user defined TAM is shown that provides an interface between a selected core wrapper's WPI and WPO buses and the tester's output circuit 506 and input circuit 508 respectively. This type of TAM is known in the art. Once an interface is made between the tester and a first core wrapper via the TAM, the first core is tested using the parallel scan approach described in FIG. 5. When the first core has been tested, the TAM interfaces to a second core wrapper to similarly test the second core. This core wrapper selection and core test process repeats until all the embedded cores have been tested. As seen, since only one core is tested at a time, the tester only requires one output circuit 506 and one input circuit 508. Thus the tester cost is reduced, but the test time of the DUT increases over that of FIG. 5 since the cores are tested one at a time. As with the tester 504 of FIG. 5, the tester 604 cost increases when multiple DUTs 602 need to be tested simultaneously (i.e. simultaneous testing of multiple die on wafer, singulated die in fixture, or packaged die in fixture) since the tester would need to have additional output 506 and input 508 circuits for each DUT being contacted and simultaneously tested. As mentioned in regard to FIG. 5, conventional testers may use a single output circuit 506 for each DUT, but they will require a separate input circuit 508 for each DUT.

SUMMARY OF THE INVENTION

The present invention provides a device test architecture, interface, and method for enabling efficient testing of large numbers of devices simultaneously. The device test architecture internally evaluates the test response using a compare circuit within the device, which eliminates the need to output the device test response to the tester. The inventions ability to evaluate test response inside the devices simplifies testers to only having to input test data and control to the device. The device test architecture includes a programmable test controller that can be programmed by an instruction to perform any number of test operations without having to increase the number of signals on the test interface.

DESCRIPTION OF THE VIEWS OF THE DRAWINGS

FIGS. 14A-14F illustrate the operation of the first TAM controller in response to TAM controller instructions according to the present invention.

FIGS. 16A-16F illustrate the operation of the second TAM controller in response to TAM controller instructions according to the present invention.

FIG. 17 illustrates the timing of selecting a TAM controller, instructing a TAM controller, and executing a wrapper instruction scan operation using the TAM controller according to the present invention.

FIG. 21 illustrates detail timing of scanning fail data out of a TAM using the TAM according to the present invention FIG. 21A illustrates using No-Op Mode patterns during shift operations.

DETAILED DESCRIPTION

Figure 1:
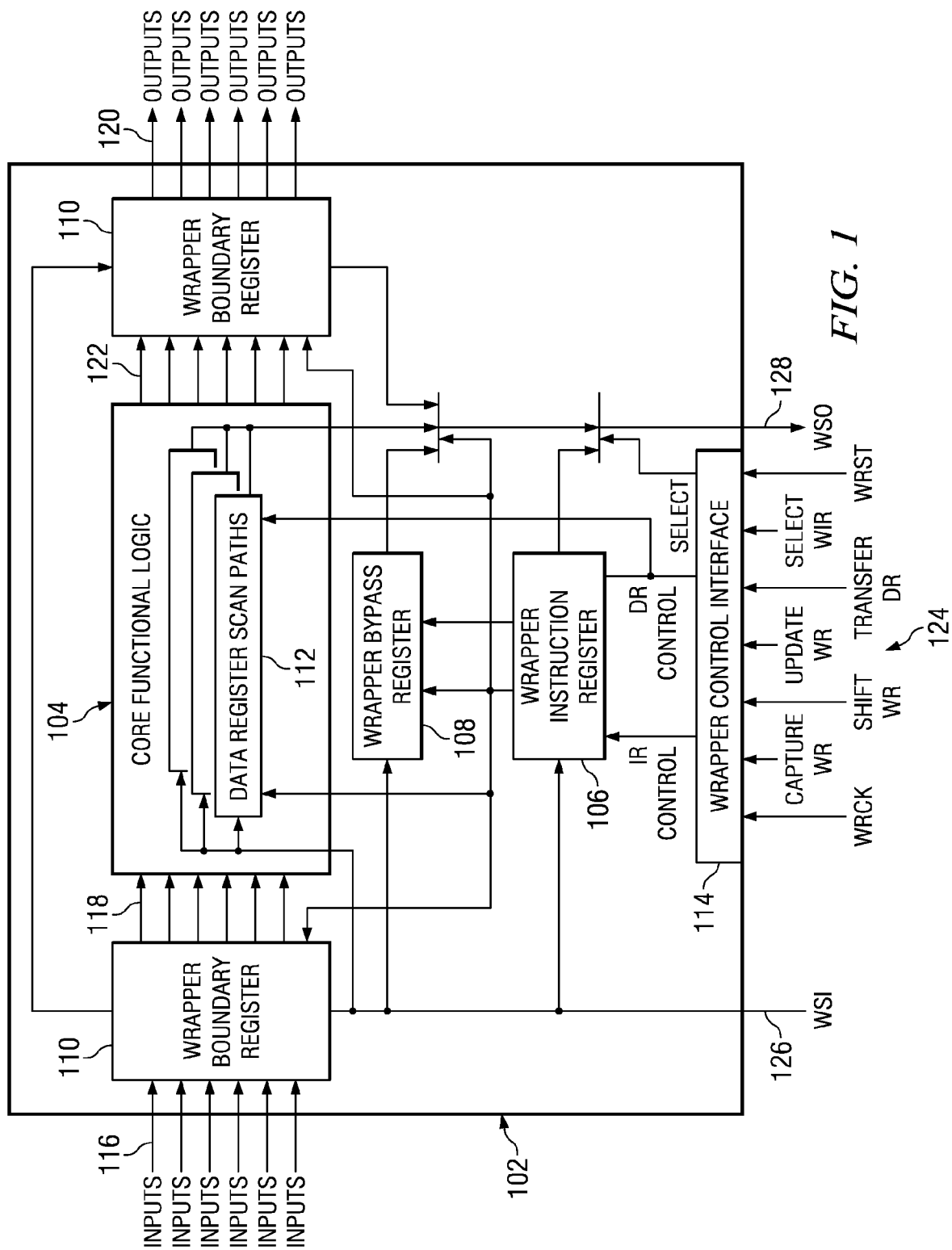
FIG. 1 illustrates the prior art architecture of the IEEE 1500 Core Wrapper standard.
Figure 2:
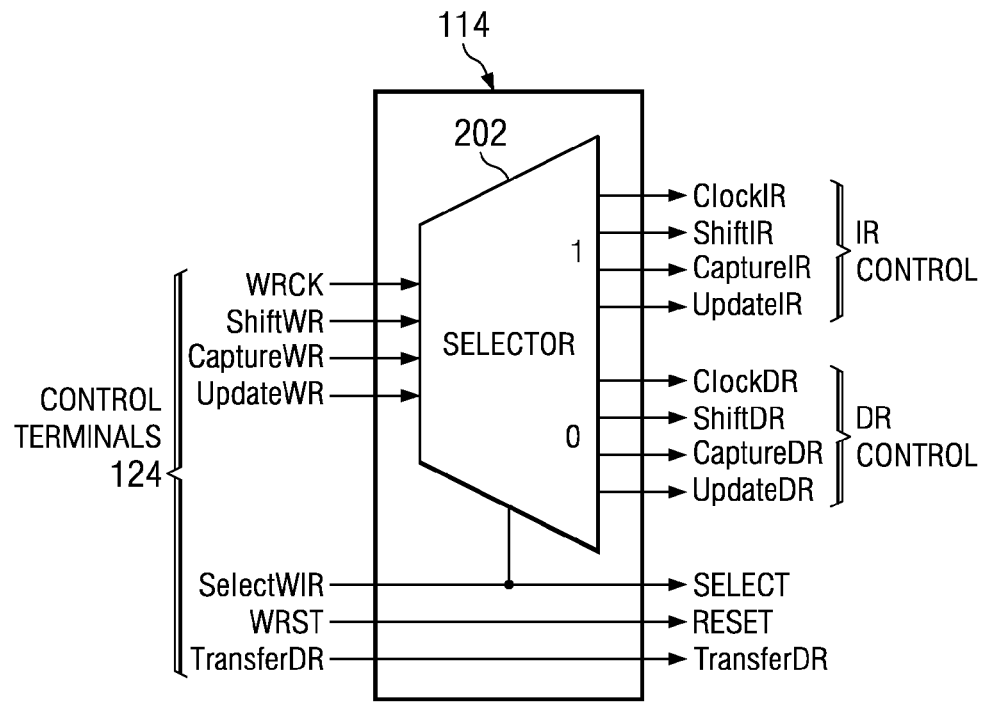
FIG. 2 illustrates an example of the control interface to the IEEE 1500 standard.
Figure 5:
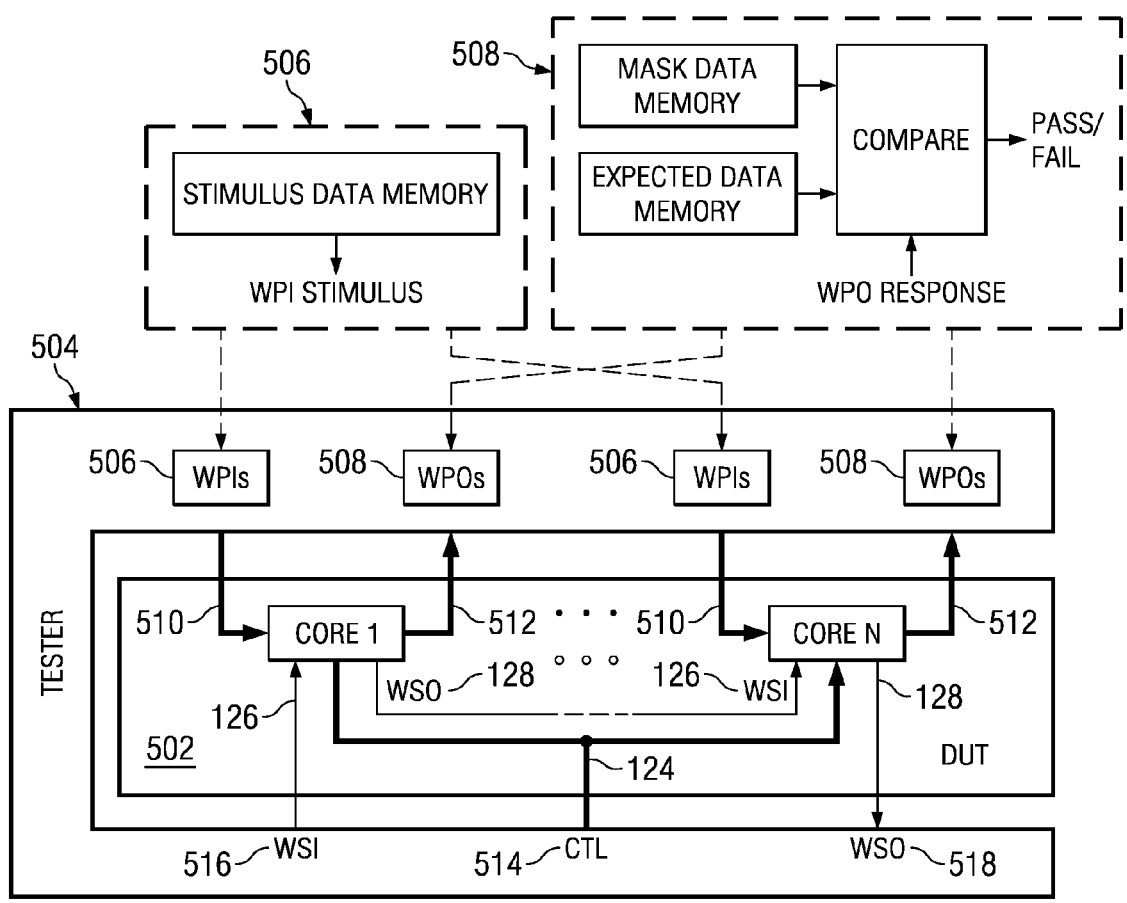
FIG. 5 illustrates a tester connected to a device containing cores with IEEE 1500 wrappers.
Figure 6:
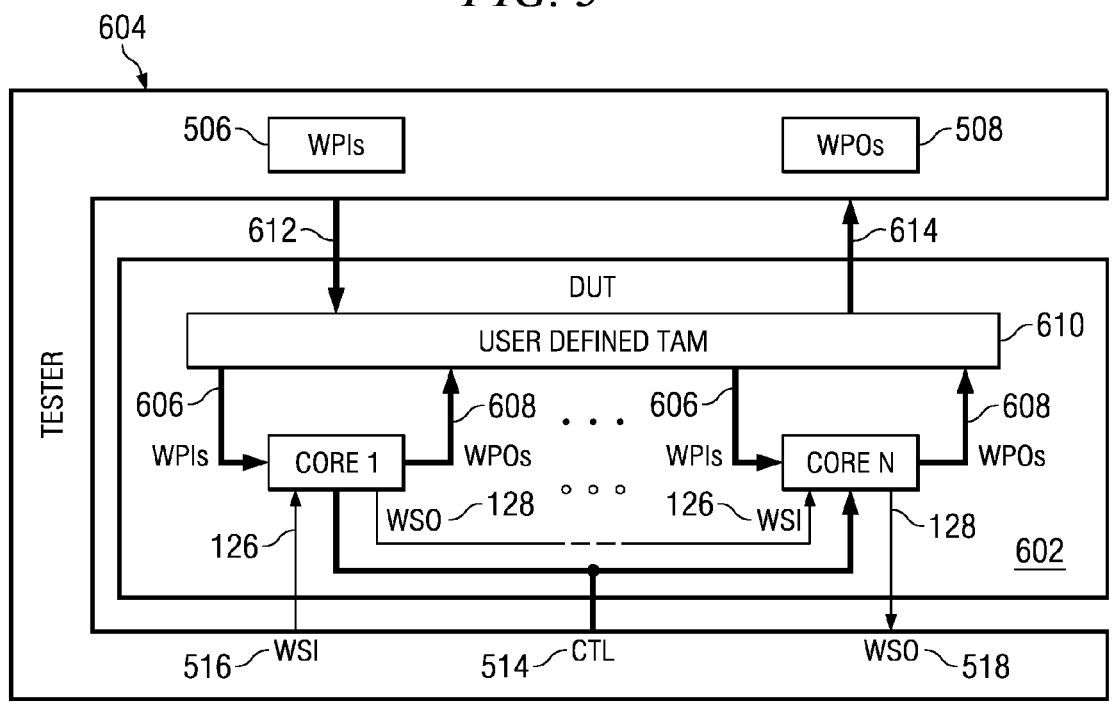
FIG. 6 illustrates a tester connected to a user defined test access mechanism (TAM) that provides access to cores with IEEE 1500 wrappers.
Figure 7:
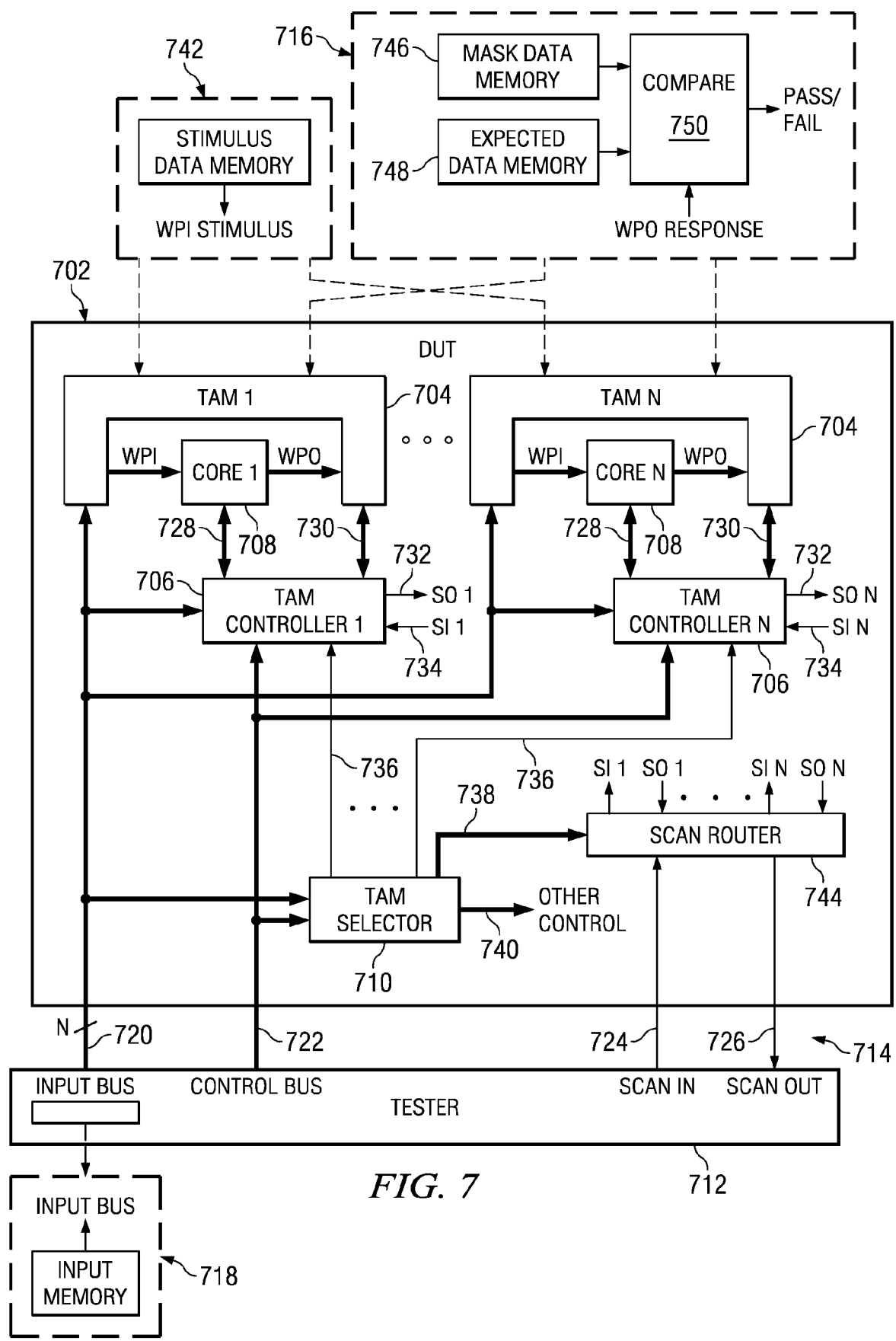
FIG. 7 illustrates a tester connected to a device that contain the architecture of the present invention.

FIG. 7 illustrates a preferred embodiment of the testing method, testing apparatus, and testing system as disclosed in the present invention. The embodiment includes a DUT 702 test architecture, a DUT tester 712, and a DUT to tester interface 714 including an input bus 720, a control bus 722, a scan input 724 and a scan output 726. While not shown and as mentioned previously in regard to FIG. 5, the DUT will also have a test enable input from the tester that is used to switch the DUT from its functional architectural configuration into the test architectural configuration shown in FIG. 7. The DUT test architecture includes a TAM 704 for each embedded core 708, a TAM controller 706 for each embedded core 708, a TAM selector 710 for selecting an embedded core's TAM 704 and TAM controller 706, and a scan router 744 for routing the flow of serial data between tester 712 and various TAM controllers 706. Each embedded core 708 includes an IEEE 1500 wrapper architecture 102 and interface as shown in FIG. 1. The embedded cores 708 could be the same or different cores types. Core 708 types may include but are not limited to digital signal processing cores, microprocessor cores, and mixed signal cores. The input bus 720 from the tester is input to the TAMs 704, the TAM controllers 706, and the TAM selector 710. The control bus 722 from the tester is input to the TAM controllers 706 and the TAM selector 710. The scan input 724 from the tester is input to the scan router 744 and the scan output 726 from the scan router is input to the tester. The TAMs 704 input WPI signals to the cores 708 and receive WPO signals from the cores 708. The TAM controllers 706 are coupled to the TAMs 704 via bus 730, to the core wrappers via bus 728, and to the scan router 744 via scan out (SO) 732 and scan in (SI) 734 signals. The TAM selector is coupled to each TAM controller via select signals 736, to the scan router via control bus 738, and to any other required circuits via bus 740.

As seen, the only output from the DUT to the tester is the scan output 726, all other tester interface signals 720, 722, and 724 are inputs to the DUT. Each TAM 704 includes a stimulus data memory 742 for inputting WPI stimulus data to each core wrapper. Each TAM 704 includes a compare circuit 716 that includes a mask data memory 746, an expected data memory 748, and a circuit 750 for comparing WPO response data from each wrapper to unmasked expected data. Since each TAM includes compare circuit 716, the core wrapper's WPO response data does not have to be sent to the tester, rather the WPO response data is compared within the TAMs using compare circuit 716. The tester has an input circuit 718 that drives the input bus 720 to the DUT. The input circuit 718 is used to input mask and expected data to the mask 746 and expected 748 data memories of compare circuit 716, stimulus data to stimulus data memory 742, and TAM selection data to TAM selector 710. The tester also has circuitry for outputting control on bus 722, circuitry for outputting serial data on scan in 724, and circuitry for inputting serial data from scan out 726.

Figure 8A:
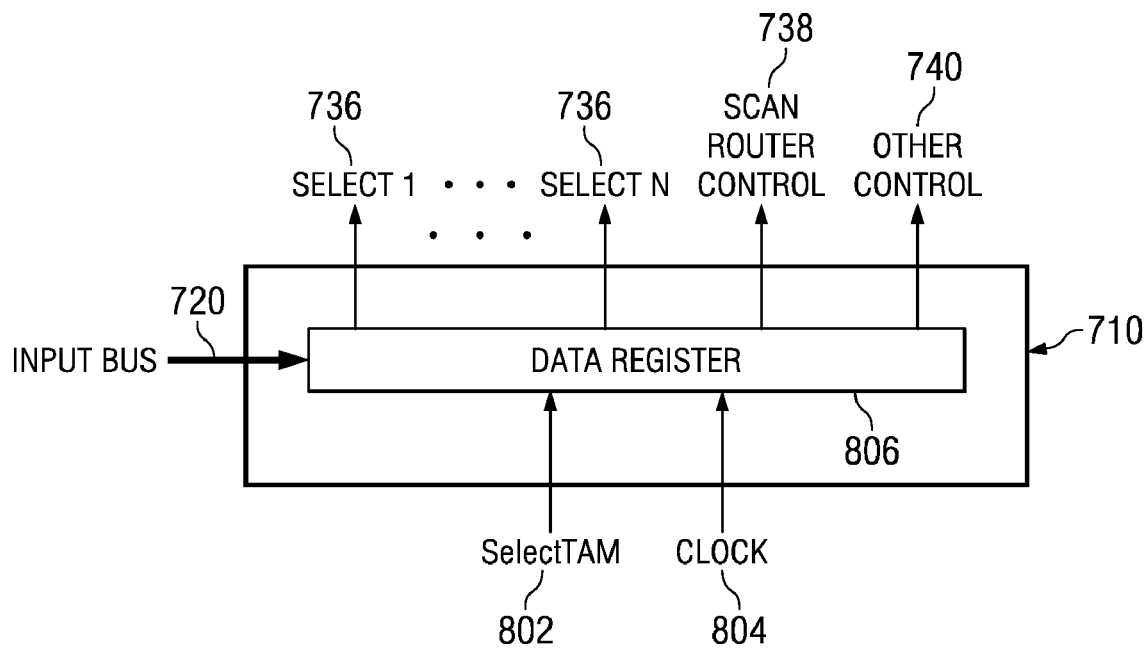
FIGS. 8A and 8B illustrate example implementations of the TAM selector of the present invention.

FIG. 8A illustrates a first example implementation of the TAM selector 710 of FIG. 7. The TAM selector 710 includes a data register 806 containing a number of bit positions. The data register has data inputs coupled to input bus 720, a SelectTAM signal 802 from control bus 722, a clock signal 804 from control bus 722, and data outputs for outputting the select signals 736, the scan router control bus 738, and the other control bus 740 of FIG. 7. If the SelectTAM signal 802 is active, data on the input bus 720 is written into the data register 806 by the clock signal 804. If the SelectTAM signal is inactive, data on the input bus 720 is not written into the data register. The data written into the data register is output on the select signals 736 to select one or more of the TAM controllers 706, output on the scan router control bus 738 to select how serial data is routed through the scan router 744, and output on the other control bus 740 to control any other circuits that may be present in the DUT architecture of FIG. 7 and need to be controlled by the TAM selector 710.

Figure 8B:
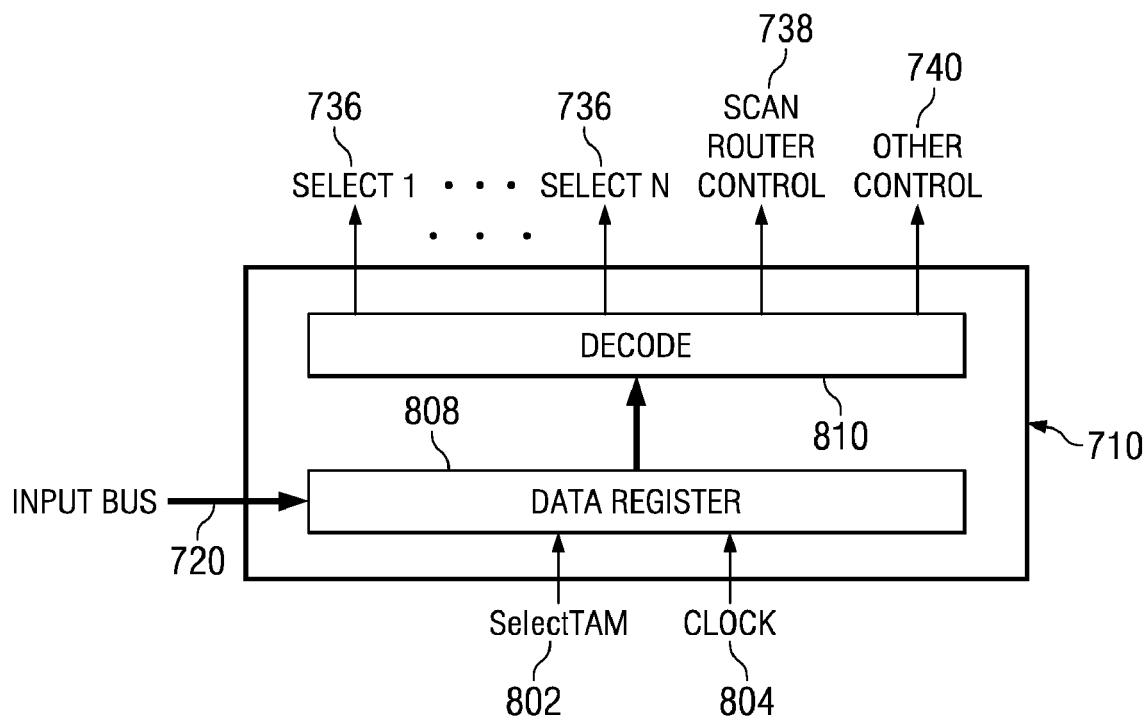

FIG. 8B illustrates a second example implementation of the TAM selector 710 of FIG. 7. The TAM selector 710 includes a data register 808 containing a number of bit positions. The data register has data inputs coupled to input bus 720, a SelectTAM signal 802 from control bus 722, a clock signal 804 from control bus 722, and data outputs coupled to a decode circuit 810. The decode circuit 810 has data inputs from the data register and data outputs for outputting the select signals 736, the scan router control bus 738, and the other control bus 740 of FIG. 7. If the SelectTAM signal 802 is active, data on the input bus 720 is written into the data register 806 by the clock signal 804. If the SelectTAM signal is inactive, data on the input bus 720 is not written into the data register. The data written into the data register is output to the decode circuit 810 where it is decoded and output on the select signals 736 to select one or more of the TAM controllers 706, output on the scan router control bus 738 to select how serial data is routed through the scan router 744, and output on the other control bus 740 to control any other circuits that may be present in the DUT architecture of FIG. 7 and need to be controlled by the TAM selector 710. Since the TAM selector of FIG. 8B uses a decode circuit 810, the data register 808 may be shorter in bit width than the data register 806 of FIG. 8A. The use of the TAM selector of FIG. 8B may be necessary instead of the TAM selector of FIG. 8A if the number of bits required to control the select signals 736, the scan router control bus signals 738, and the other control bus signals 740 exceed the bit width of the input bus 720. For example, using the decode circuit 810, an 8 bit wide input bus 720 to the TAM selector of FIG. 8B could be used to control a 16 bit wide select and control bus output from the TAM selector.

Figure 9:
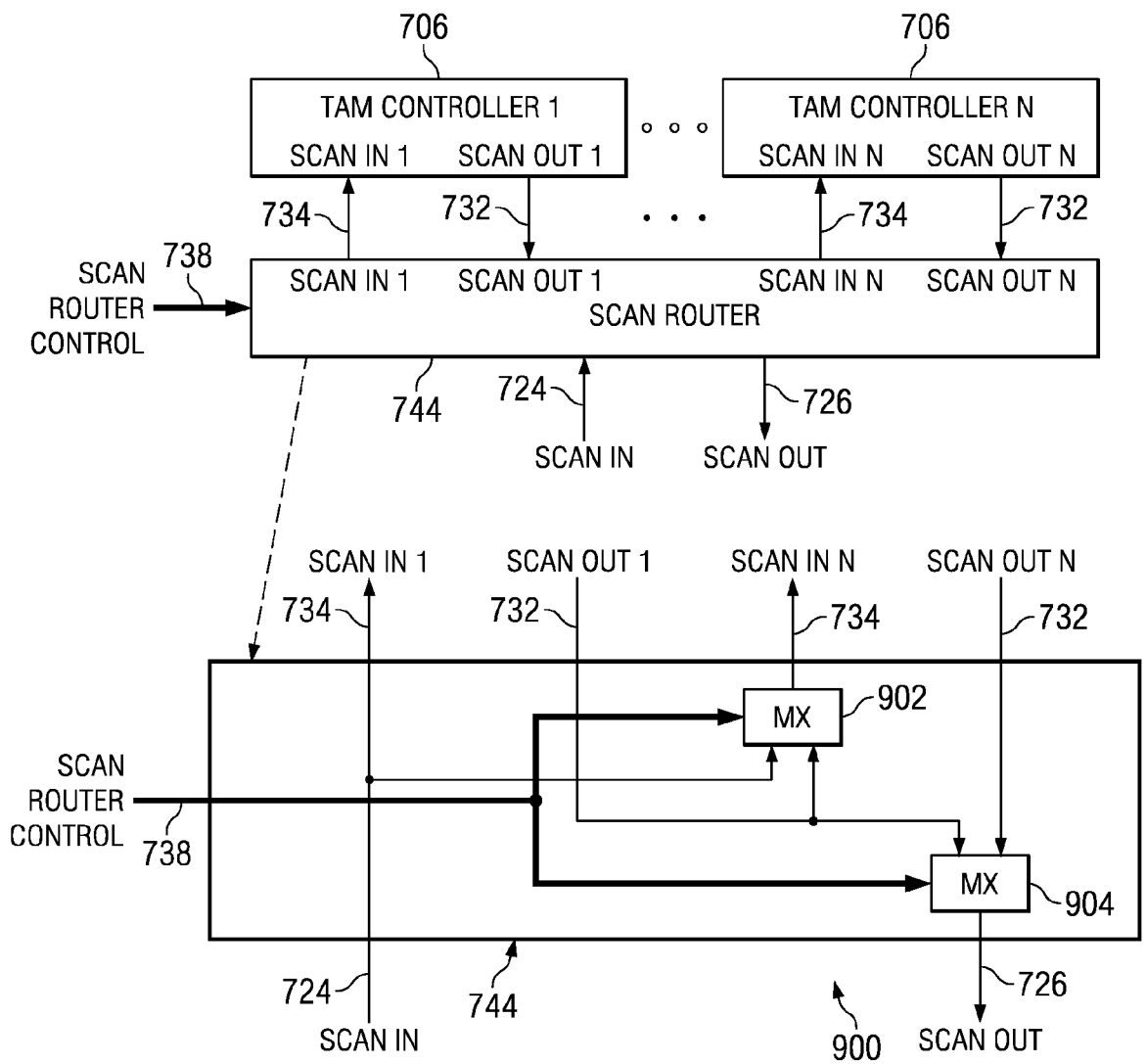
FIG. 9 illustrates an example implementation of the Scan Router of the present invention.

FIG. 9 illustrates an example implementation of the scan router 744 of FIG. 7. As mentioned, the scan router is a circuit that routes the flow of serial data between the tester 712 and TAM controllers 706. The scan router has inputs for receiving the TAM selector's control bus 738, the tester's scan in signal 724, and the TAM controllers scan out signals 732. The scan router has outputs for outputting to the testers scan out signal 726 and the TAM controllers scan in signals 734. As seen in one detailed example of a scan router circuit 900, the control bus 738 is used to control multiplexers 902 and 904. In a first multiplexer control setting, the scan input signal 724 from the tester can be input to the scan input signal 734 of TAM controller 1 and the scan output signal 732 of TAM controller 1 can be output to the tester scan out signal 726 via multiplexer 904. This first control setting is used to allow the tester to serially access TAM controller 1. In a second multiplexer control setting, the scan input signal 724 from the tester can be input to the scan input signal 734 of TAM controller N via multiplexer 902 and the scan output signal 732 of TAM controller N can be output to the tester scan out signal 726 via multiplexer 904. This second control setting is used to allow the tester to serially access TAM controller N. In a third multiplexer control setting, the scan input signal 724 from the tester can be input to the scan input signal 734 of TAM controller 1, the scan output signal 732 of TAM controller 1 can be input to the scan input signal 734 of TAM controller N via multiplexer 902, and the scan output signal 732 of TAM controller N can be input to the tester scan out signal 726 via multiplexer 904. This third control setting is used to allow the tester to serially access both TAM controller 1 and TAM controller N. During a test that involves only one core, the tester will typically only select the TAM controller of that core for serial access to abbreviate the length of the serial scan path. An example of this type of testing is when one core is being tested via the WPI and WPO buses between the core 708 and the TAM 705. During a test that involves multiple cores, the tester will typically select all the TAM controllers of the cores involved with the test. An example of this type of testing is when the functional interconnects between multiple cores are being tested using an external test instruction that uses the wrapper boundary scan register (WBR) 110 as described in the IEEE 1500 standard. While the scan router example 900 only shows connections to two TAM controllers 706, any number of TAM controllers may be connected to the scan router to be accessed individually or in any desired combination.

Figure 10:
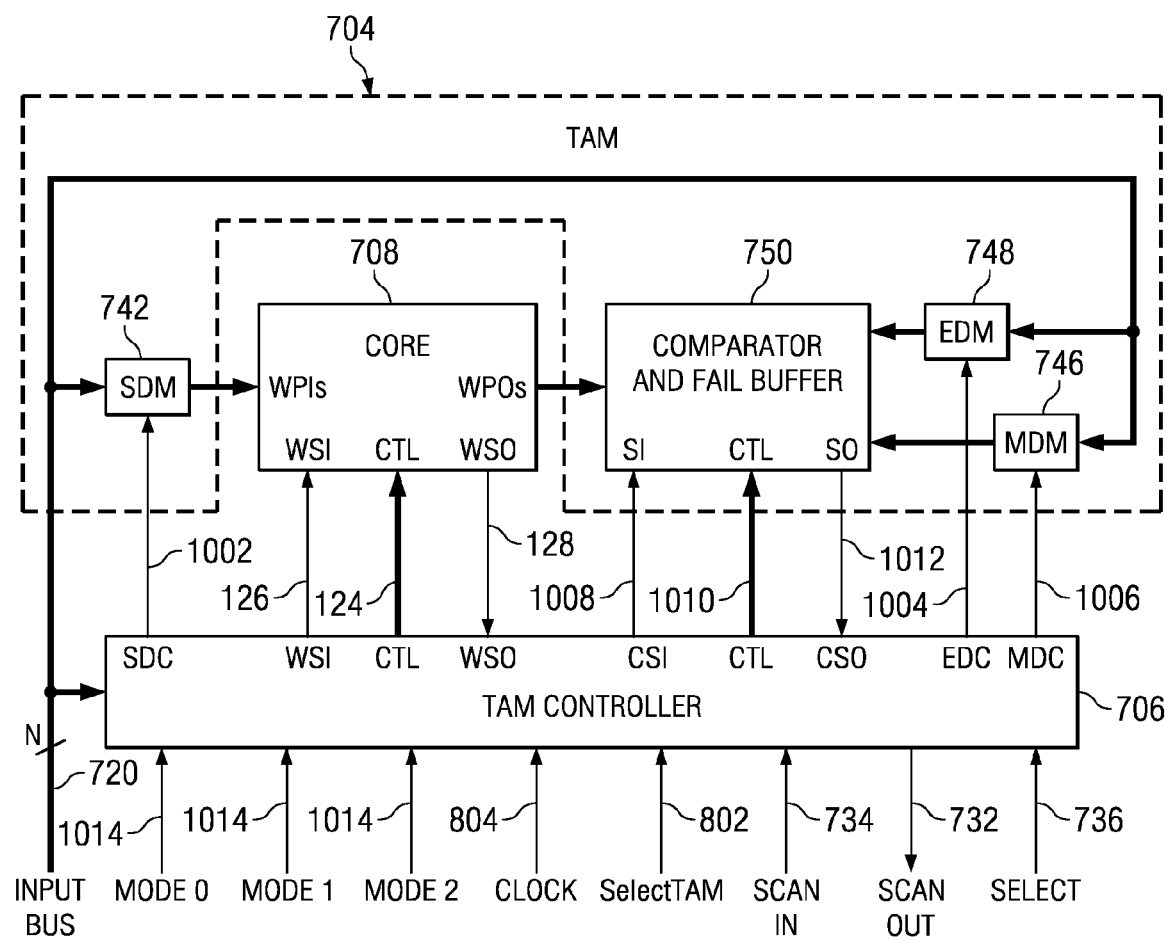
FIG. 10 illustrates a TAM of the present invention interfaced to a TAM controller of the present invention.
Figure 11:
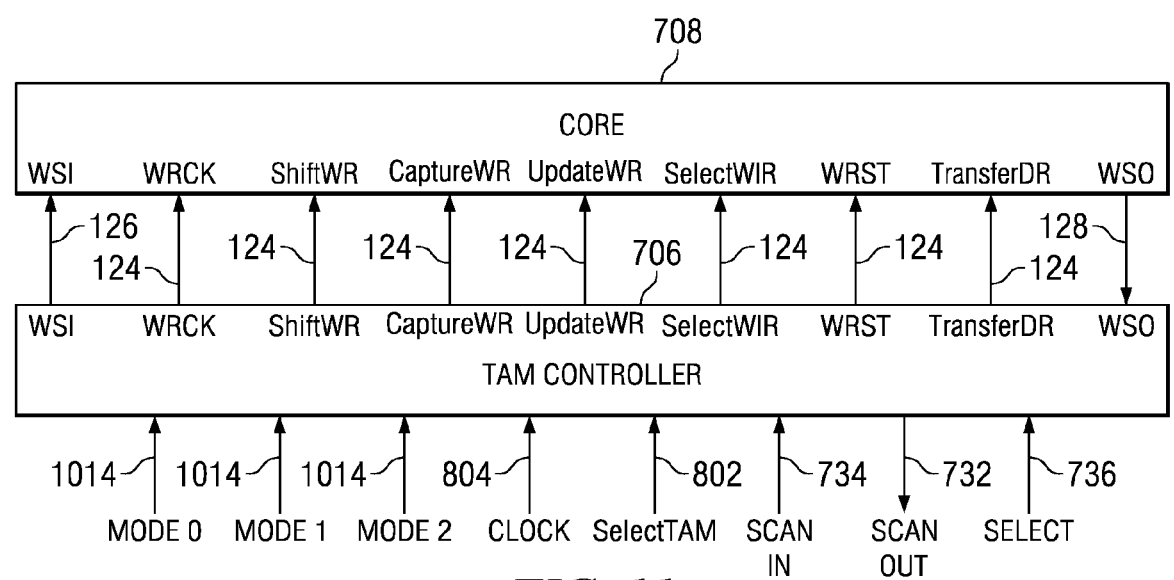
FIG. 11 illustrates the interface between a core wrapper and the TAM controller of the present invention.

FIG. 10 illustrates a more detailed view of the TAM 704 and the interconnects between the TAM 704 and the TAM controller 706 of FIG. 7. As mentioned in regard to FIG. 7, the TAM includes a stimulus data memory (SDM) 742, an expected data memory (EDM) 748, a mask data memory (MDM) 146, and a compare circuit 750, referred to in FIG. 10 as "Comparator & Fail Buffer", for comparing WPO response data against unmasked expected data from EDM 748. The SDM 742, EDM 748, and MDM 746 are each coupled to the input bus 720 from the tester for inputting data. The SDM receives a stimulus data clock (SDC) 1002 from the TAM controller, the EDM receives an expected data clock (EDC) 1004 from the TAM controller, and the MDM 746 receives a mask data clock (MDC) 1006 from the TAM controller. The SDM inputs stimulus data to the wrapper WPI inputs, the EDM inputs expected data to compare circuit 750, and the MDM inputs mask data to the compare circuit 750. The compare circuit 750 inputs response data from the wrapper WPO outputs. The core wrapper's WSI input 126 is driven by a WSI signal output from the TAM controller, the core wrapper's control bus 124 is driven by a control bus output from the TAM controller, and the core wrapper's WSO output 128 is driven into to a WSO signal input to the TAM controller. The core wrapper interface signals 126, 124, and 128 form bus 728 of FIG. 7. FIG. 11 shows the IEEE 1500 control signals of bus 124 between the core wrapper and TAM controller in more detail. The compare circuit 750 includes a fail buffer which stores failing comparison data. To allow the tester to read failing comparison data from the fail buffer, the compare circuit 750 includes a serial interface to the TAM controller including a serial input (SO) 1008, a control (CTL) bus 1010, and a serial output (SO) 1012. The SI 1008 is coupled to a comparator scan input (CSI) signal from the TAM controller, the SO 1012 is coupled to a comparator scan output (CSO) signal to the TAM controller, and the CTL bus 1010 is coupled to a control (CTL) bus output from the TAM controller. The TAM interface signals 1002, 1004, 1006, 1008, 1010, and 1012 form bus 730 of FIG. 7. The TAM controller 706 has Mode 0-2 inputs 1014, a clock input 804, and a SelectTAM input 802 input from the tester 712 via control bus 722. The TAM controller 706 has a scan input 734 and a scan out 732 coupled to scan router 744. The TAM controller 706 has a Select input 736 coupled to TAM selector 710.

Figure 12:
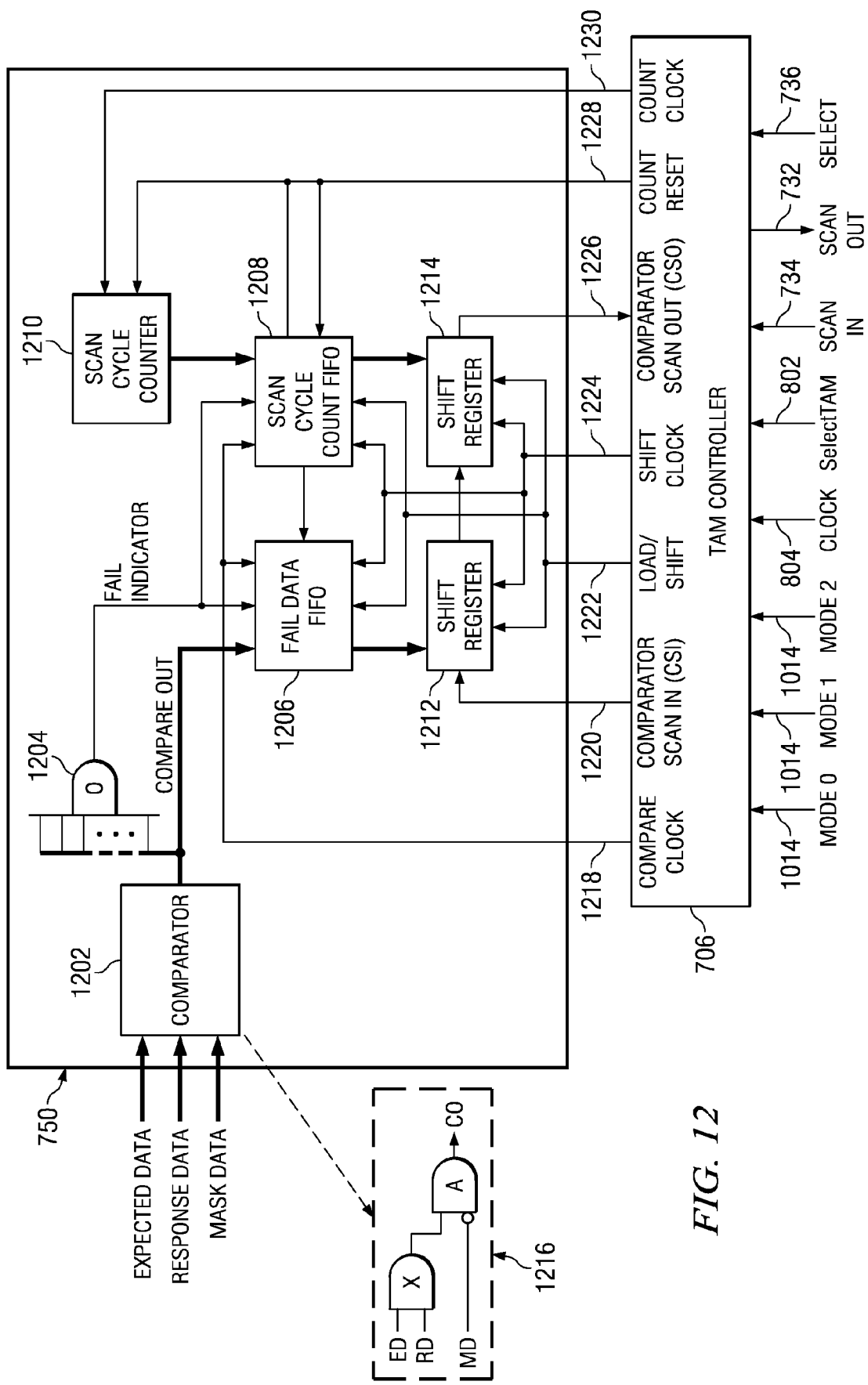
FIG. 12 illustrates a compare circuit of the present invention interfaced to a TAM controller of the present invention.

FIG. 12 illustrates a more detailed view of the compare circuit 750 and the interconnects between the compare circuit 750 and the TAM controller 706 of FIG. 10. The compare circuit 750 includes a comparator 1202, OR gate 1204, fail data FIFO 1206, scan cycle count FIFO 1208, scan cycle counter 1210, and shift registers 1212 and 1214.

The comparator 1202 inputs the expected data from EDM 748, mask data from the MDM 746, and response data from the wrapper WPO outputs. Each bit from the expected data (ED) bus, the mask data (MD) bus, and the response data (RD) bus is input to a maskable compare circuit 1216 inside comparator 1202. The maskable compare circuit 1216 has an exclusive OR gate that inputs the ED and RD bit inputs and an And gate that inputs the output of the exclusive OR gate and the MD bit input. If the MD bit is low (non-mask level), the maskable compare circuit 1216 will output a zero on the compare output (CO) if the ED and RD inputs are at the same logic level, and a one on the CO output if the ED and RD are at opposite logic levels. If the MD bit is high (mask level), the maskable compare circuit 1216 will output a low regardless of the logic levels on the ED and RD bit inputs. For an 8-bit wide ED, RD, and MD bus the comparator 1202 will output an 8-bit wide compare output bus, i.e. one CO bit output from each of 8 maskable compare circuits 1216. Each CO bit of the compare output bus is input to the fail data FIFO 1206 and to OR gate 1204. If any one or more of the CO bit outputs on the compare output bus go high (indicating one or more compare fails), the OR gate 1204 will output a high on its fail indicator output.

The scan cycle counter 1210 is a counter with a reset input connected to a Count Reset signal 1228 from the TAM controller 706 and clock input connected to a Count Clock 1230 signal from the TAM controller 706. The counter 1210 is designed to reset to a count of zero in response to a reset input and to count up in response to a clock input. The count output from the counter 1210 is input to the scan cycle count FIFO 1208.

The fail data FIFO 1206 has an input port and an output port. The input port has an input bus for receiving fail data from the compare out bus of comparator 1202, an input for receiving the fail indicator output from OR gate 1204, and an input for receiving a compare clock input 1218 from TAM controller 706. The output port has an output bus for outputting stored fail data, an input for receiving a load/shift input 1222 from TAM controller 706, and an input for receiving a shift clock input 1224 from TAM controller 706. FIFO 1206 has a reset input connected to the count reset output 1228 from TAM controller 706. In response to a reset input the FIFO data is cleared.

The scan cycle count FIFO 1208 has an input port and an output port. The input port has an input bus for receiving a scan cycle count from counter 1210, an input for receiving the fail indicator output from OR gate 1204, and an input for receiving the compare clock input 1218 from TAM controller 706. The output port has an output bus for outputting stored scan cycle count patterns, an input for receiving a load/shift input 1222 from TAM controller 706, and an input for receiving a shift clock input 1224 from TAM controller 706. FIFO 1208 has a reset input connected to the count reset output 1228 from TAM controller 706. In response to a reset input the FIFO data is cleared.

Shift register 1212 has an input bus for receiving the fail data bus output from FIFO 1206, an input for receiving a comparator scan in (CSI) output from TAM controller 706, inputs for receiving the load/shift 1222 and shift clock 1224 signals from TAM controller 706, and a serial output. Shift register 1214 has an input bus for receiving the scan cycle count data bus from FIFO 1208, an input for receiving the serial output from shift register 1212, inputs for receiving the load/shift 1222 and shift clock 1224 signals from TAM controller 706, and a serial output that is input to a comparator scan out (CSO) 1226 input to TAM controller 706.

Figure 3:
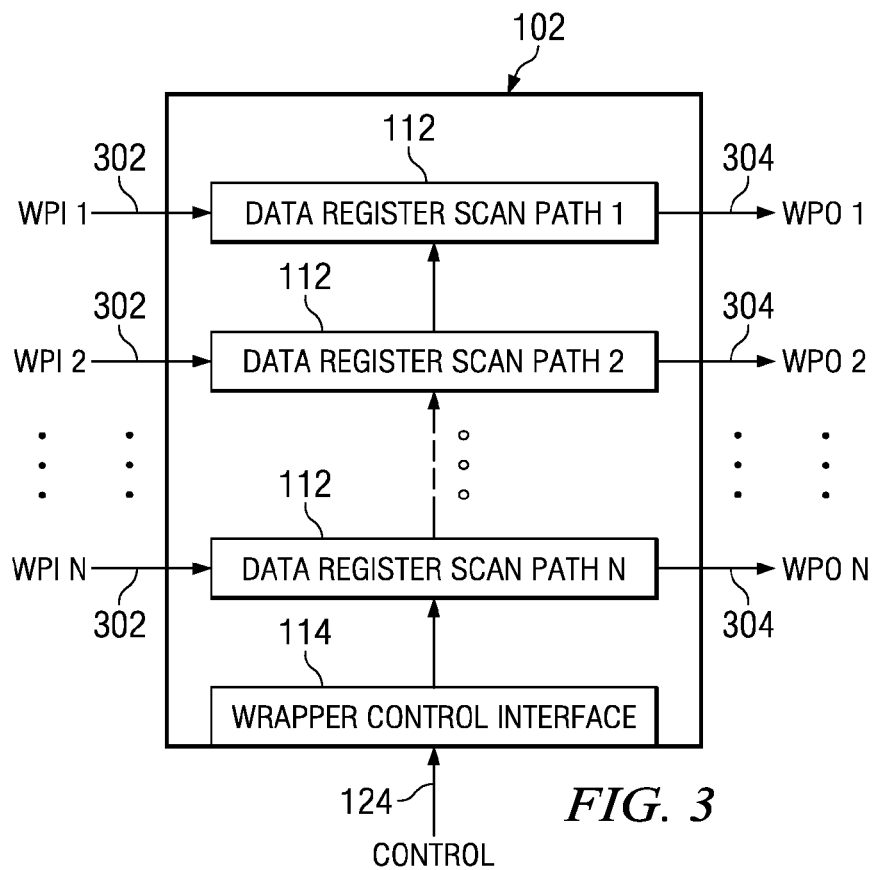
FIG. 3 illustrates a first parallel scan path arrangement using the IEEE 1500 standard.
Figure 4:
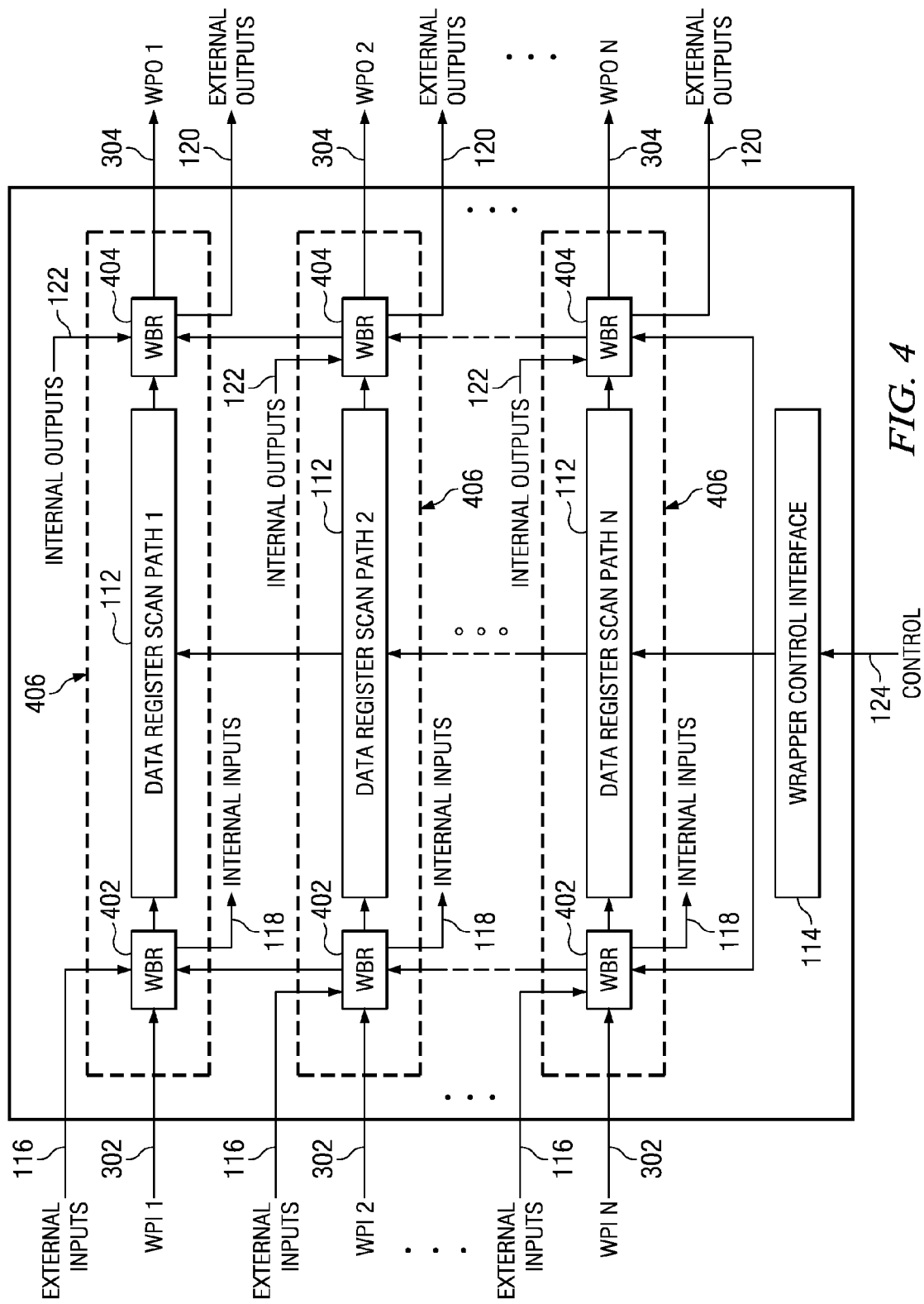
FIG. 4 illustrates second parallel scan path arrangement using the IEEE 1500 standard.

At the beginning of a test operation the scan cycle counter 1210 will be reset to a scan cycle count of zero. Each time scan cycle is completed the counter 1210 counts up. A scan cycle is defined as a capture operation that captures response data into parallel scan paths, such as the parallel scan paths 112 of FIG. 3 or 406 of FIG. 4, followed by a series of shift operations that input stimulus data into the parallel scan paths from WPI and output captured response data from the parallel scan paths to WPO. The comparator 1202 compares the output WPO response data against unmasked expected data and outputs the compare results on the compare out bus. During each compare operation, the TAM controller 706 outputs a compare clock 1218 to the FIFOs 1206 and 1208. If the fail indicator from OR gate 1204 is low (no compare failure) when the compare clock occurs, the FIFOs will not input data on their data bus inputs. If the fail indicator from OR gate 1204 is high (a compare failure) when the compare clock occurs, the fail data FIFO 1206 will input the failing data on the compare out bus and the scan cycle count FIFO will input the scan cycle count output from counter 1210. This test process of comparing response data from WPO to unmasked expected data during each shift of a scan cycle is repeated until the test is complete. At the end of test, the fail data FIFO 1206 will contain any failing compare data that occurred during the test and the scan cycle count FIFO will contain the scan cycle in which failing compare data occurred. For example, if three failing compares occurred during scan cycle 1, FIFO 1206 will contain the three failing compare data patterns in three sequential FIFO locations and FIFO 1208 will contain a scan cycle count of 1 in the same three sequential FIFO locations to indicate that the three failing compare data patterns occurred during scan cycle 1. When the tester scans out the contents of the FIFOs, it can be determined that the three failures occurred during scan cycle 1 by observing the contents of the same sequential locations in the FIFOs.

Following a test, the TAM controller operates its load/shift 1222 (high=load, low=shift) and shift clock 1224 outputs to cause the shift registers 1212 and 1214 to load a location of data from the FIFO 1206 and 1208 and shift loaded data out to the tester. This load and shift operation is repeated until the contents of the FIFOs have been output to the tester. During the load and shift operations the TAM controller 706 couples scan in 734 to CSI 1220 and scan in 732 to CSO 1226. The TAM controller's scan in 734 and scan out 732 are routed to the DUT's scan in 724 and scan out 726 via the scan router 744.

Figure 13:
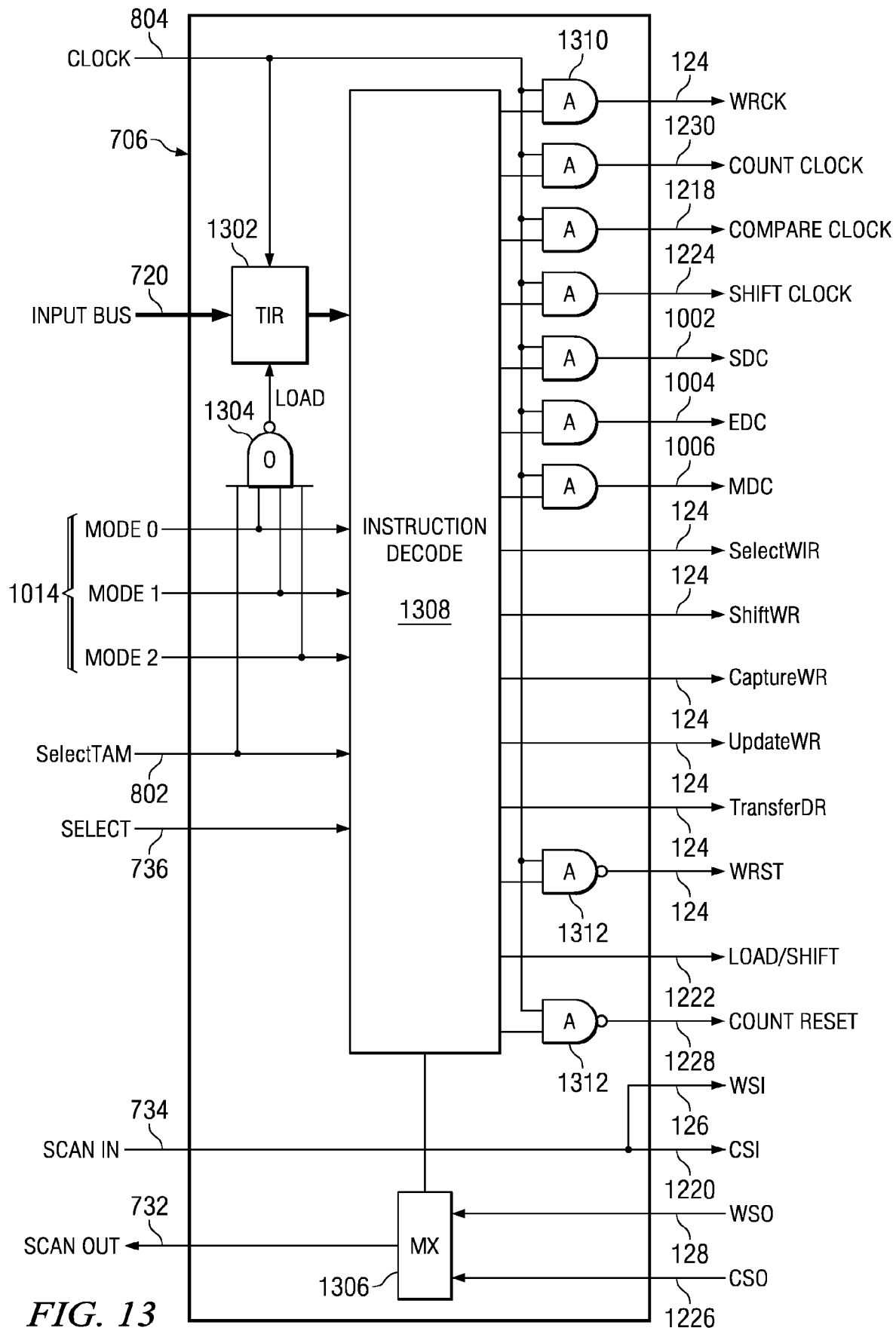
FIG. 13 illustrates a first example implementation of the TAM controller of the present invention.

FIG. 13 illustrates an example implementation of the TAM controller 706. The TAM controller consists of an TAM instruction register (TIR) 1302, an instruction load enable NOR gate 1304, a multiplexer 1306, an instruction decode circuit 1308, clock gating AND gates 1310, and reset gating NAND gates 1312. The TIR 1302 has an instruction input bus coupled to input bus 720, an instruction output bus coupled to an input bus of instruction decode circuit 1308, a clock input coupled to the clock signal 804 of control bus 722, and a load enable input coupled to the output of NOR gate 1304. NOR gate 1304 has inputs coupled to the Mode 0-2 signals 1014 of control bus 722 and to the SelectTAM signal 802. The output of the NOR gate is coupled to the load enable input of TIR 1302. If the Mode 0-2 and SelectTAM signals are low, the output of gate 1304 is high to allow an instruction to be clocked into the TIR 1302 from input bus 720. While the "all low" Mode 0-2 input pattern has been used in this example to enable the TIR for an instruction load operation, any one of Mode 0-2 input patterns could have been used as well. Multiplexer 1306 has a data input coupled to a WSO 128 of an associated core wrapper 102, a data input coupled to a CSO 1226 of an associated TAM 704, a multiplexer control input coupled to an output from instruction decode circuit 1308, and a data output coupled to scan out signal 732. As seen, the scan in 734 signal passes through the TAM controller to the WSI 126 and CSI 1220 signals.

The WRCK gate 1310 inputs the clock 804 and a WRCK enable from decode circuit 1308, and outputs a gated WRCK to an associated core wrapper 102. The count clock gate 1310 inputs the clock 804 and a count clock enable from decode circuit 1308, and outputs a gated count clock to an associated TAM 704. The compare clock gate 1310 inputs the clock 804 and a compare clock enable from decode circuit 1308, and outputs a gated compare clock to an associated TAM 704. The shift clock gate 1310 inputs the clock 804 and a shift clock enable from decode circuit 1308, and outputs a gated shift clock to an associated TAM 704. The SDC gate 1310 inputs the clock 804 and a SDC enable from decode circuit 1308, and outputs a gated SDC to an associated TAM 704. The EDC gate 1310 inputs the clock 804 and a EDC enable from decode circuit 1308, and outputs a gated EDC to an associated TAM 704. The MDC gate 1310 inputs the clock 804 and a MDC enable from decode circuit 1308, and outputs a gated MDC to an associated TAM 704. The WRST gate 1312 inputs the clock 804 and a WRST enable from decode circuit 1308, and outputs a gated WRST to an associated core wrapper 102. The Count Reset gate 1312 inputs the clock 804 and a Count Reset enable from decode circuit 1308, and outputs a gated Count Reset to an associated TAM 704.

Instruction decode circuit 1308 has an input bus for inputting the instruction from TIR 1302, inputs for inputting Mode 0-2 signals 1014 from control bus 722, an input for inputting the SelectTAM signal 802 from control bus 722, and an input for inputting the Select signal 736 from TAM selector 710. Instruction decode circuit 1308 has outputs for controlling the SelectWIR, ShiftWR, CaptureWR, UpdateWR, TransferDR, and WRST signals 124 to an associated core wrapper 102, outputs for controlling the load/shift 1222 and count reset 1228 signals to an associated TAM 704, an output for controlling scan out multiplexer 1306, and the above mentioned outputs for enabling the clock 804 to be gated through one of more selected AND gates 1310 and NAND gates 1312.

The instruction input from TIR 1302 programs how the instruction decode circuit 1308 controls its outputs in response to the Mode 0-2 inputs 1014. The Select input 736 from TAM selector 710 is used to enable or disable the instruction decode circuit 1308. If the Select input is low, the instruction decode circuit is disabled from responding to the Mode 0-2 inputs and all its outputs are set to an inactive state, especially outputs that control clock gates 1310 and reset gates 1312. If the Select input is high, the instruction decode circuit 1308 is enabled to respond to the Mode 0-2 inputs to control its outputs according to how it is programmed by the current instruction loaded into TIR 1302. The SelectTAM input 802 from control bus 722 is also used to enable or disable the instruction decode circuit 1308. If the SelectTAM input is low, the instruction decode circuit is enabled to respond to the Mode 0-2 inputs to control its outputs according to the how it is programmed by the current instruction loaded into TIR 1302. If the SelectTAM input is high, the instruction decode circuit is disabled from responding to the Mode 0-2 inputs and all its outputs are set to an inactive state, especially the outputs that control clock gates 1310 and reset gates 1312. As mentioned in regard to FIGS. 8A and 8B, when SelectTAM is high the data register of TAM selector 710 loads data from the input bus 720 during a clock input on clock signal 804. So the reason to disable the instruction decode circuit 1308 while SelectTAM is high is to prevent the clock 804 that loads the TAM selector data register from producing an undesired output from any of the outputs of TAM controller 706. Further, while SelectTAM is high, the TIR is disabled, by the output from gate 1304, from inputting data from the input bus 720, since the data is for the TAM selector 710 and not for the TAM controller 706.

FIG. 14A illustrates in general the operation of the TAM controller 706 of FIG. 13 in response to the Mode 0-2 inputs 1014. As seen, when the Mode 0-2 signals are low (and SelectTAM is low) the TIR 1302 is loaded with a TAM instruction. The loaded instruction is decoded by the instruction decode circuit 1308 to produce instruction defined operations on the TAM controller outputs in response to the other binary input patterns on the Mode 0-2 signals. As seen, the all zero Mode 0-2 pattern is reserved for loading an instruction into the TIR 1308 and the other Mode 0-2 patterns are defined by the instruction to control the TAM controller outputs.

Mode 2:1:0=0:0:0—Load TAM Instruction
Mode 2:1:0=0:0:1—Instruction Defined Operation
Mode 2:1:0=0:1:0—Instruction Defined Operation
Mode 2:1:0=0:1:1—Instruction Defined Operation
Mode 2:1:0=1:0:0—Instruction Defined Operation
Mode 2:1:0=1:0:1—Instruction Defined Operation
Mode 2:1:0=1:1:0—Instruction Defined Operation
Mode 2:1:0=1:1:1—Instruction Defined Operation FIG. 14B illustrates the loading of a WIR Scan instruction into the TIR to enable the WIR 106 of a wrapper 102 connected to the TAM controller 706 to be scanned. Scanning the WIR allows loading test instructions to configure the wrapper into test modes as described in IEEE standard 1500, especially the parallel scan test modes described in regard to FIGS. 3 and 4. During this instruction, the SelectWIR output 124 from the instruction decode circuit 1308 is set high to select the WIR for scanning. In response to this instruction, the Mode 0-2 input patterns are programmed to produce the following output operations from the TAM controller 706. Mode 0-2 input patterns that are not programmed by this instruction are defined as no-operation (No-Op) patterns. No-Op patterns do not produce outputs from the TAM controller.

Mode 2:1:0=0:0:0—Load WIR Scan Instruction
Mode 2:1:0=0:0:1—Capture WIR
Mode 2:1:0=0:1:0—Shift WIR
Mode 2:1:0=0:1:1—Update WIR Mode 2:1:0=1:0:0—Reset Wrapper
Mode 2:1:0=1:0:1—No-Op
Mode 2:1:0=1:1:0—No-Op
Mode 2:1:0=1:1:1—No-Op When Mode 2:1:0=0:0:1, a Capture WIR operation occurs which sets the CaptureWR output 124 high and produces a gated clock output on WRCK 124. This operation is used to capture data into the WIR prior shifting the WIR.

When Mode 2:1:0=0:1:0, a Shift WIR operation occurs which sets the ShiftWR output 124 high and produces gated clock outputs on WRCK 124. This operation is used to shift an instruction into the WIR via the wrappers WSI and WSO. During this operation, the TAM controller's multiplexer 1306 is controlled to couple the WSO 128 wrapper output to the TAM controller's Scan Out 732 output.

When Mode 2:1:0=0:1:1, an Update WIR operation occurs which sets the UpdateWR output 124 high and produces a gated clock output on WRCK 124. This operation is used to update the instruction to the WIR's parallel outputs.

When Mode 2:1:0=1:0:0, a Reset Wrapper operation occurs which produces a gated reset output on WRST 124. This operation is used to reset the wrapper's WIR and other wrapper circuits that need to be reset before and/or after a test.

FIG. 14C illustrates the loading of a WBR Scan instruction into the TIR to enable the WBR 110 of a wrapper 102 connected to the TAM controller 706 to be scanned. Scanning the WBR enables testing a wrapped core or testing the interconnects between wrapped cores. During this instruction, the SelectWIR output 124 from the instruction decode circuit 1308 is set low to select the WBR for scanning. In response to this instruction, the Mode 0-2 input patterns are programmed to produce the following output operations from the TAM controller 706. Mode 0-2 input patterns that are not programmed by this instruction are defined as no-operation (No-Op) patterns. No-Op patterns do not produce outputs from the TAM controller.

Mode 2:1:0=0:0:0—Load WBR Scan Instruction
Mode 2:1:0=0:0:1—Capture WBR
Mode 2:1:0=0:1:0—Shift WBR
Mode 2:1:0=0:1:1—Update WBR
Mode 2:1:0=1:0:0—Reset Wrapper
Mode 2:1:0=1:0:1—No-Op
Mode 2:1:0=1:1:0—No-Op
Mode 2:1:0=1:1:1—No-Op When Mode 2:1:0=0:0:1, a Capture WBR operation occurs which sets the CaptureWR output 124 high and produces a gated clock output on WRCK 124. This operation is used to capture data into the WBR prior shifting the WBR.

When Mode 2:1:0=0:1:0, a Shift WBR operation occurs which sets the ShiftWR output 124 high and produces gated clock outputs on WRCK 124. This operation is used to shift data into and out of the WBR via the wrappers WSI and WSO. During this operation, the TAM controller's multiplexer 1306 is controlled to couple the WSO 128 wrapper output to the TAM controller's Scan Out 732 output.

When Mode 2:1:0=0:1:1, an Update WBR operation occurs which sets the UpdateWR output 124 high and produces a gated clock output on WRCK 124. This operation is used to update scanned in data to the WBR's parallel outputs.

When Mode 2:1:0=1:0:0, a Reset Wrapper operation occurs which produces a gated reset output on WRST 124. This operation is used to reset the wrapper's WIR and other wrapper circuits that need to be reset before and/or after a test.

FIG. 14D illustrates the loading of a Parallel Scan Test instruction into the TIR to enable parallel scan paths (112 of FIG. 3 or 406 of FIG. 4) of a wrapper 102 connected to the TAM controller 706 and TAM 704 to be accessed for scan testing. During this instruction, the SelectWIR output 124 from the instruction decode circuit 1308 is set low to select the wrappers parallel scan paths for scanning. In response to this instruction the Mode 0-2 input patterns are programmed to produce the following outputs from the TAM controller 706. Mode 0-2 input patterns that are not programmed by this instruction are defined as no-operation (No-Op) patterns. No-Op patterns do not produce outputs from the TAM controller.

Mode 2:1:0=0:0:0—Load Parallel Scan Test Instruction
Mode 2:1:0=0:0:1—Load Stimulus Data
Mode 2:1:0=0:1:0—Load Expected Data
Mode 2:1:0=0:1:1—Load Mask Data
Mode 2:1:0=1:0:0—Shift Scan Paths & Compare Response
Mode 2:1:0=1:0:1—Capture Response into Scan Paths
Mode 2:1:0=1:1:0—Reset Scan Cycle Counter & FIFOs
Mode 2:1:0=1:1:1—No-Op When Mode 2:1:0=0:0:1, a Load Stimulus Data operation occurs which produces a gated clock output on SDC 1002 to load stimulus data into SDM 742 from input bus 720. This operation is used to load stimulus data that will be shifted into the scan paths on the WPI inputs.

When Mode 2:1:0=0:1:0, a Load Expected Data operation occurs which produces a gated clock output on EDC 1004 to load expected data into EDM 748 from input bus 720. This operation is used to load expected data that will be compared against the scan path response data output on the WPO outputs.

When Mode 2:1:0=0:1:1, a Load Mask Data operation occurs which produces a gated clock output on MDC 1006 to load mask data into MDM 746 from input bus 720. This operation is used to load mask data that can be used to mask off certain ones of the response and expected data compare operations.

When Mode 2:1:0=1:0:0, a Shift Scan Paths & Compare Response operation occurs which sets the ShiftWR output 124 high, produces a gated clock on WRCK 124 to shift the scan paths, and a gated clock on Compare Clock 124 to compare the scan path response outputs against unmasked expected data. This operation is used to shift stimulus data into the scan paths from SDM 742 and compare the scan path response data using the comparator circuit 750.

When Mode 2:1:0=1:0:1, a Capture Response into Scan Paths operation occurs which sets the CaptureWR output 124 high, produces a gated WRCK 124 to capture data from combinational logic into the scan paths, and produces a gated Count Clock 1230 to increment the scan cycle counter 1210 of compare circuit 750. This operation is used to load the parallel scan paths with response data at the beginning of a new scan cycle shift operation and to count each new scan cycle.

When Mode 2:1:0=1:1:0, a Reset Scan Cycle & FIFOs operation occurs which produces a gated reset output on Count Reset 1228. This operation is used to reset the TAM's scan cycle counter 1210 and FIFOs 1206-1208 before and/or after a test.

FIG. 14E illustrates the loading of a Fail Data Scan instruction into the TIR to enable fail data in the FIFOs 1206-1208 of the compare circuit 750 to be scanned out to a tester. In response to this instruction, the Mode 0-2 input patterns are programmed to produce the following output operations from the TAM controller 706. Mode 0-2 input patterns that are not programmed by this instruction are defined as no-operation (No-Op) patterns. No-Op patterns do not produce outputs from the TAM controller.

Mode 2:1:0=0:0:0—Load Fail Data Scan Instruction
Mode 2:1:0=0:0:1—Capture Fail Data
Mode 2:1:0=0:1:0—Shift Fail Data Mode 2:1:0=0:1:1—No-Op
Mode 2:1:0=1:0:0—No-Op
Mode 2:1:0=1:0:1—No-Op
Mode 2:1:0=1:1:0—No-Op
Mode 2:1:0=1:1:1—No-Op When Mode 2:1:0=0:0:1, a Capture Fail Data operation occurs which sets the Load/Shift output 1222 high and produces a gated clock output on Shift Clock 1224. This operation is used to capture fail data from the FIFOs 1206-1208 into the shift registers 1212-1214 prior shifting the shift register.

When Mode 2:1:0=0:1:0, a Shift Fail Data operation occurs which sets the Load/Shift output 1222 low and produces gated clock outputs on Shift Clock 1224. This operation is used to shift the captured fail data from the shift register 1212-1214 to a tester via the compare circuit's CSI and CSO. During this operation, the TAM controller's multiplexer 1306 is controlled to couple the CSO 1226 compare circuit 750 output to the TAM controller's Scan Out 732 output.

FIG. 14F is provided to illustrate that a single instruction can be defined that performs both the WIR scan operations of FIG. 14B and the WBR scan operations of FIG. 14C. During this instruction, the ShiftWIR 124 output would be high during Capture WIR, Shift WIR, and Update WIR Mode input patterns to enable scanning the WIR, and low during Capture WBR, Shift WBR, and Update WBR Mode input patterns to enable scanning the WBR.

Mode 2:1:0=0:0:0—Load WIR & WBR Scan Instruction
Mode 2:1:0=0:0:1—Capture WIR
Mode 2:1:0=0:1:0—Shift WIR
Mode 2:1:0=0:1:1—Update WIR
Mode 2:1:0=1:0:0—Capture WBR
Mode 2:1:0=1:0:1—Shift WBR
Mode 2:1:0=1:1:0—Update WBR
Mode 2:1:0=1:1:1—Reset Wrapper As seen from the above descriptions of FIGS. 14A-14F, the TAM controller 706 may be programmed to perform any desired output operation in response to the Mode 0-2 inputs, by loading an instruction into the TIR 1302. While the TAM controller is shown having a particular group of outputs and a particular number of Mode 0-2 inputs, it is not limited to only these outputs and inputs. Indeed, as the need may arise, the number of TAM controller outputs and/or Mode inputs may increase to allow the TAM controller to control additional circuits within a TAM or other circuits within the DUT. These additional circuits may be test circuits, debug circuits, trace circuits, and/or emulation circuits.

Figure 15:
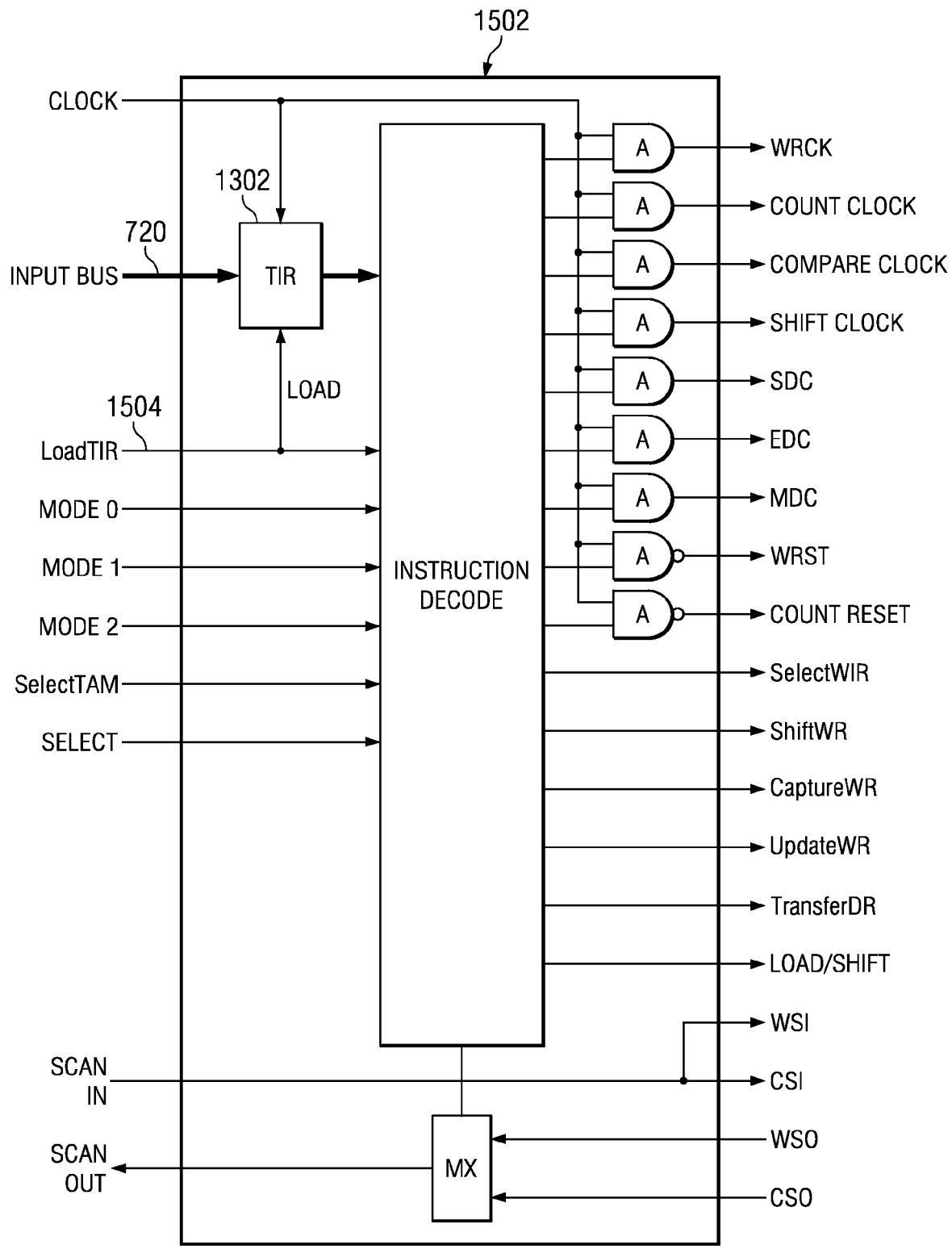
FIG. 15 illustrates a second example implementation of the TAM controller of the present invention.

FIG. 15 illustrates an alternative TAM controller 1502. TAM controller 1502 is identical to TAM controller 706 of FIG. 13 with the following exceptions. The NOR gate 1304 of FIG. 13 has been removed and the load enable input to TIR 1302 is connected to a LoadTIR signal 1504, which is a signal added to control bus 722. Like the SelectTAM signal, the LoadTIR signal is input to the instruction decode to disable the instruction decode circuit from responding to Mode 0-2 inputs during an instruction load. A tester sets the LoadTIR signal high when an instruction is to be written to TIR 1302 from input bus 720. Using the LoadTIR signal to enable the loading of an instruction into the TIR eliminates having to use the all zero Mode 0-2 input pattern as a load enable for the TIR, as was described in FIG. 13.

FIGS. 16A-16F illustrate the Mode 0-2 signals being programmed to control the TAM controller 1502 output when the LoadTIR signal 1504 is used to load the TIR 1302. FIG. 16A relates to FIG. 14A, FIG. 16B relates to FIG. 14B, FIG. 16C relates to FIG. 14C, FIG. 16D relates to FIG. 14D, FIG. 16E relates to FIG. 14E, and FIG. 16F relates to FIG. 14F. As seen in the FIGS. 16A-16F, the all zero Mode input pattern is not required to be dedicated for loading the TIR as it was in FIGS. 14A-14F. Thus the instruction loaded into the TIR can use all the Mode 0-2 input patterns to control the TAM controller 1502 outputs to perform test or other operations.

16A
Mode 2:1:0=0:0:0—Instruction Defined Operation
Mode 2:1:0=0:0:1—Instruction Defined Operation
Mode 2:1:0=0:1:0—Instruction Defined Operation
Mode 2:1:0=0:1:1—Instruction Defined Operation
Mode 2:1:0=1:0:0—Instruction Defined Operation
Mode 2:1:0=1:0:1—Instruction Defined Operation
Mode 2:1:0=1:1:0—Instruction Defined Operation
Mode 2:1:0=1:1:1—Instruction Defined Operation

16B
Mode 2:1:0=0:0:0—Capture WIR
Mode 2:1:0=0:0:1—Shift WIR
Mode 2:1:0=0:1:0—Update WIR
Mode 2:1:0=0:1:1—Reset Wrapper
Mode 2:1:0=1:0:0—No-Op
Mode 2:1:0=1:0:1—No-Op
Mode 2:1:0=1:1:0—No-Op
Mode 2:1:0=1:1:1—No-Op

16C
Mode 2:1:0=0:0:0—Capture WBR
Mode 2:1:0=0:0:1—Shift WBR
Mode 2:1:0=0:1:0—Update WBR
Mode 2:1:0=0:1:1—Reset Wrapper
Mode 2:1:0=1:0:0—No-Op
Mode 2:1:0=1:0:1—No-Op
Mode 2:1:0=1:1:0—No-Op
Mode 2:1:0=1:1:1—No-Op

16D
Mode 2:1:0=0:0:0—Load Stimulus Data
Mode 2:1:0=0:0:1—Load Expected Data
Mode 2:1:0=0:1:0—Load Mask Data
Mode 2:1:0=0:1:1—Shift Scan Paths & Compare Response
Mode 2:1:0=1:0:0—Capture Response into Scan Paths
Mode 2:1:0=1:0:1—Reset Scan Cycle Counter & FIFOs
Mode 2:1:0=1:1:0—No-Op
Mode 2:1:0=1:1:1—No-Op

16E
Mode 2:1:0=0:0:0—Capture Fail Data
Mode 2:1:0=0:0:1—Shift Fail Data
Mode 2:1:0=0:1:0—No-Op
Mode 2:1:0=0:1:1—No-Op
Mode 2:1:0=1:0:0—No-Op
Mode 2:1:0=1:0:1—No-Op
Mode 2:1:0=1:1:0—No-Op
Mode 2:1:0=1:1:1—No-Op

16F
Mode 2:1:0=0:0:0—Capture WIR
Mode 2:1:0=0:0:1—Shift WIR
Mode 2:1:0=0:1:0—Update WIR
Mode 2:1:0=0:1:1—Capture WBR
Mode 2:1:0=1:0:0—Shift WBR
Mode 2:1:0=1:0:1—Update WBR
Mode 2:1:0=1:1:0—Reset Wrapper
Mode 2:1:0=1:1:1—No-Op FIG. 17 illustrates a timing diagram of the process of selecting a TAM controller 706 of FIG. 13, loading an instruction into the selected TAM controller 706 using the all zero Mode input pattern, then operating the TAM controller 706 to perform a WIR scan operation to load a test instruction into the WIR of an associated core wrapper 102. As seen, the TAM controller 706 is selected by setting the SelectTAM input 802 high to load a select TAM instruction 1720 from input bus 720 into the TAM selector 1710 during clock 1702. Once the TAM controller 706 is selected, a TAM instruction 1722 is loaded into the TIR 1302 of the selected TAM controller by inputting an all zero Mode input pattern 1712 from Mode 0-2 1014 and applying a clock 1704. As mentioned, in this example the TAM instruction loaded into the TIR 1302 programs the TAM controller 706 to perform a WIR scan instruction as described above in regard to FIG. 14B. The WIR scan operation consists of: (1) inputting a Capture WIR 1714 Mode input pattern along with a clock 1706 to cause the wrapper's WIR to capture data, (2) inputting a series of Shift WIR 1716 Mode input patterns along with clocks 1708 to cause the wrapper's WIR to scan data in 1724 from Scan In 734 and scan data out 1726 on Scan Out 732, then (3) inputting an Update WIR 1718 Mode input pattern along with a clock 1710 to update data to the parallel outputs of the WIR. The steps in the above described process will typically be performed each time a TAM controller is selected, since a TAM instruction will typically be required to program the TAM controller and a WIR instruction will be typically required to configure the associated wrapper for testing.

Figure 18:
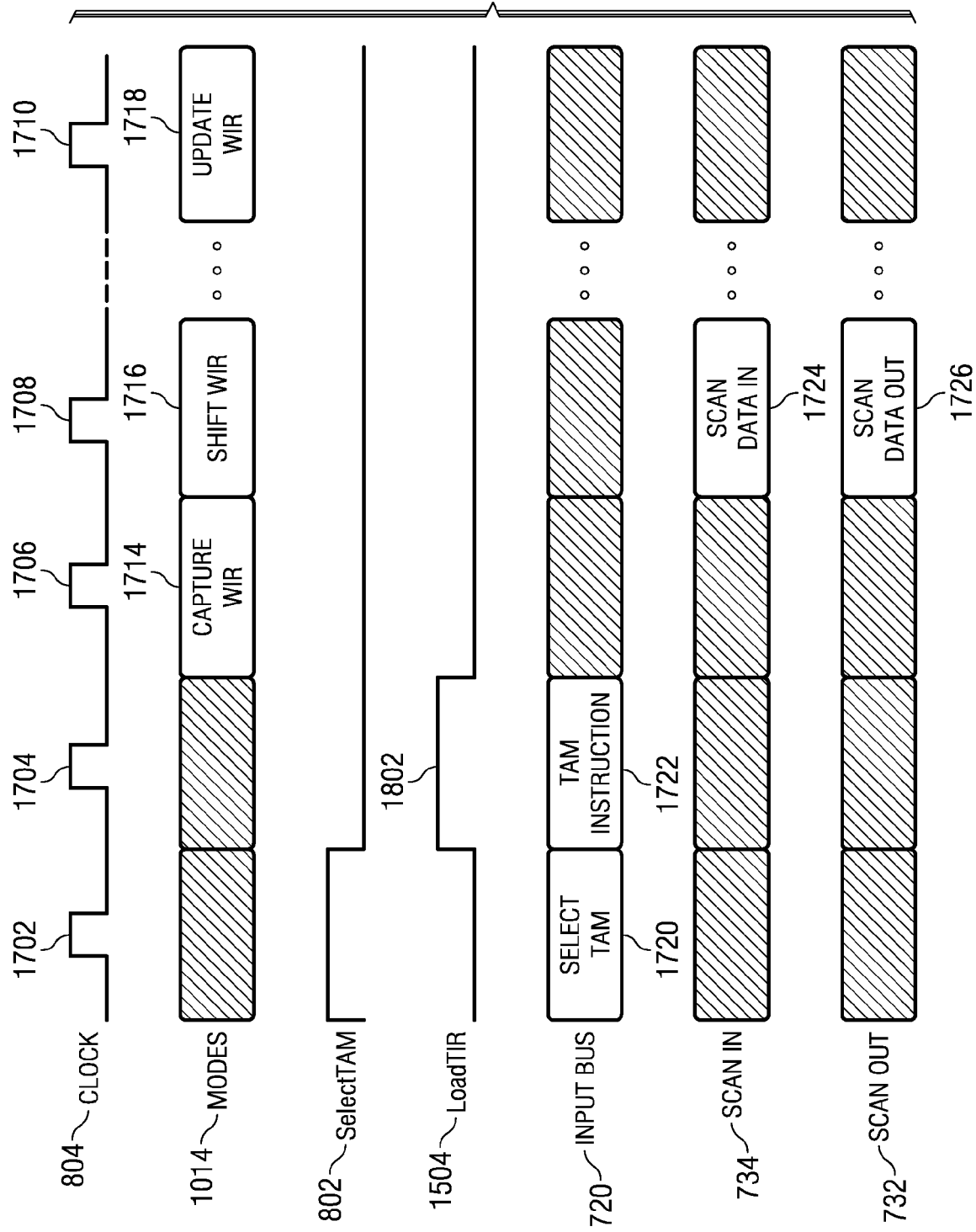
FIG. 18 illustrates an alternate timing of selecting a TAM controller, instructing a TAM controller, and executing a wrapper instruction scan operation using the TAM controller according to the present invention.

FIG. 18 illustrates a timing diagram of the process of selecting a TAM controller 1502 of FIG. 15, loading an instruction into the selected TAM controller 1502 using the LoadTIR signal 1504, then operating the TAM controller 1502 perform a WIR scan operation to load a test instruction into the WIR of an associated core wrapper 102. This process is the same as described in FIG. 17 with the exception that the LoadTIR signal 1504 is used, at 1802, instead of the all zero Mode input pattern at 1712, to load the TAM instruction during clock 1704.

Figure 19:
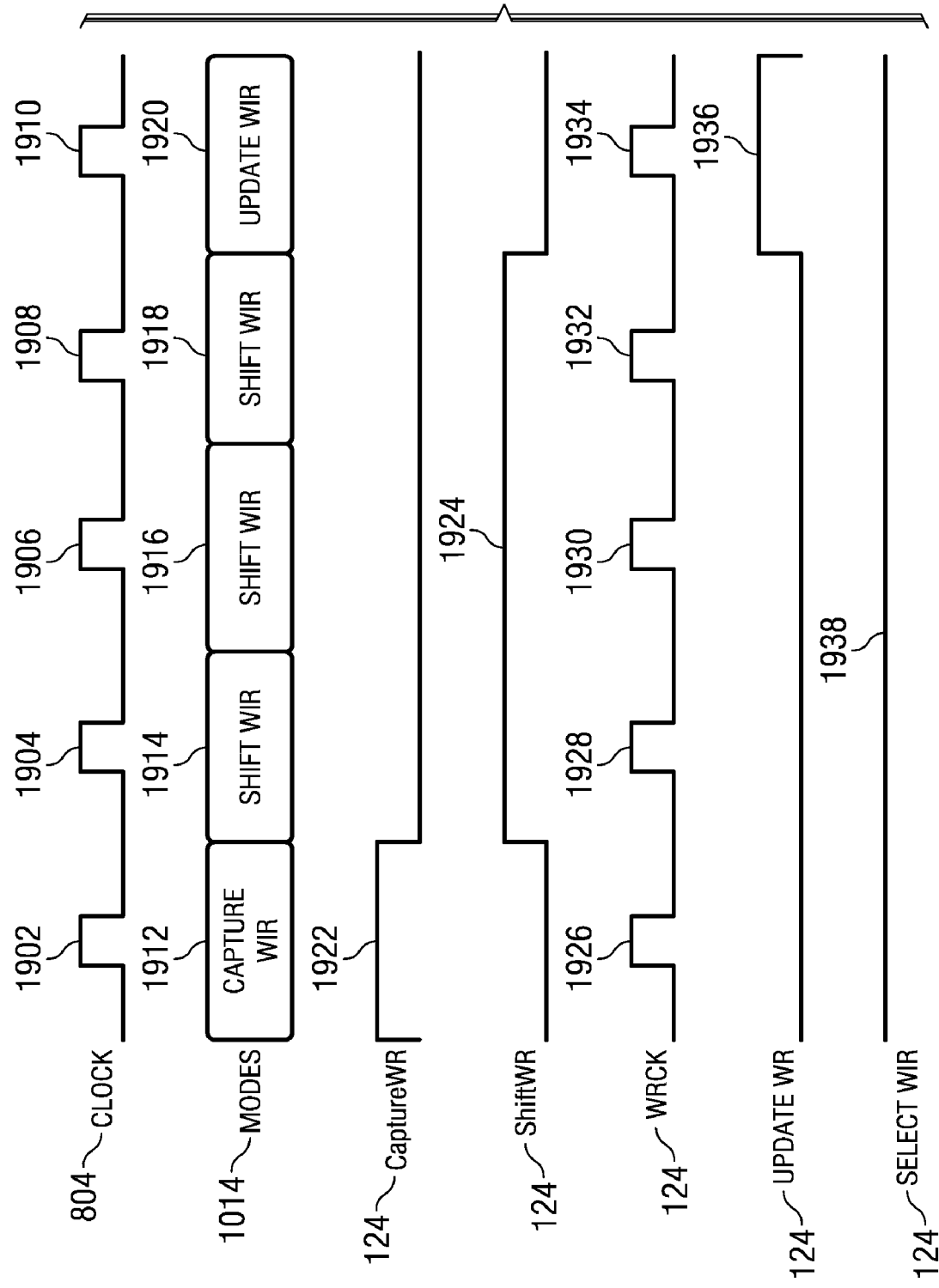
FIG. 19 illustrates detail timing of performing a wrapper instruction scan operation using the TAM controller of the present invention.

FIG. 19 illustrates a detail timing diagram of the TAM controller 706 or 1502 programmed to perform the WIR 106 scan instruction operation of FIGS. 14B and 16B consisting of capture, shift, and update steps. When programmed for a WIR scan operation, the TAM controller will set the SelectWIR output high 1938 to enable the wrapper's WIR for scanning. The capture step is achieved by inputting a Capture WIR Mode input pattern 1912 which sets the CaptureWR output 1922 high, followed by inputting a clock 1902 which produces a WRCK output 1926. The shift steps are achieved by inputting Shift WIR Mode input patterns 1914-1918 which set the ShiftWR output 1924 high, and inputting clocks 1904-1908 which produce WRCKs 1928-1932 The update step is achieved by inputting an Update WIR Mode input pattern 1920 followed by inputting a clock 1910 which produces a WRCK output 1934. The timing produced by the TAM controller on the SelectWIR, CaptureWR, ShiftWR, WRCK, and UpdateWR signals 124 performs a WIR scan operation as defined in IEEE 1500. However, unlike the IEEE 1500 standard the timing on the ShiftWIR, CaptureWR, ShiftWR, WRCK, and UpdateWR signals 124 are not provided externally by a tester, but rather are provided internally by the TAM controller in response to the external clock 804 and Mode inputs 1014 from a tester. Thus the present invention provides a way to produce standard IEEE 1500 wrapper WIR scan control signals from an internal circuit (i.e. the TAM controller) rather than having to input the wrapper WIR scan control signals from an external tester.

Figure 20:
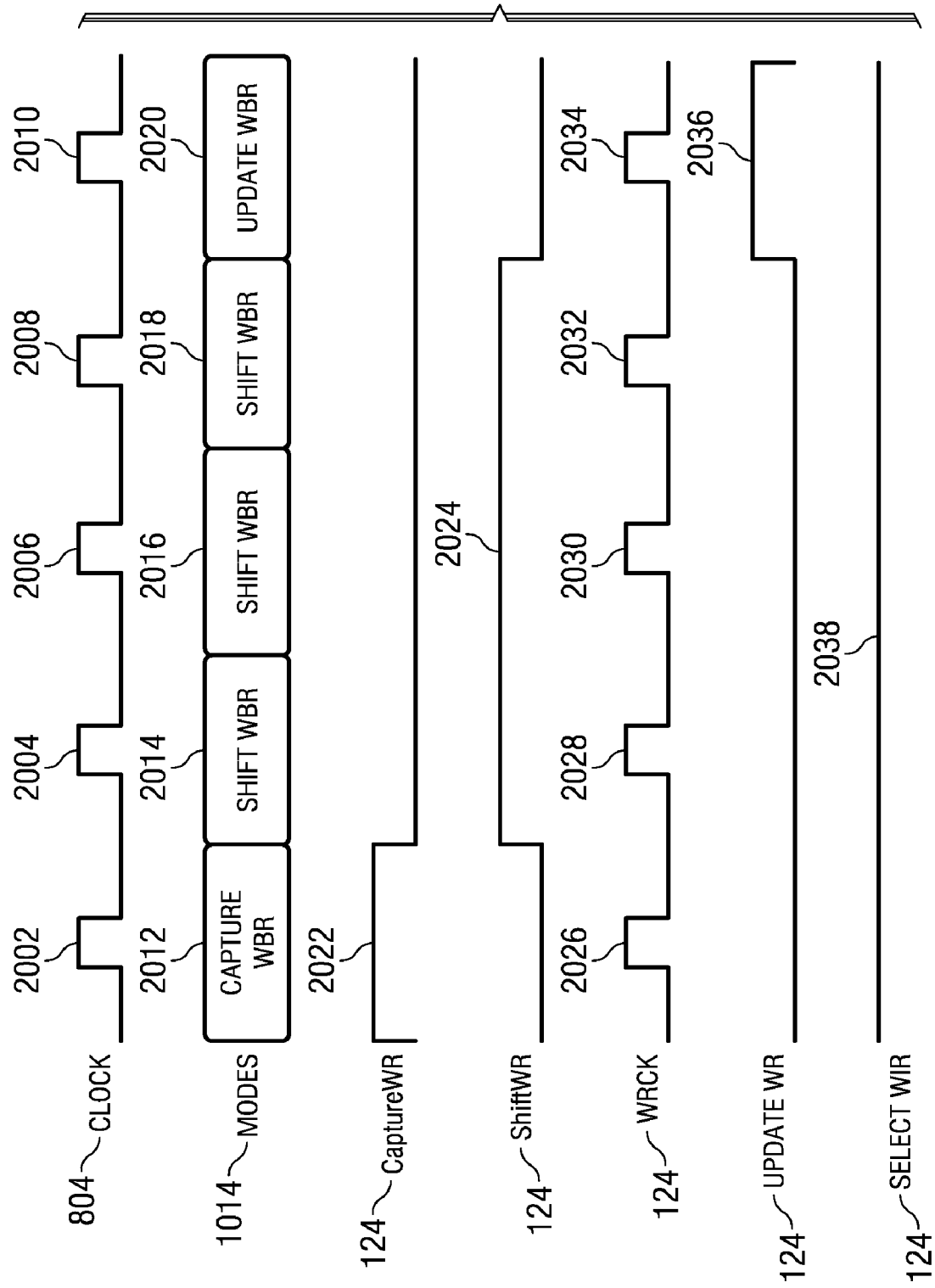
FIG. 20 illustrates detail timing of performing a wrapper boundary register scan operation using the TAM controller of the present invention.

FIG. 20 illustrates a detail timing diagram of the TAM controller 706 or 1502 programmed to perform the WBR 110 scan instruction operation of FIGS. 14C and 16C consisting of capture, shift, and update steps. When programmed for a WBR scan operation, the TAM controller will set the SelectWIR output low 2038 to enable the wrapper's WBR for scanning. The capture step is achieved by inputting a Capture WBR Mode input pattern 2012 which sets the CaptureWR output 2022 high, followed by inputting a clock 2002 which produces a WRCK output 2026. The shift steps are achieved by inputting Shift WBR Mode input patterns 2014-2018 which set the ShiftWR output 2024 high, and inputting clocks 2004-2008 which produce WRCKs 2028-2032 The update step is achieved by inputting an Update WBR Mode input pattern 2020 followed by inputting a clock 2010 which produces a WRCK output 2034. The timing produced by the TAM controller on the SelectWIR, CaptureWR, ShiftWR, WRCK, and UpdateWR signals 124 performs a WBR scan operation as defined in IEEE 1500. However, unlike the IEEE 1500 standard the timing on the ShiftWIR, CaptureWR, ShiftWR, WRCK, and UpdateWR signals 124 are not provided externally by a tester, but rather are provided internally by the TAM controller in response to the external clock 804 and Mode inputs 1014 from a tester. Thus the present invention provides a way to produce standard IEEE 1500 wrapper WBR scan control signals from an internal circuit (i.e. the TAM controller) rather than having to input the wrapper WBR scan control signals from an external tester.

FIG. 21 illustrates a detail timing diagram of the TAM controller 706 or 1502 programmed to perform the Fail Data Scan instruction operation of FIGS. 14E and 16E consisting of capture and shift steps. The capture step is achieved by inputting a Capture Fail Data Mode input pattern 2112 which sets the Load/Shift output 1222 high, followed by inputting a clock 2102 which produces a Shift Clock output 2124. The shift steps are achieved by inputting Shift Fail Data Mode input patterns 2114-2120 which set the Load/Shift output 1222 low, and inputting clocks 2104-2110 which produce Shift Clocks 2126-2132. As seen, the Fail Data Scan timing on the Load/Shift 1222 and Shift Clock 1224 outputs are not provided externally by a tester, but rather are provided internally by the TAM controller in response to the external clock 804 and Mode inputs 1014 from a tester. Thus the present invention provides a way to produce Fail Data Scan control signals from an internal circuit (i.e. the TAM controller) rather than having to input the Fail Data Scan signals from an external tester.

FIG. 21A is provided to illustrate that any of the scan operations, WIR scan of FIG. 19, WBR scan of FIG. 20, and Fail Buffer scan of FIG. 21, can use the previously mentioned No-Op Mode patterns to reduce the shift rate of the WIR, WBR, or Fail Buffer scan paths. As seen in FIG. 21A, one or more No-Op Mode patterns 2040 may be inserted between Shift Mode patterns 2042 to reduce the shift rate of WIR, WBR, or Fail Buffer scan paths. Reducing the shift rate using No-Op Mode patterns may be required if the Clock 804 input frequency from the tester is high to guarantee that shift operations between daisychained TAMs, cores, or Fail Buffers operate properly. Also if the Scan Out 732 signal from a device has a long return path to the tester and the Clock 804 frequency is high, No-Op Mode patterns can be used to reduce the shift rate to guarantee that shift operations between the device and tester operates properly. No-Op Mode patterns may be similarly used in any other test or scan operation shown or implied in this disclosure to reduce testing or shifting rates as required.

Figure 22:
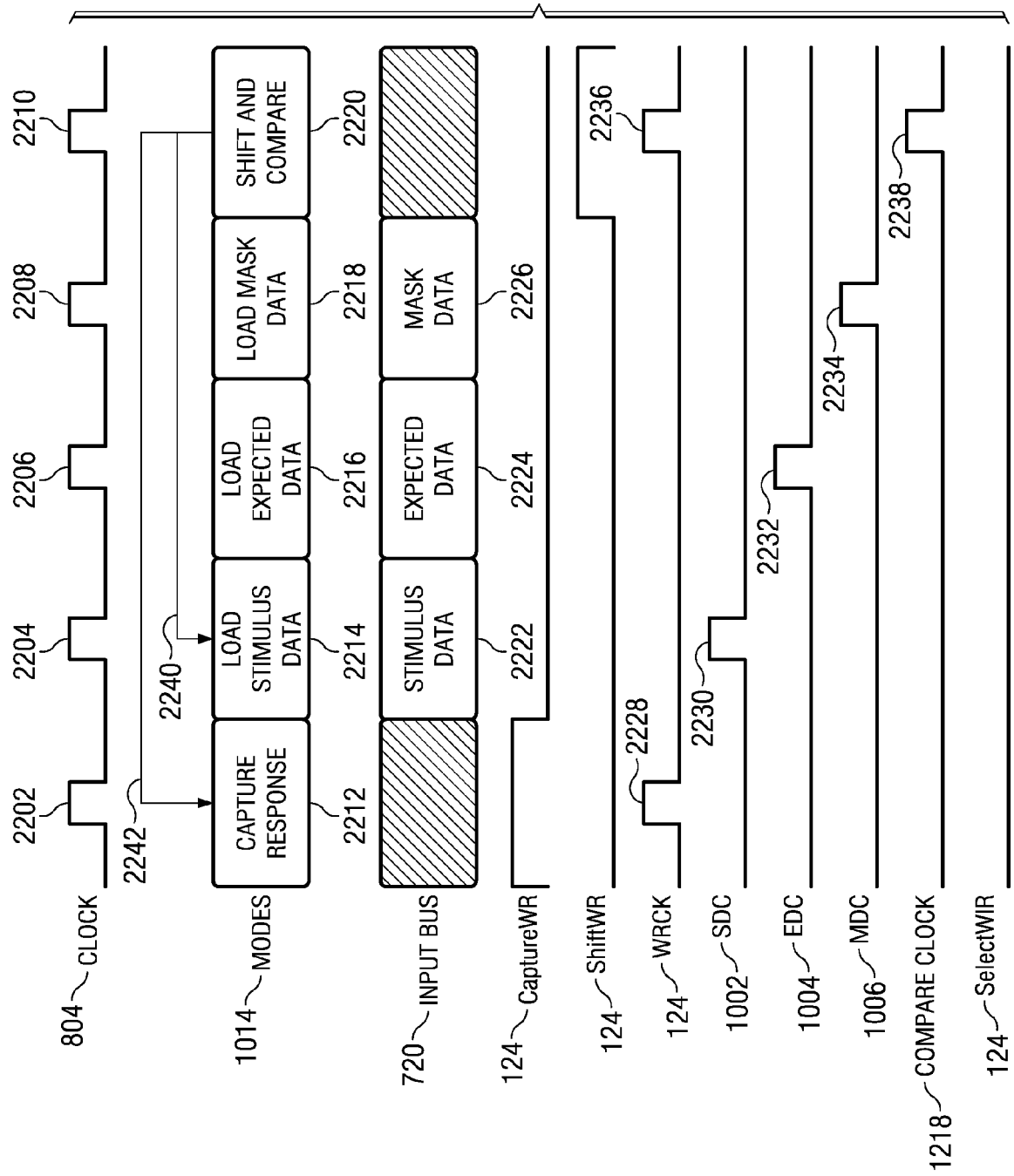
FIG. 22 illustrates detail timing of performing a first parallel scan test operation using a TAM and TAM controller according to the present invention.

FIG. 22 illustrates a detail timing diagram of the TAM controller 706 or 1502 programmed to perform the Parallel Scan Test instruction operation of FIGS. 14D and 16D consisting of capture response data, load stimulus data, load expected data, load mask data, and shift & compare steps. When programmed for a Parallel Scan Test operation, the TAM controller will set the SelectWIR output 124 low to enable scan access to the wrapper's parallel scan paths of FIGS. 3 and 4. The capture response step is achieved by inputting a Capture Response Mode input pattern 2212 which sets the CaptureWR output 124 high, followed by inputting a clock 2202 which produces a WRCK output 2228 that captures response data into the parallel scan paths. The load stimulus data step is achieved by inputting a Load Stimulus Data Mode input pattern 2214 and Stimulus Data 2222 on input bus 720, followed by a clock 2204 which produces a SDC clock output 2230 that writes the stimulus data into the SDM 742 of FIG. 10. The load expected data step is achieved by inputting a Load Expected Data Mode input pattern 2216 and Expected Data 2224 on input bus 720, followed by a clock 2206 which produces a EDC clock output 2232 that writes the expected data into the EDM 748 of FIG. 10. The load mask data step is achieved by inputting a Load Mask Data Mode input pattern 2218 and Mask Data 2226 on input bus 720, followed by a clock 2208 which produces a MDC clock output 2234 that writes the mask data into the MDM 746 of FIG. 10. The shift & compare step is achieved by inputting a Shift & Compare Mode input pattern 2220 which sets the ShiftWR output 124 high, followed by inputting a clock 2210 which produces a WRCK 2236 to shift the parallel scan paths one time to load stimulus data from the SDM and a Compare Clock 2238 that compares the response data output from the parallel scan paths to unmasked expected data, as described in regard to FIG. 12.

As seen, the Load Stimulus Data, Load Expected Data, Load Mask Data, and Shift & Compare steps are repeated in an inner loop 2240 that defines the shift portion of a scan cycle. The shift portion of a scan cycle is used to fill the parallel scan paths with stimulus data and empty the parallel scan paths of the response data. When the parallel scan path filling and emptying process is complete, a new scan cycle is started by the shown outer loop 2242 which repeats the capture response step by inputting a Capture Response Mode input pattern 2212 and a clock 2202 that producing a WRCK 228 to capture response data into the parallel scan paths. The inner and outer loops continue as described until all the scan cycles required for the test have been executed.

As seen, the Parallel Scan Test timing on the CaptureWR 124, WRCK 124, SDC 1002, EDC 1004, MDC 1006, Compare Clock 1218, and SelectWIR 124 outputs are not provided externally by a tester, but rather are provided internally by the TAM controller in response to the external clock 804 and Mode inputs 1014 from a tester. Thus the present invention provides a way to produce Parallel Scan Test control signals from an internal circuit (i.e. the TAM controller) rather than having to input the Parallel Scan Test control signals from an external tester. In should be understood that the shown sequences of loading stimulus data first, expected data second, and mask data last are not required to be in that particular order.

Figure 23:
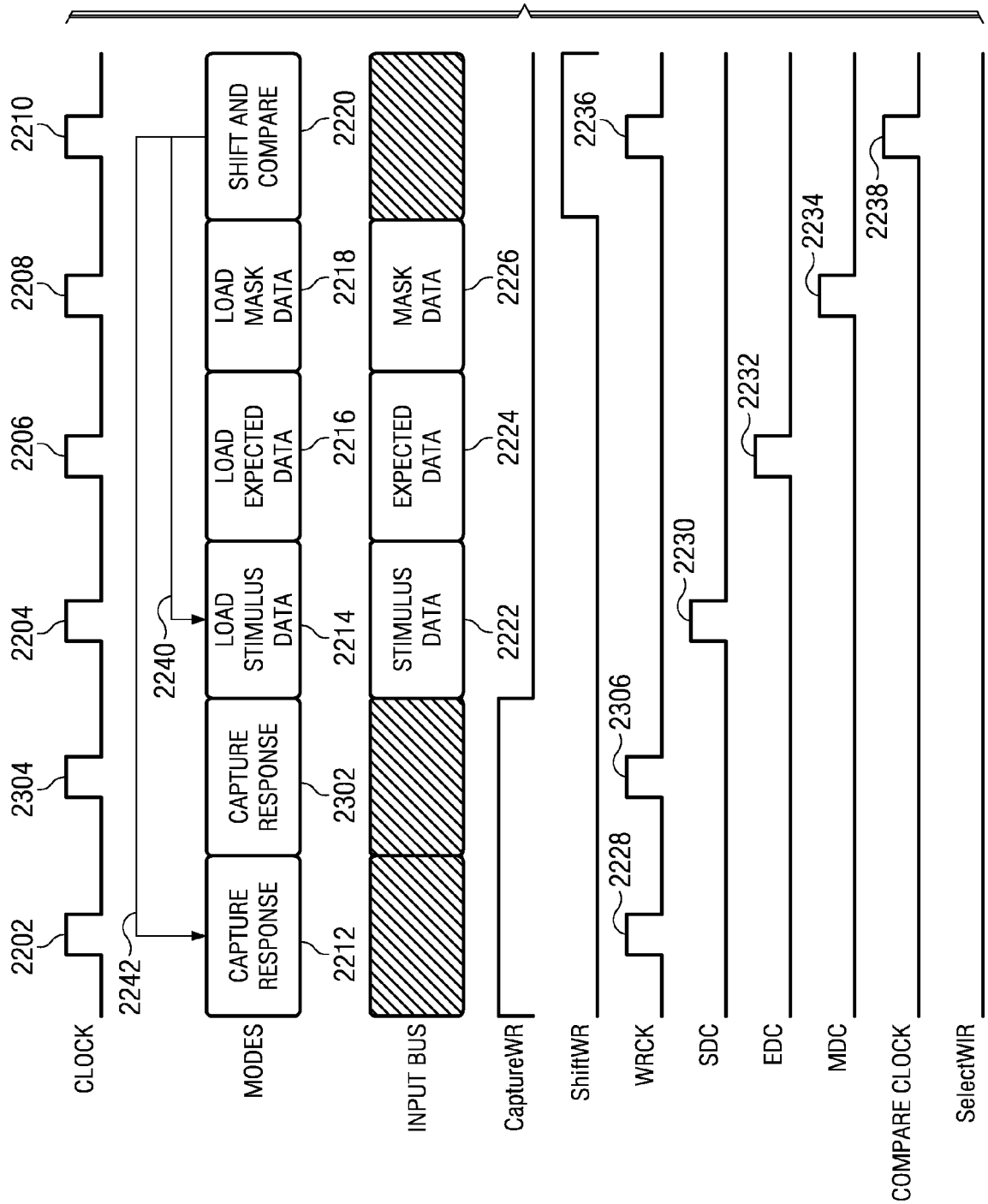
FIG. 23 illustrates detail timing of performing a second parallel scan test operation using a TAM and TAM controller according to the present invention.

FIG. 23 is provided to illustrate the timing of back to back response capture operations during the Parallel Scan Test operation. Back to back capture operations are used to improve the ability to do transition and timing tests using scan paths. As seen the only difference between the Parallel Scan Test timing of FIG. 22 and 23 is that a second Capture Response Mode input pattern 2302 is input following the first Capture Response Mode input pattern 2212, along with a second clock input 2304 that produces a second WRCK output 2306 to cause a second parallel scan path capture operation.

As mentioned in regard to FIGS. 10 and 11, mask data is required to mask off unknown scan path response data from being compared to expected data during the Compare Clock 1218 from the TAM controller 706 or 1502. However, it is possible to design circuits for scan testing that do not produce unknown response data, i.e. all the response data from the scan paths will be known. In this case the need for mask data input to the TAM 704 and circuits in the TAM 704 for storing and using the mask data can be eliminated.

Figure 24:
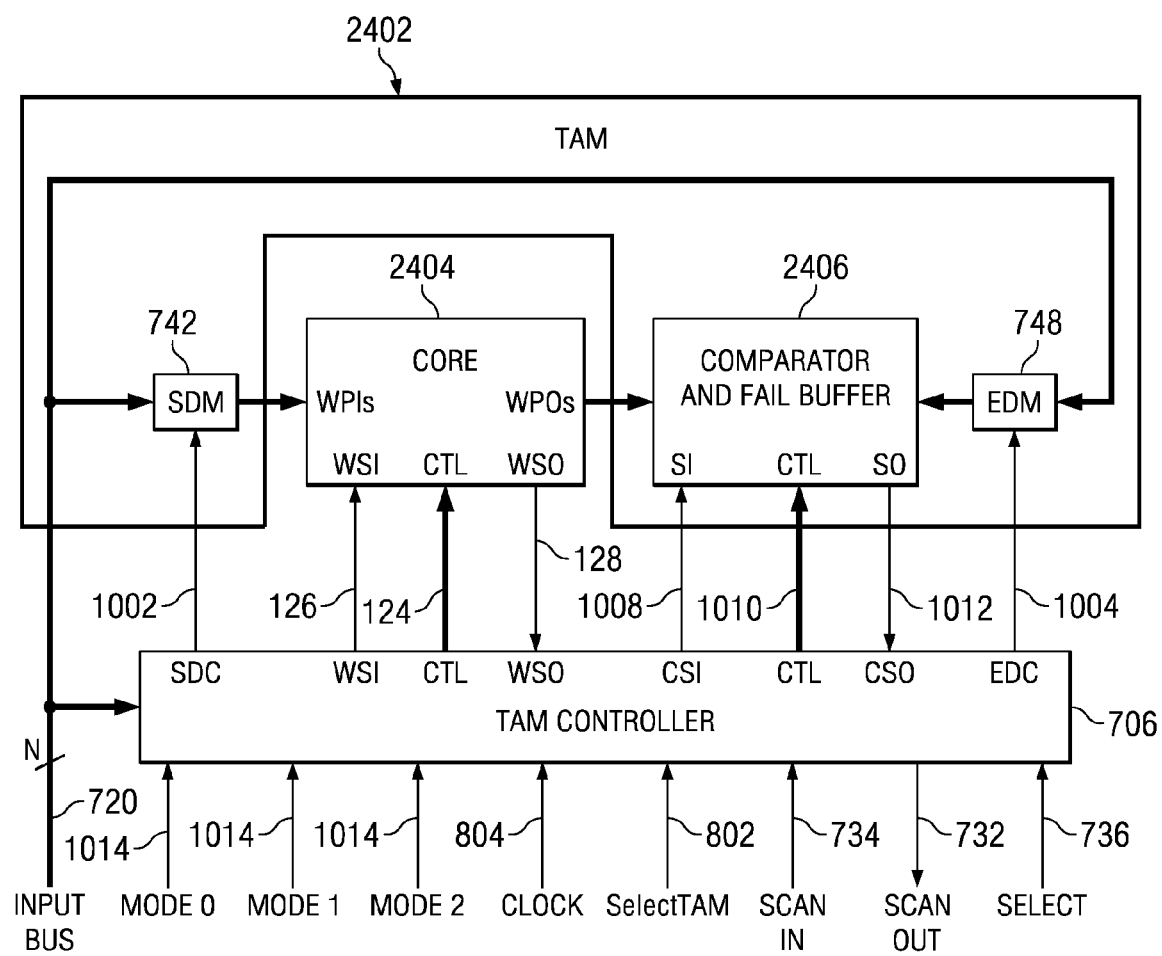
FIG. 24 illustrates an alternate TAM of the present invention interfaced to an alternate TAM controller of the present invention.

FIG. 24 is provided to illustrate a TAM 2402 coupled to a core wrapper 2404 whose WPOs do not produce unknown response data outputs to compare circuit 2406. The compare circuit 2406 could simply be compare circuit 750 of FIG. 12 with the mask data (MD) bit inputs to each of the maskable comparators 1216 tied or set low so that the expected data (ED) bits and response data (RD) bits are always compared. As seen in FIG. 24, the TAM 2402 does not require a MDM 746 as shown in the TAM of FIG. 12, and therefore does not require the MDC 1006 input from TAM controller 706 to load mask data from input bus 720. However, the TAM 2402 could be TAM 704 where the MDM 746 is present but used only once at the beginning of a test to be loaded with a mask data pattern (all lows) that forces a compare between expected data (ED) and response data (RD) bit inputs to maskable compare circuit 1216.

Figure 25:
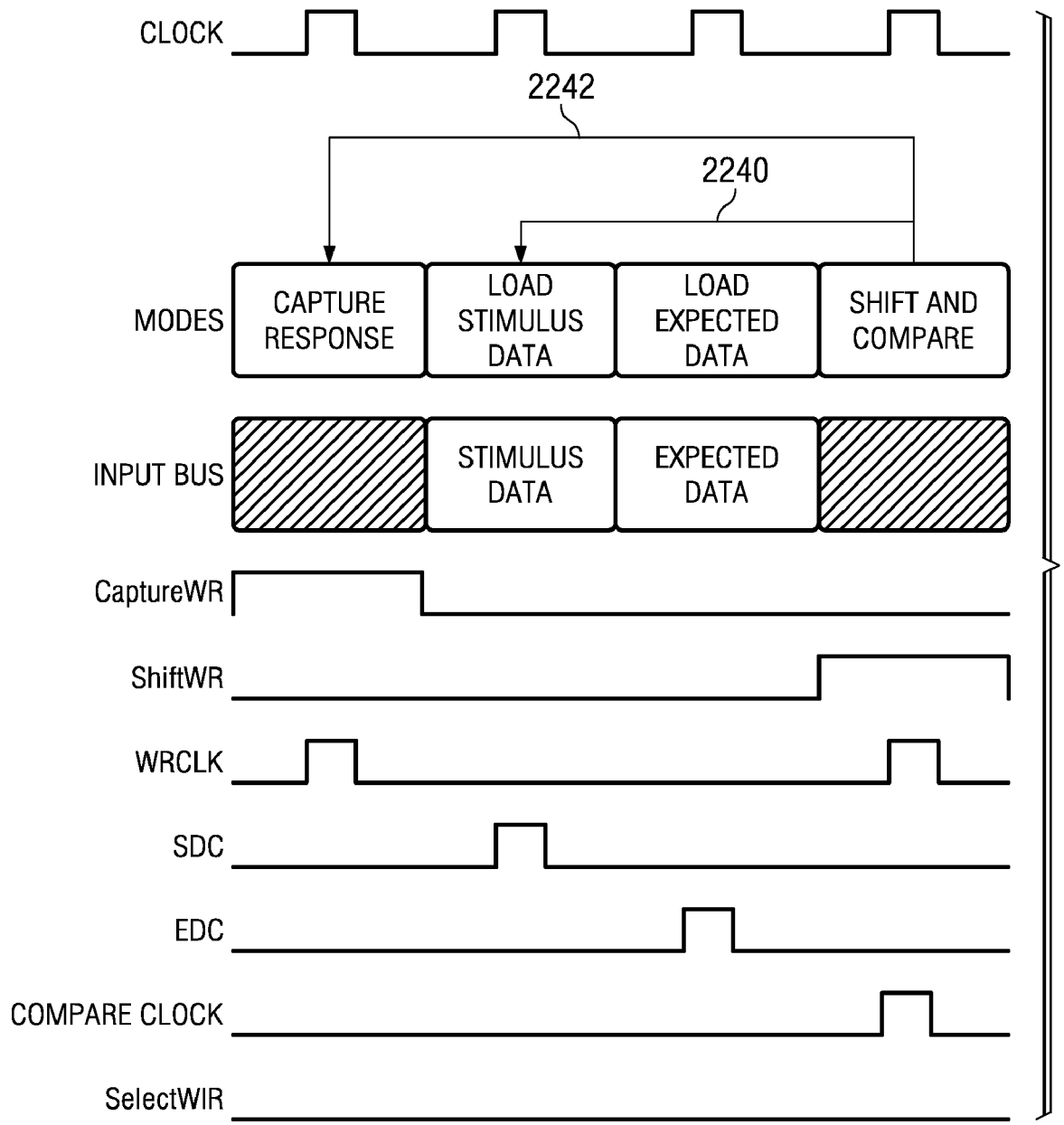
FIG. 25 illustrates detail timing of performing a first parallel scan test operation using the alternate TAM and TAM controller according to the present invention.

FIG. 25 is provided to illustrate a detail timing diagram of the TAM controller 706 or 1502 programmed to perform the Parallel Scan Test instruction operation using the TAM 2402 of FIG. 24. The timing is identical to that of FIG. 22 with the exception that it does not include the step of loading mask data, since mask data is not required in the parallel scan test since the core wrapper does not output unknown response data on WPO. As mentioned, if TAM 2402 is TAM 704, the tester can load the MDM of TAM 704 at the beginning of the test with a mask pattern that enables all compare operations performed during the test. After this one time MDM load, the parallel scan test instruction would proceed with the previously described scan cycle inner loop 2240 and outer loop 2242 timing shown in FIG. 22 until all required scan cycles have been performed.

Figure 26:
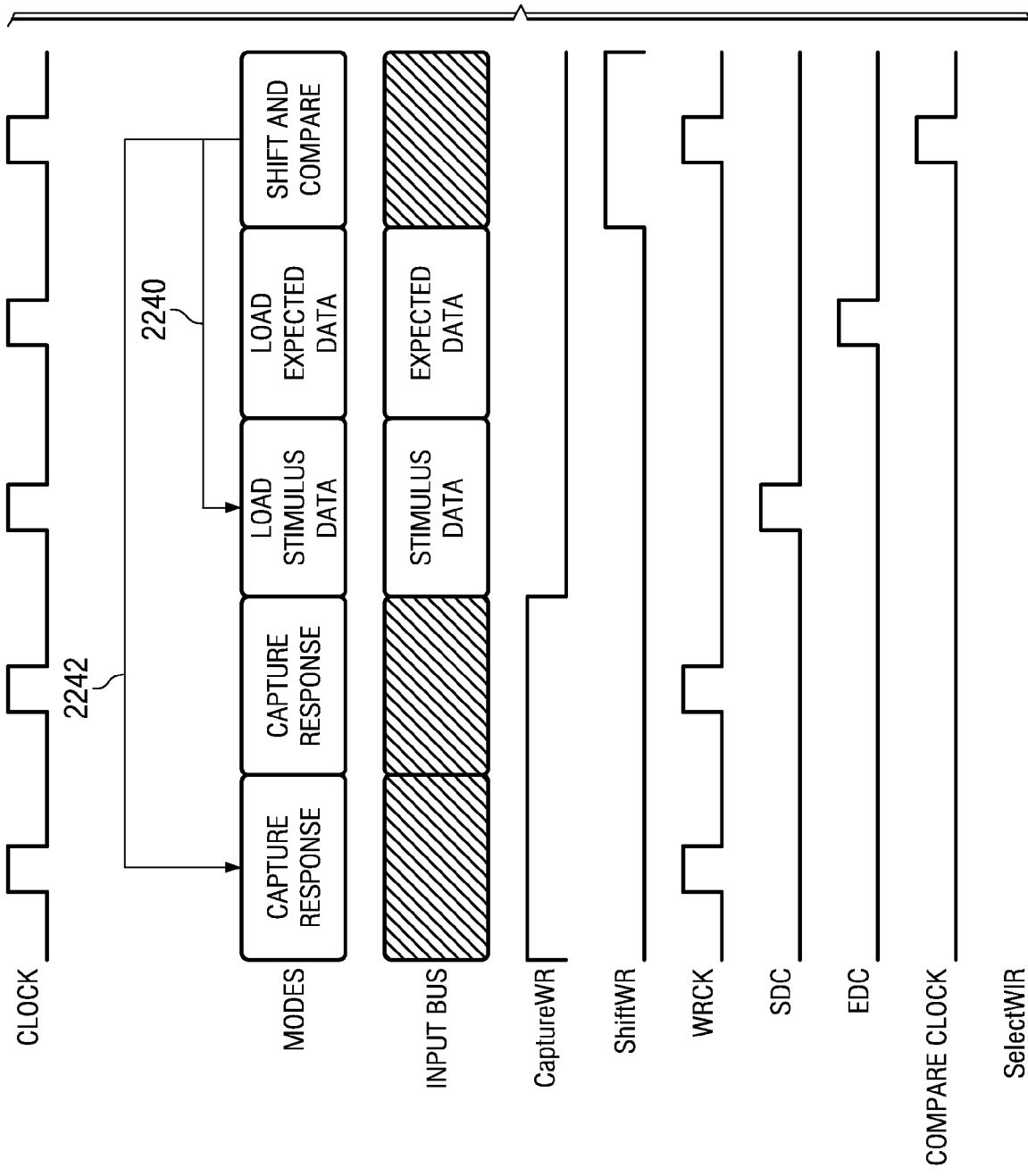
FIG. 26 illustrates detail timing of performing a second parallel scan test operation using the alternate TAM and TAM controller according to the present invention.

FIG. 26 is provided to illustrate a detail timing diagram of the TAM controller 706 or 1502 programmed to perform the Parallel Scan Test instruction operation using the TAM 2402 of FIG. 24. The timing is identical to that of FIG. 23 (i.e. scan testing using back to back response captures) with the exception that it does not include the step of loading mask data, since mask data is not required in the back to back capture parallel scan test since the core wrapper does not output unknown response data on WPO. As mentioned, if TAM 2402 is TAM 704, the tester can load the MDM of TAM 704 at the beginning of the test with a mask pattern that enables all compare operations performed during the test. After this one time MDM load, the back to back capture parallel scan test instruction would proceed with the previously described scan cycle inner loop 2240 and outer loop 2242 timing shown in FIG. 22 until all required scan cycles have been performed.

As can be seen by comparing the timing of FIG. 25 to FIG. 22 and FIG. 26 to FIG. 23, the removal of the mask data load step improves the shift efficiency of the shift portion of each scan cycle. In FIGS. 22 and 23 three load steps (stimulus, expected, and mask) are required prior to performing the shift & compare step. In FIGS. 25 and 26, only two load steps are required (stimulus and expected) prior to performing the shift & compare step. Since the shifting & comparing steps occur at a more rapid rate in FIGS. 25 and 26 than in FIGS. 22 and 23 the time required to complete all the scan cycles required for the test is reduced.

As mentioned earlier in regard to FIGS. 14A-14F, the TAM controller 706 or 1502 may be programmed to perform any desired output operation in response to the Mode inputs, by loading an instruction into the TIR 1302. Also a mentioned, the TAM controller may include additional outputs and/or additional Mode inputs to allow for controlling other circuits within a TAM or other circuits within the DUT. These other circuits may be test circuits, debug circuits, trace circuits, and/or emulation circuits. The following examples illustrate a TAM controller 2700 with additional signals added for interfacing to an IEEE 1149.1 standard TAP circuit within a core or other circuit within a DUT.

Figure 27:
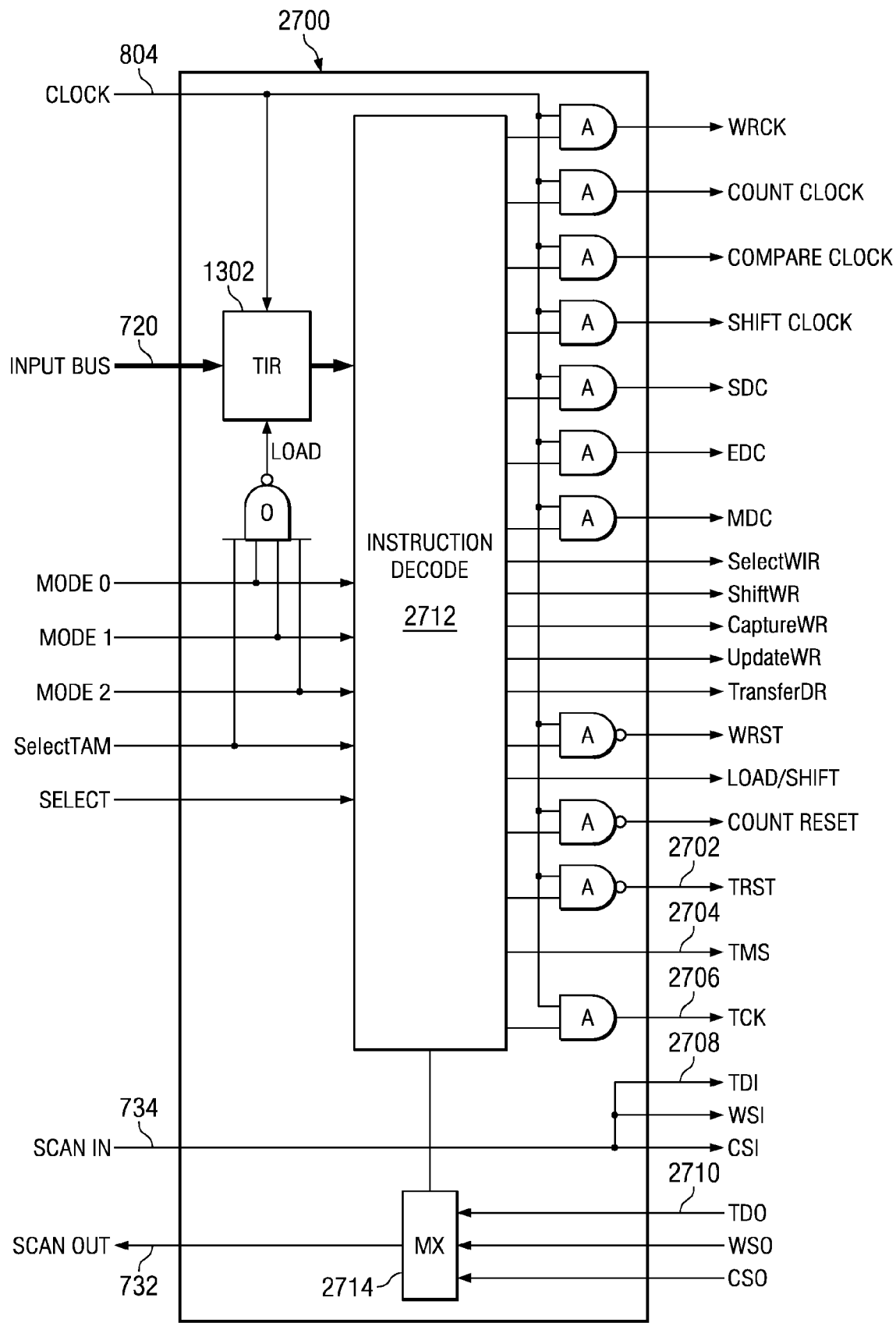
FIG. 27 illustrates a third example implementation of the TAM controller of the present invention.

FIG. 27 illustrates a TAM controller 2700 that includes additional control outputs (TRST, TMS, TCK), an additional data input (TDO), and an additional data output (TDI) for interfacing with an IEEE 1149.1 TAP circuit. The IEEE 1149.1 TRST (test reset), TMS (test mode select), TCK (test clock), TDI (test data input), and TDO (test data output) signals are well known. TAM controller 2700 is identical to TAM controller 706 of FIG. 13 with the exception of these additional output and input signals. The instruction decode circuit 2712 of TAM controller 2700 is identical to the instruction decode circuit 1308 of TAM controller 706 with the exception that it is designed to additionally decode the Mode inputs 1014 to operate these signals in response to an instruction loaded in the TIR 1302. The multiplexer 2714 of TAM controller 2700 is identical to multiplexer 1306 with the exception that multiplexer 2714 has an additional input for coupling the TDO signal 2710 to the Scan Out 732 signal. As seen, the Scan In signal 734 is additionally coupled to the TDI signal 2708. The TRST, TMS, and TCK signals are for controlling the operation of TAP circuit. The TDI signal is for inputting data to a TAP circuit. The TDO signal is for inputting data from a TAP circuit. It should be understood that the TAM controller 1502 of FIG. 15 could be equally modified as described above if desired.

Figure 28:
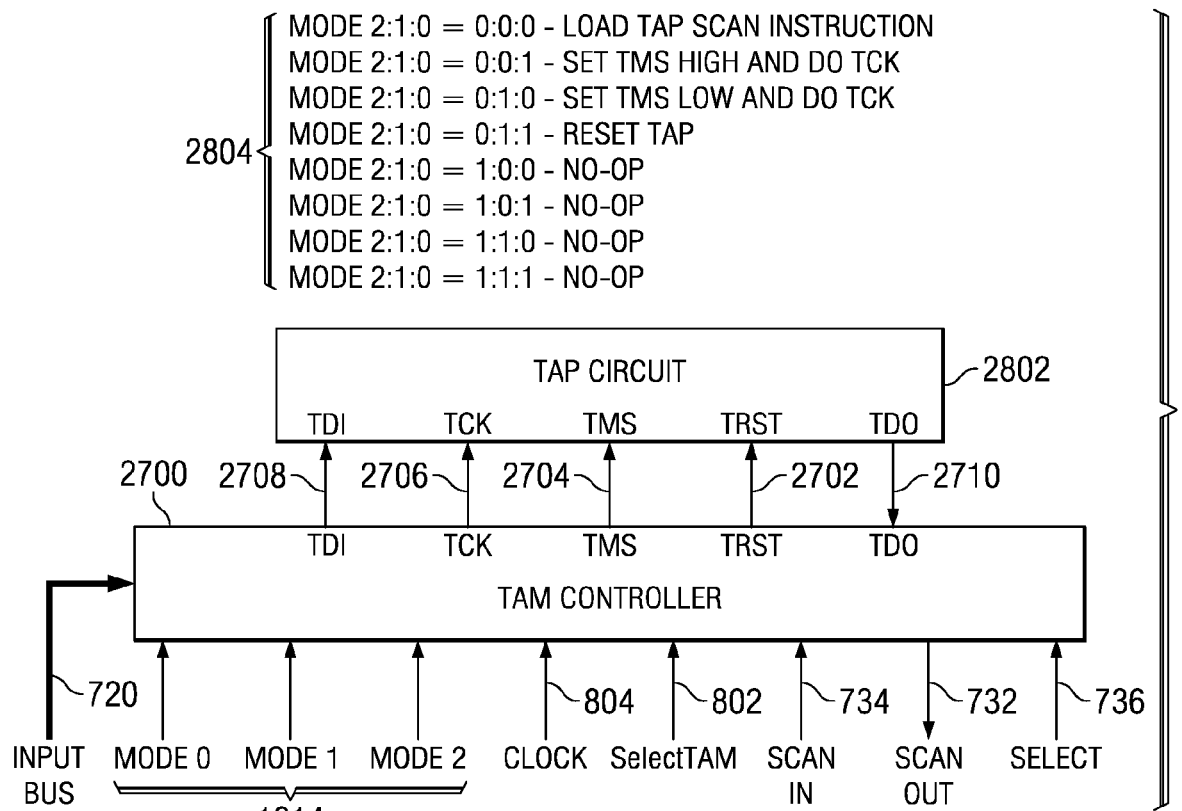
FIG. 28 illustrates a TAP circuit interfaced to the TAM controller of FIG. 27 according to the present invention.

FIG. 28 illustrates the TAM controller 2700 interfaced to a TAP circuit 2802. The TAP circuit 2802 can be a circuit used for performing a test operation, a debug operation, a trace operation, an emulation operation, and/or an in-circuit programming operation. The TAP circuit 2802 may be a circuit within a core of a DUT, a circuit within a circuit not considered to be a core of a DUT, or a circuit separate from cores and other circuits within a DUT that is required to perform one of the above or other functions required within the DUT. The TAP circuit 2802 contains a finite state machine, an instruction register, and a plurality of data registers. The TMS and TCK signals regulate the operation of the finite state machine to control the access to the instruction register or the plurality of data registers. The TRST signal is for resetting the TAP circuit. The TDI and TDO signals are for communicating data to instruction register or plurality of data registers.

Mode input pattern definition 2804 is like that previously shown in FIGS. 14A-14F in that it illustrates the loading of a TAP Scan instruction into the TIR 1302 of the TAM controller 2700 using the all zero input pattern. In response to this instruction, the Mode 0-2 input patterns are programmed in the instruction decode circuit 2712 to produce the following output operations from the TAM controller 2700. Mode 0-2 input patterns that are not programmed by this instruction are defined as no-operation (No-Op) patterns. No-Op patterns do not produce outputs from the TAM controller.

When Mode 2:1:0=0:0:1, a Set TMS High & Do TCK operation occurs which sets the TMS 2704 signal high and produces a gated clock output on TCK 2706. This operation is used to move the finite state machine within the TAP circuit 2802 through states.

When Mode 2:1:0=0:1:0, a Set TMS Low & Do TCK operation occurs which sets the TMS 2704 signal low and produces a gated clock output on TCK 2706. This operation is used to move the finite state machine within the TAP circuit 2802 through states.

When Mode 2:1:0=0:1:1, a Reset TAP operation occurs which produces a gated reset output on TRST 2702. This operation is used to reset circuitry within the TAP circuit.

The finite state machine within the TAP circuit responds to TMS and TCK to transition through a standard set of 16 states. The logic level present on TMS when a TCK occurs determines the state transitions. These state transitions are used to perform Instruction Scan, Data Scan, Run/Test Idle, and Test Reset functions. The instruction scan state transitions include among other states, a state for capturing data into the instruction register of the TAP circuit, a state for shifting data into the instruction register via TDI and from the instruction register via TDO, and a state for updating data from the instruction register. The data scan state transitions include among other states, a state for capturing data into a selected data register within the TAP circuit, a state for shifting data into the selected data register via TDI and from the select data register via TDO, and a state for updating data from the selected data register. Run/Test Idle is a state where the TAP circuit transitions to when it is idle or running a test. Test Reset is a state where the TAP circuit transition to when it is to be held in a reset condition. The operation of the finite state machine of TAP circuits in response to the TMS and TCK inputs is well known.

When the TAP circuit is performing an instruction or data scan operation, the TDI input to the TAP circuit will be driven by an external tester via Scan In signal 734 of the TAM controller and the TDO output signal from the TAP circuit received by an external tester via the Scan Out 732 of the TAM controller. During the TAP scan instruction, the decode circuit 2712 of the TAM controller will output control to multiplexer 2714 to couple TDO 2710 to Scan Out 732.

Figure 29:
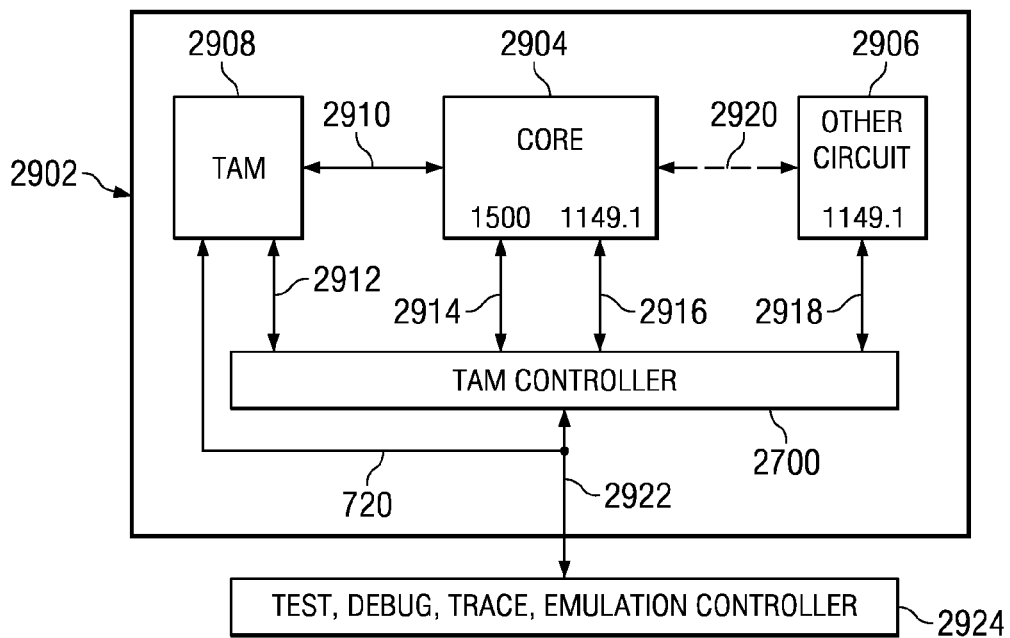
FIG. 29 illustrates a device containing the architecture of the present invention interfaced to a controller for test, debug, trace, and emulation operations.

FIG. 29 illustrates DUT 2902 interfaced to an external controller 2924 for test, debug, trace, and/or emulation operations using the above described 1149.1 TAP interface of TAM controller 2700. For simplification, the scan router 744 and TAM selector 710 circuits are not shown in the DUT. The DUT has a TAM 2908 which can be either a TAM 704 or 2402, a core 2904 including a 1500 wrapper 102 and a 1149.1 TAP circuit 2802, another circuit 2906 having a 1149.1 TAP circuit 2802, and a TAM controller 2700. The TAM is interfaced to the core wrapper's WPI and WPO buses via bus 2910, to the input bus 720 from external controller 2924, and to the TAM controller 2700 via bus 2912, which includes CSI 1008, CSO 1012, compare circuit control signals 1010, SDC 1002, EDC 1004, and MDC 1006. The core's 1500 wrapper 102 is interfaced to the TAM controller 2700 via bus 2914 which includes WSI 126, WSO 128, and wrapper control signals 124. The core's 1149.1 TAP circuit 2802 is interfaced to TAM controller 2700 via bus 2916, which includes TDI 2708, TDO 2710, TCK 2706, TMS 2704, and TRST 2702. The other circuit's 2906 TAP circuit 2802 is interfaced to TAM controller 2700 via bus 2918, which includes another set of TDI 2708, TDO 2710, TCK 2706, TMS 2704, and TRST 2702 signals. The other circuit 2906 may be interfaced to the core 2904 via bus 2920 to participate in a test, debug, trace, and/or emulation operation along with core 2904. The TAM controller 2700 is interfaced to the external controller 2924 for controlling test, debug, trace, and/or emulation operations via bus 2922, which includes input bus 720, Mode 0-2 inputs 1014, clock input 804, SelectTAM input 802, Scan In 734, Scan Out 732, and if used LoadTIR signal 1504. The external controller can perform parallel scan testing of the core circuit 2904 as previously described using TAM 2908 and core wrapper 102. The external controller can additionally perform test, debug, trace, and/or emulation of the core using the TAM controller's 1149.1 interface to the core circuit's 2904 TAP circuit 2802 and/or to the other circuit's 2902 TAP circuit 2802. The TAP circuit 2802 of the other circuit 2906 may perform other operations as well, such as DUT fuse programming, DUT security programming, and DUT memory repair.

While the present invention up to now has described a TAM controller being associated with each TAM and wrapper in a DUT (see FIG. 7), a single system level TAM controller may be used to control multiple TAMs and wrappers as well. The following FIGS. 30-34 illustrate the present invention using a single system TAM controller to control multiple TAMs, multiple wrappers, and multiple TAP circuits within a DUT.

Figure 30:
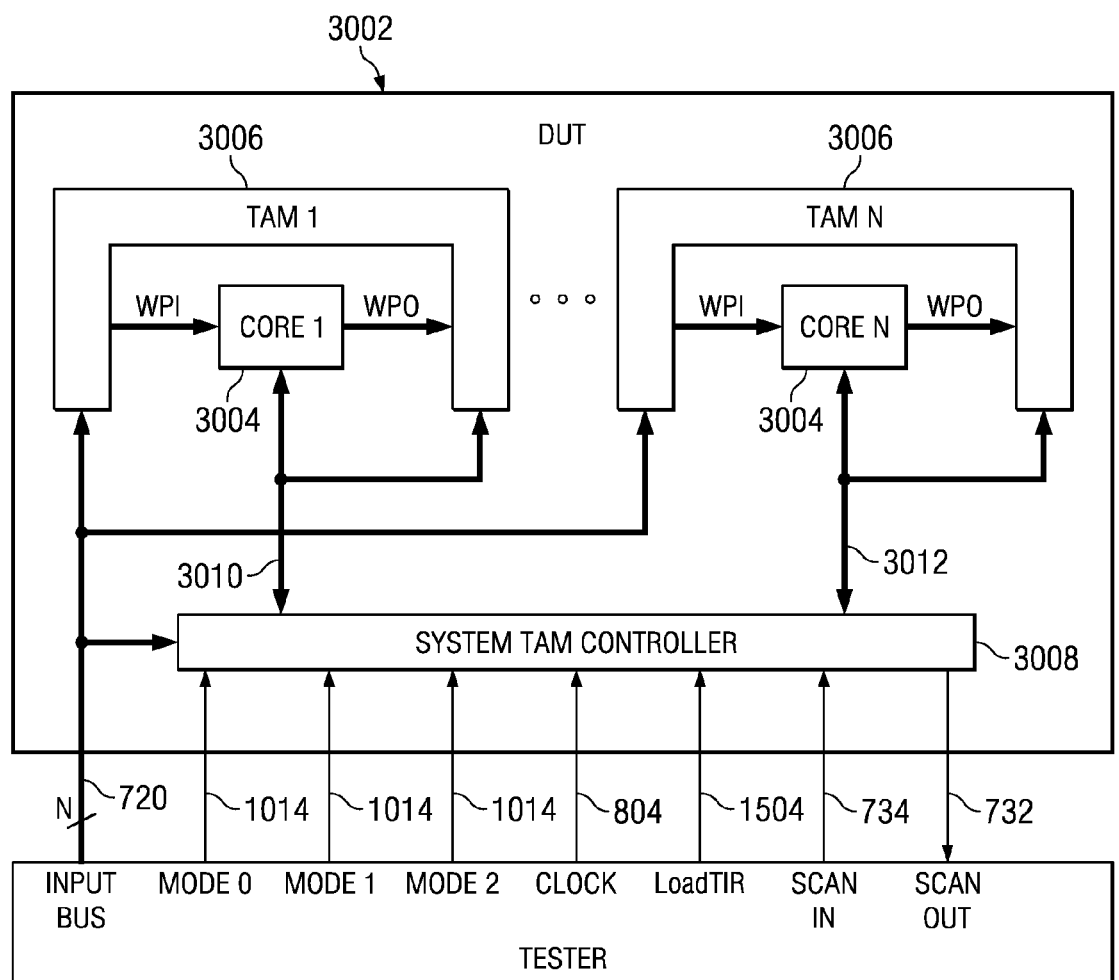
FIG. 30 illustrates a device containing a single TAM controller architecture of the present invention interfaced to a tester.

FIG. 30 illustrates a DUT test architecture 3002 consisting of cores 3004 1-N each having a wrapper 102, an embedded TAP circuit 2802, and an associated TAM 3006 1-N. The associated TAMs may be a TAM 704 of FIG. 10 or a TAM 2402 of FIG. 24. The wrappers, TAP circuits, and TAMs are separately interfaced to a system TAM controller 3008 via buses 3010 and 3012. Buses 3010 and 3012 consist of core wrapper interface signals WSI 126, WSO 128, and wrapper control signals 124, TAP circuit interface signals TDI 2708, TDO 2710, TMS 2704, TCK 2806, and TRST 2702, TAM interface signals SDC 1002, EDC 1004, MDC 1006, CSI 1008, CSO 1012, and compare circuit control signals 1010. Each TAM 3006 also receives the input bus 720 from an external tester/controller 3014. The system TAM controller 3008 is interfaced to the external tester/controller 3014 via input bus 720, Mode signals 1014, clock signal 804, LoadTIR signal 1504, Scan In signal 734, and Scan Out signal 732. In this and other examples in FIGS. 31-34, the previously described LoadTIR 1504 signal of FIG. 15 will be used to load instructions into the TIR 1302 of system TAM controller 3014 instead of using a Mode input pattern as described in FIG. 13. It should be clear however that a Mode input pattern could have been used to load the TIR as well. In comparing the DUT test architecture of FIG. 30 to the DUT test architecture of FIG. 13 it is seen that the TAM selector 710 and Scan Router 744 circuits of FIG. 13 are missing in the architecture of FIG. 30. The TAM selector 710 is not required, nor the SelectTAM signal 802, because only one system TAM controller 3008 exists in the architecture and it is always selected to interface to the external tester/controller 3014 when the DUT is in test mode. The Scan Router 744 is not shown because the scan routing function has been moved into the system TAM controller 3008, as will be described in FIG. 31.

Figure 31:
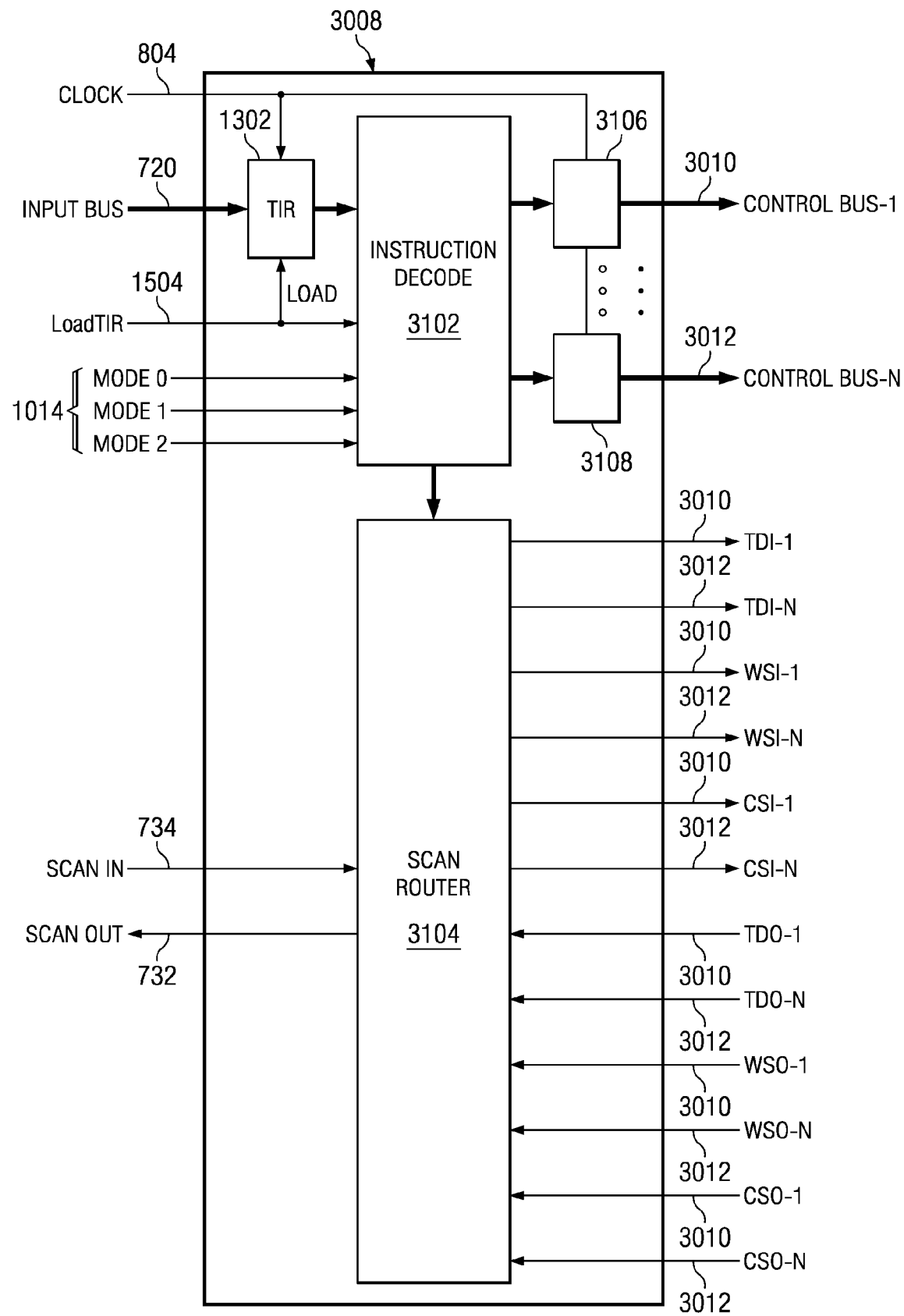
FIG. 31 illustrates an example implementation of the TAM controller of FIG. 30.

FIG. 31 illustrates system TAM controller 3008 in more detail. System TAM controller 3008 consists of a TIR 1302, an instruction decode circuit 3102, and a Scan Router 3104. Loading of the TIR occurs as described in FIG. 15 using the LoadTIR signal 1504. The instruction loaded into the TIR programs how the instruction decode circuit 3102 responds to Mode input patterns 1014 to control its outputs, also as described in FIG. 15. As seen, the instruction decode circuit 3102 has outputs that are input to circuit boxes 3106 and 3108, and outputs that control the scan routing function of Scan Router 3104. Circuit box 3106 outputs signals on bus 3010 that in this example are the output signals shown in FIG. 27, including WRCK, Count Clock Compare Clock, Shift Clock, SDC, EDC, MDC, SelectWIR, ShiftWR, CaptureWR, UpdateWR, TransferDR, WRST, Load/Shift, Count Reset, TRST, TMS, and TCK outputs. In addition, bus 3110 also includes the TDI-1, WSI-1, CSI-1, TDO-1, WSO-1, and CSO-1 signals interfaced to the Scan Router 3104. Circuit box 3108 outputs signals on bus 3012 that in this example are also the outputs shown in FIG. 27, including WRCK, Count Clock Compare Clock, Shift Clock, SDC, EDC, MDC, SelectWIR, ShiftWR, CaptureWR, UpdateWR, TransferDR, WRST, Load/Shift, Count Reset, TRST, TMS, and TCK outputs. In addition, bus 3112 also includes the TDI-N, WSI-N, CSI-N, TDO-N, WSO-N, and CSO-N signals interfaced to the Scan Router 3104. Circuit boxes 3106 and 3108 simply illustrate the clock gating, reset gating, and wiring shown in FIG. 27 between the instruction decode circuit's outputs and the output buses 3010 and 3012 of system TAM controller 3008. In response to an instruction loaded into the TIR, the system TAM controller 3008 responds to Mode input patterns 1014 to output control signals on bus 3010 or bus 3012, output data on selected data signals of bus 3010 or 3012, and input data from selected data signals of bus 3010 or 3012.

If the instruction is for scanning a TAP circuit 2802 within core 1, the instruction decode circuit 3102 of the TAM controller 3008 will output control to the Scan Router 3104 to couple Scan In 734 to TDI-1 and Scan Out 732 to TDO-1, followed by outputting control on bus 3010 to control the TAP circuit 2802 to scan data as described in regard to FIG. 28. If the instruction is for scanning the wrapper 102 of core 1, the instruction decode circuit 3102 of the TAM controller 3008 will output control to the Scan Router 3104 to couple Scan In 734 to WSI-1 and Scan Out 732 to WSO-1, followed by outputting control on bus 3010 to control the wrapper 102 to scan data as described in regard to FIGS. 19 and 20. If the instruction is for scanning the compare circuit 750 of TAM 1 of core 1, the instruction decode circuit 3102 of the TAM controller 3008 will output control to the Scan Router 3104 to couple Scan In 734 to CSI-1 and Scan Out 732 to CSO-1, followed by outputting control on bus 3010 to control the compare circuit 750 to scan data as described in regard to FIG. 21. If the instruction is for operating TAM 1 and the wrapper of core 1 to perform a parallel scan test, the instruction decode circuit 3102 of the TAM controller 3008 will output control on bus 3010 to perform the response capture, data (stimulus, expected, mask) input, and shift & compare steps as described in regard to FIGS. 22 and 23.

If the instruction is for scanning a TAP circuit 2802 within core N the instruction decode circuit 3102 of the TAM controller 3008 will output control to the Scan Router 3104 to couple Scan In 734 to TDI-N and Scan Out 732 to TDO-N, followed by outputting control on bus 3012 to control the TAP circuit 2802 to scan data as described in regard to FIG. 28. If the instruction is for scanning the wrapper 102 of core N, the instruction decode circuit 3102 of the TAM controller 3008 will output control to the Scan Router 3104 to couple Scan In 734 to WSI-N and Scan Out 732 to WSO-N, followed by outputting control on bus 3012 to control the wrapper 102 to scan data as described in regard to FIGS. 19 and 20. If the instruction is for scanning the compare circuit 750 of TAM N of core N, the instruction decode circuit 3102 of the TAM controller 3008 will output control to the Scan Router 3104 to couple Scan In 734 to CSI-N and Scan Out 732 to CSO-N, followed by outputting control on bus 3012 to control the compare circuit 750 to scan data as described in regard to FIG. 21. If the instruction is for operating TAM N and the wrapper of core N to perform a parallel scan test, the instruction decode circuit 3102 of the TAM controller 3008 will output control on bus 3012 to perform the response capture, data (stimulus, expected, mask) input, and shift & compare steps as described in regard to FIGS. 22 and 23.

Instructions can be input to the system TAM controller 3008 to cause the Scan Router 3104 to place multiple wrappers in series between Scan In 734 and Scan Out 732 to facilitate scanning instructions or data through multiple wrappers. Instructions can also be input to the system TAM controller 3008 to cause the Scan Router 3104 to place multiple TAP circuits in series between Scan In 734 and Scan Out 732 to facilitate scanning instructions or data through multiple TAP circuits. Instructions can also be input to the system TAM controller 3008 to cause the Scan Router 3104 to place multiple TAM compare circuits 750 in series between Scan In 734 and Scan Out 732 to facilitate scanning fail data from multiple compare circuits.

Figure 32:
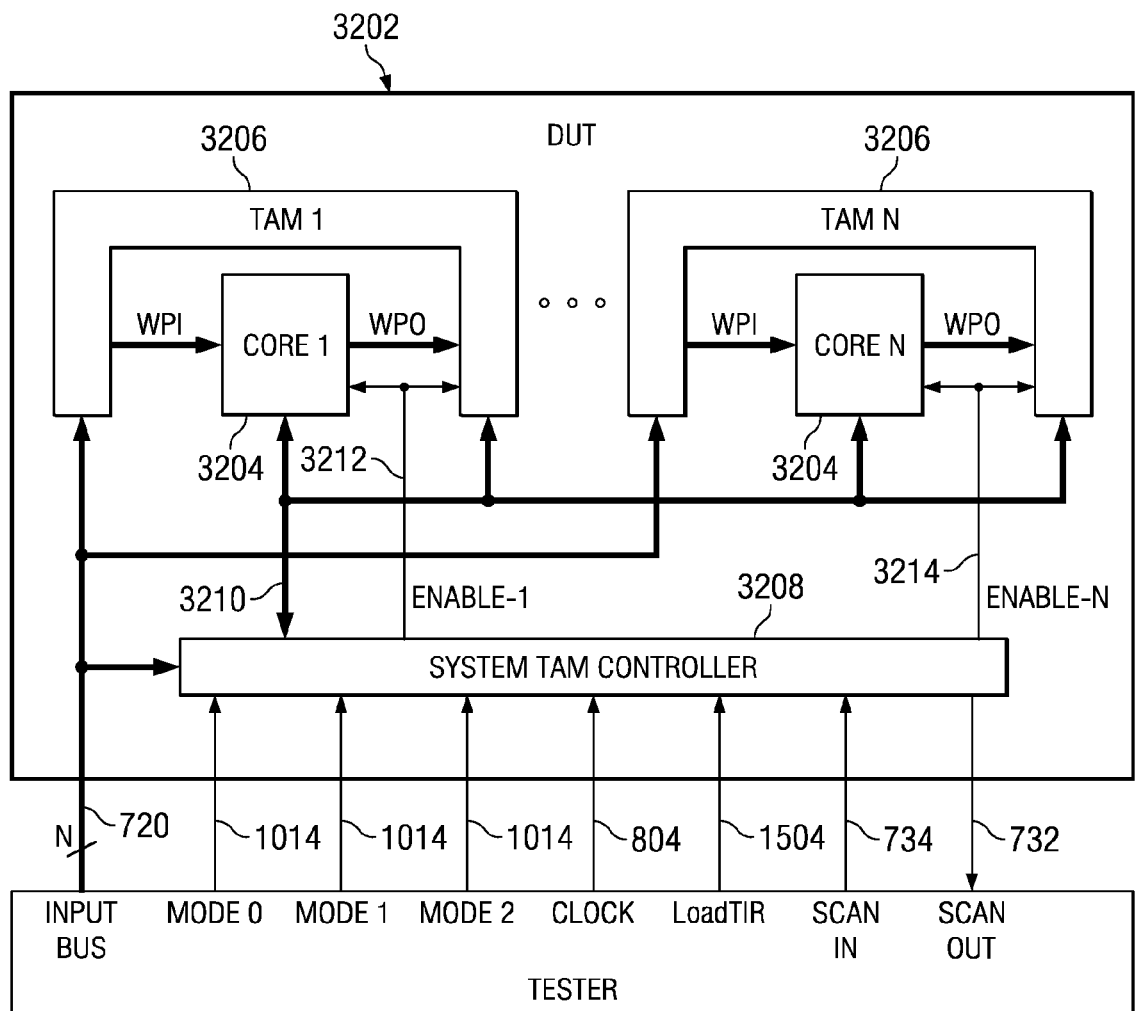
FIG. 32 illustrate a device containing an alternate single TAM controller architecture of the present invention interfaced to a tester.

FIG. 32 illustrates a DUT test architecture 3202 consisting of cores 3204 1-N each having a wrapper 102, an embedded TAP circuit 2802, and an associated TAM 3206 1-N. The wrappers, TAP circuits, and TAMs are commonly interfaced to a system TAM controller 3208 via a bus 3210. The system TAM controller outputs an Enable-1 signal 3212 to core 1's wrapper, TAP circuit, and TAM 1, and an Enable-N signal 3214 to core N's wrapper, TAP circuit, and TAM N. The Enable 1 signal enables core 1's wrapper, TAP circuit, and TAM 1 to operate using bus 3210 from system TAM controller 3208. The Enable N signal enables core N's wrapper, TAP circuit, an TAM N to operate using bus 3210 from system TAM controller 3208. Except for the use of a common bus 3210 and Enable signals 1-N from system TAM controller 3208, the architecture is similar to that described in FIG. 30.

Figure 33:
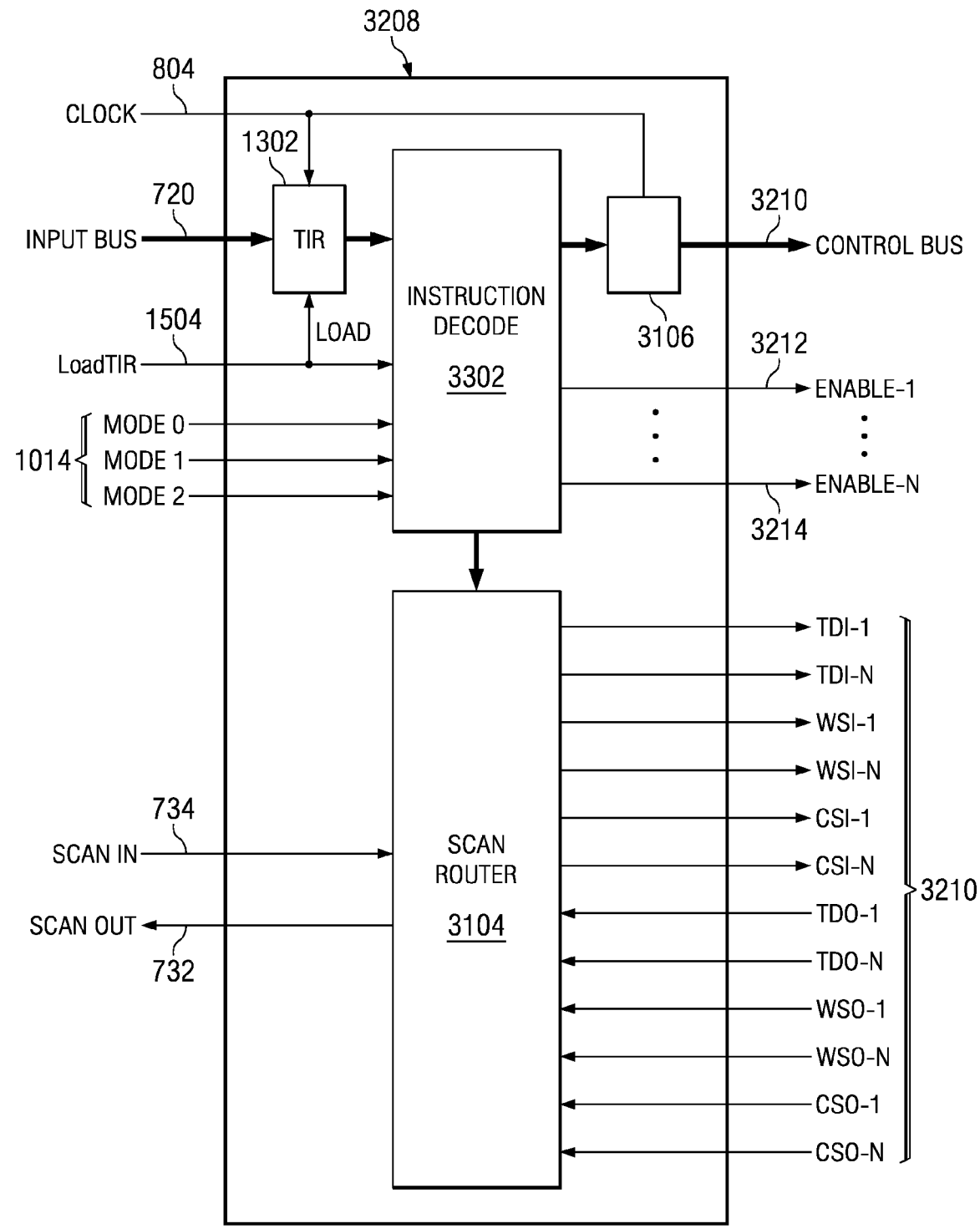
FIG. 33 illustrates an example implementation of the TAM controller of FIG. 32.

FIG. 33 illustrates system TAM controller 3208 in more detail. System TAM controller 3208 consists of a TIR 1302, an instruction decode circuit 3302, and a Scan Router 3104. Loading of the TIR occurs as described in FIG. 15 using the LoadTIR signal 1504. The Scan Router 3104 is similar to the previously described Scan Router 744 in that it allows coupling the Scan In 734 and Scan Out 732 of the system TAM controller to one or more serially accessible circuits (i.e. TAM circuit, TAP circuit, Wrapper circuit). The instruction loaded into the TIR programs how the instruction decode circuit 3302 responds to Mode input patterns 1014 to control its outputs, also as described in FIG. 15. As seen, the instruction decode circuit 3302 has outputs that are input to circuit box 3106, outputs for Enable 1 3212 and Enable N 3214, and outputs that control the scan routing function of Scan Router 3104. Circuit box 3106 outputs signals on bus 3210 that in this example are the outputs shown in FIG. 27, including WRCK, Count Clock Compare Clock, Shift Clock, SDC, EDC, MDC, SelectWIR, ShiftWR, CaptureWR, UpdateWR, TransferDR, WRST, Load/Shift, Count Reset, TRST, TMS, and TCK outputs. In addition, bus 3210 also includes the TDI-1, TDI-N, WSI-1, WSI-N, CSI-1, CSI-N, TDO-1, TDO-N, WSO-1, WSO-N, CSO-1, and CSO-N signals interfaced to the Scan Router 3104. Circuit box 3106 simply illustrates the clock gating, reset gating, and wiring shown in FIG. 27 between the instruction decode circuit's outputs and the output bus 3210 of system TAM controller 3208. In response to an instruction loaded into the TIR, the system TAM controller 3208 responds to Mode input patterns 1014 to output control signals on bus 3210, output data on selected data signals of bus 3210, and input data from selected data signals of bus 3210.

If the instruction is for scanning a TAP circuit 2802 within core 1, the instruction decode circuit 3302 of the TAM controller 3208 will set the Enable-1 output 3212 high, output control to the Scan Router 3104 to couple Scan In 734 to TDI-1 and Scan Out 732 to TDO-1, followed by outputting control on bus 3210 to control the TAP circuit 2802 to scan data as described in regard to FIG. 28. If the instruction is for scanning the wrapper 102 of core 1, the instruction decode circuit 3302 of the TAM controller 3208 will set the Enable-1 output 3212 high, output control to the Scan Router 3104 to couple Scan In 734 to WSI-1 and Scan Out 732 to WSO-1, followed by outputting control on bus 3210 to control the wrapper 102 to scan data as described in regard to FIGS. 19 and 20. If the instruction is for scanning the compare circuit 750 of TAM 1 of core 1, the instruction decode circuit 3302 of the TAM controller 3208 will set the Enable-1 output 3212 high, output control to the Scan Router 3104 to couple Scan In 734 to CSI-1 and Scan Out 732 to CSO-1, followed by outputting control on bus 3210 to control the compare circuit 750 to scan data as described in regard to FIG. 21. If the instruction is for operating TAM 1 and the wrapper of core 1 to perform a parallel scan test, the instruction decode circuit 3302 of the TAM controller 3208 will set the Enable-1 output 3212 high, output control on bus 3210 to perform the response capture, data (stimulus, expected, mask) input, and shift & compare steps as described in regard to FIGS. 22 and 23.

If the instruction is for scanning a TAP circuit 2802 within core N the instruction decode circuit 3302 of the TAM controller 3208 will set the Enable-N output 3214 high, output control to the Scan Router 3104 to couple Scan In 734 to TDI-N and Scan Out 732 to TDO-N, followed by outputting control on bus 3210 to control the TAP circuit 2802 to scan data as described in regard to FIG. 28. If the instruction is for scanning the wrapper 102 of core N, the instruction decode circuit 3302 of the TAM controller 3208 will set the Enable-N output 3214 high, output control to the Scan Router 3104 to couple Scan In 734 to WSI-N and Scan Out 732 to WSO-N, followed by outputting control on bus 3210 to control the wrapper 102 to scan data as described in regard to FIGS. 19 and 20. If the instruction is for scanning the compare circuit 750 of TAM N of core N, the instruction decode circuit 3302 of the TAM controller 3208 will set the Enable-N output 3214 high, output control to the Scan Router 3104 to couple Scan In 734 to CSI-N and Scan Out 732 to CSO-N, followed by outputting control on bus 3210 to control the compare circuit 750 to scan data as described in regard to FIG. 21. If the instruction is for operating TAM N and the wrapper of core N to perform a parallel scan test, the instruction decode circuit 3302 of the TAM controller 3208 will set the Enable-N output 3214 high, output control on bus 3210 to perform the response capture, data (stimulus, expected, mask) input, and shift & compare steps as described in regard to FIGS. 22 and 23.

Instructions can be input to the system TAM controller 3208 to cause the Scan Router 3104 to place multiple wrappers in series, via their WSIs and WSOs, between Scan In 734 and Scan Out 732 to facilitate scanning instructions or data through multiple wrappers. Instructions can also be input to the system TAM controller 3208 to cause the Scan Router 3104 to place multiple TAP circuits in series, via their TDIs and TDOs, between Scan In 734 and Scan Out 732 to facilitate scanning instructions or data through multiple TAP circuits. Instructions can also be input to the system TAM controller 3208 to cause the Scan Router 3104 to place multiple TAM compare circuits 750 in series, via their CSIs and CSOs, between Scan In 734 and Scan Out 732 to facilitate scanning fail data from multiple TAM compare circuits.

Figure 34:
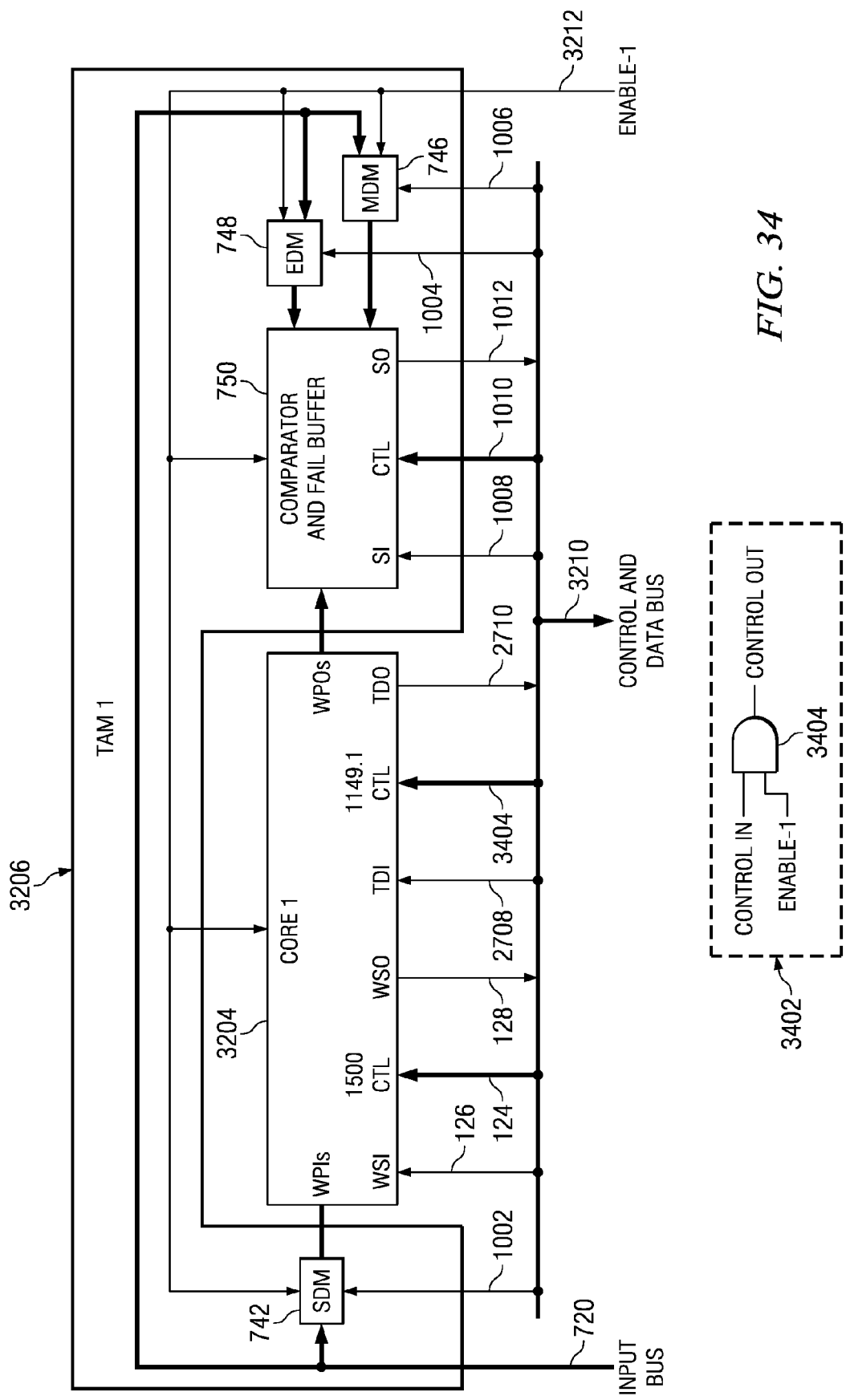
FIG. 34 illustrates the interface between the TAM controller, TAM, and core of FIG. 32 according to the present invention.

FIG. 34 illustrates the core 1 3204 and TAM 1 3206 circuits of FIG. 32 in more detail. The TAM circuit 3206 is the same as the TAM circuit 704 of FIG. 10 with the exception that the SDM 742, compare circuit 750, EDM 748, and MDM 746 include an input for receiving the Enable-1 signal 3212 from system TAM controller 3208. The Enable-1 signal is used to enable or disable the SDM, compare circuit, EDM, and MDM. The core 1 circuit is the same as the core circuit 708 of FIG. 10 with the exceptions that; (1) the core 1 circuit 3204 includes an 1149.1 TAP circuit 2802 and interface, and (2) the core 1 circuit 3204 has an input for receiving the Enable-1 signal 3212. The Enable-1 signal is used to enable or disable the 1500 wrapper and 1149.1 TAP circuits and interfaces of core 1.

If core 1 3204 and TAM 1 3206 are to be accessed for a test, debug, trace, and/or emulation operation, the system TAM controller 3014 will set the Enable-1 signal to a value that enables core 1's 1500 and 1149.1 circuits, and the circuits within TAM 3206. While enabled, the TAM 1 and 1500 and 1149.1 circuits in core 1 respond to the control & data bus 3210 from the system TAM controller to perform the desired operation. If the Enable-1 signal 3212 is not set to a value that enables the core 1 wrapper, TAP, and TAM circuits, the circuits do not respond to the control & data bus 3210 from the system TAM controller. Circuit 3402 shows one example way of how the control inputs to the wrapper, TAP, and TAM circuits of FIG. 34 can be enabled or disabled using an And gate 3404 by the Enable-1 signal. Control In of circuit 3402 can be any of the control inputs from control & data bus 3210 (i.e. SDC 1002, EDC 1004, MDC 1006, compare circuit 750 control signals 1010 (except for Count Reset 1228), TAP circuit 2802 control signals 3404 (except for TRST 2702), or wrapper circuit 102 control signals 124 (except for WRST 124). If Enable-1 is low, the Control Out signal of circuit 3402 is gated off low. If Enable-1 is high, the Control Out signal of circuit 3402 is gated on to be driven by the Control In signal of circuit 3402. The Count Reset, TRST, and WRST signals are preferably not gated on and off using And gate 3404, as this would force a reset condition on the TAM compare circuit 750, TAP circuit 2802, and wrapper circuit 102 when the TAM and core 1 circuits are disabled from responding to the control & data bus 3210. The reason for this is that it may be required to enable and set up a test, debug, trace, and/or emulation operation in a plurality of cores and TAMs by enabling and setting up each core and TAM in a sequence. If circuits within the cores and TAMs were reset when they are disabled, the set up conditions loaded in the cores and TAM (especially the instruction registers of the wrapper and/or TAP circuits) would be cleared out. Due to this, it is preferred to not gate the reset inputs to core and TAM circuits when a plurality of cores and TAM are required to be set up to participate in a test, debug, trace, and/or emulation operation. However, if test, debug, trace, and/or emulation operations are only performed on one core and TAM at a time, it would be acceptable to gate the reset inputs to core and TAM circuits since the access to these circuits would be completed when they are disabled. While not shown in FIG. 34, the Core N 3204 and TAM N 3206 of FIG. 32 can be similarly enabled or disabled by the Enable-N signal from the system TAM controller 3208 to respond or not respond the control & data bus 3210.

While the cores of FIGS. 30 and 32 were shown to include TAP circuits 2802 and the system TAM controllers of FIGS. 30 and 32 were shown to include interfaces for the TAP circuits 2802, it should be understood that FIGS. 30 and 32 could represent cores without TAP circuits and system TAM controllers without TAP circuit interfaces as well. Without TAP circuits, the cores would only have a wrapper 102 interface and the system TAM controllers would only have an interface for communicating with the core wrapper and TAM circuits.

In summarizing the architectures of the present invention, it is seen that the architecture of FIG. 7 uses a TAM controller 706 for each TAM 704 and Core 708 combination, the architecture of FIG. 30 uses one system TAM controller 3008 for all TAM 3006 and Core 3004 combinations, and the architecture of FIG. 32 uses one system TAM controller 3208 for all TAM 3206 and Core 3204 combinations. The architectures of FIG. 30 and 32 differ in that the system TAM controller 3008 of FIG. 300 accesses each Core and TAM combination using a separate bus 3010-3012, whereas the system TAM controller 3208 of FIG. 32 accesses each Core and TAM combination using a common bus 3212 through the use of Enable signals 3212-3214.

Figure 35:
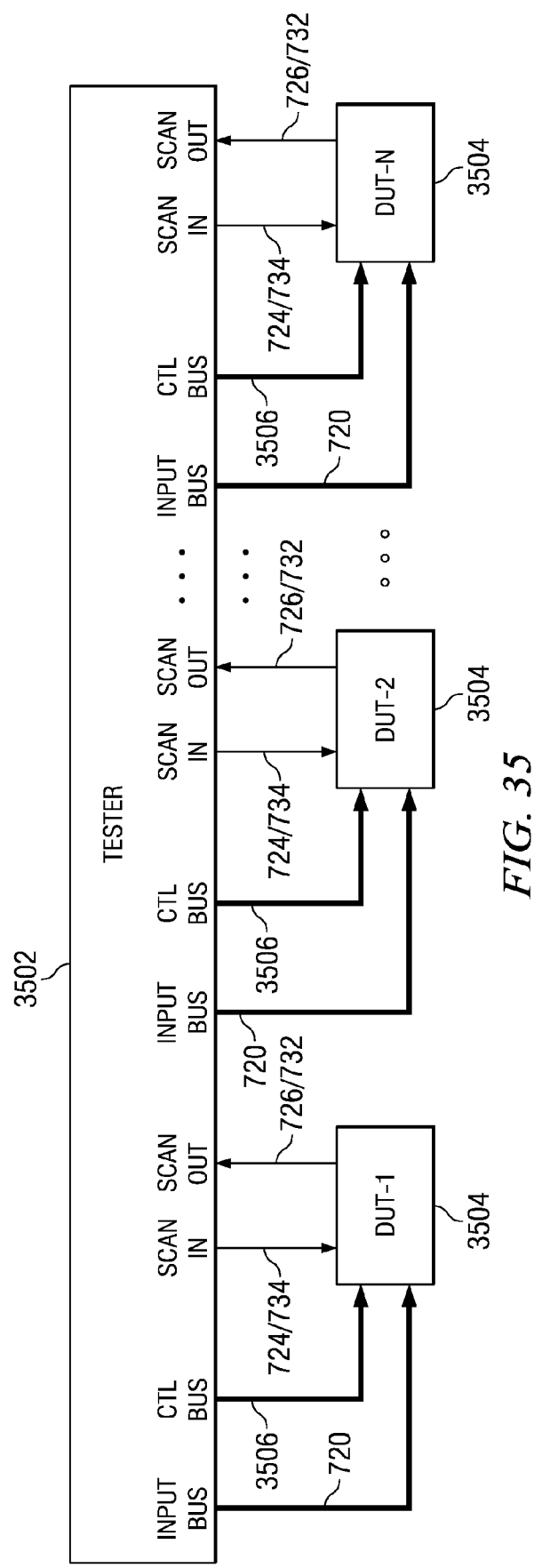
FIG. 35 illustrates a test arrangement between a tester and a plurality of devices.

FIG. 35 illustrates a testing arrangement of the present invention whereby a tester 3502 is interfaced to a plurality of DUTs 1-N 3504. The DUTs include one of the test architectures described in regard to FIGS. 7, 30, and 32. The tester has an interface to each DUT's test architecture consisting of an input bus 720, a control bus 3506, Scan In 724 or 734, and Scan Out 726 or 732. If the DUT architecture is the architecture of FIG. 7, the control bus 3506 will consist of Mode 0-2 inputs 1014, Clock 804, and SelectTAM 802 signals. If the LoadTIR signal of FIG. 15 is used to load the TIR 1302 instead of a Mode input pattern, the control bus 3506 will additionally include the LoadTIR signal 1504. If the DUT architecture is the architecture of FIG. 30 or 32, the control bus 3506 will consist of Mode 0-2 inputs 1014, Clock 804, and LoadTIR 1504 signals. If a Mode input 1014 pattern is used to load the TIR 1302, the LoadTIR 1504 signal can be deleted from control bus 3506. Since the tester has an interface to each DUT, all DUTs can be tested simultaneously by the tester operating all the DUT interfaces in parallel. At the end of test, the tester can operate the DUT interfaces to scan out the fail data from the DUT compare circuits 750.

Figure 36:
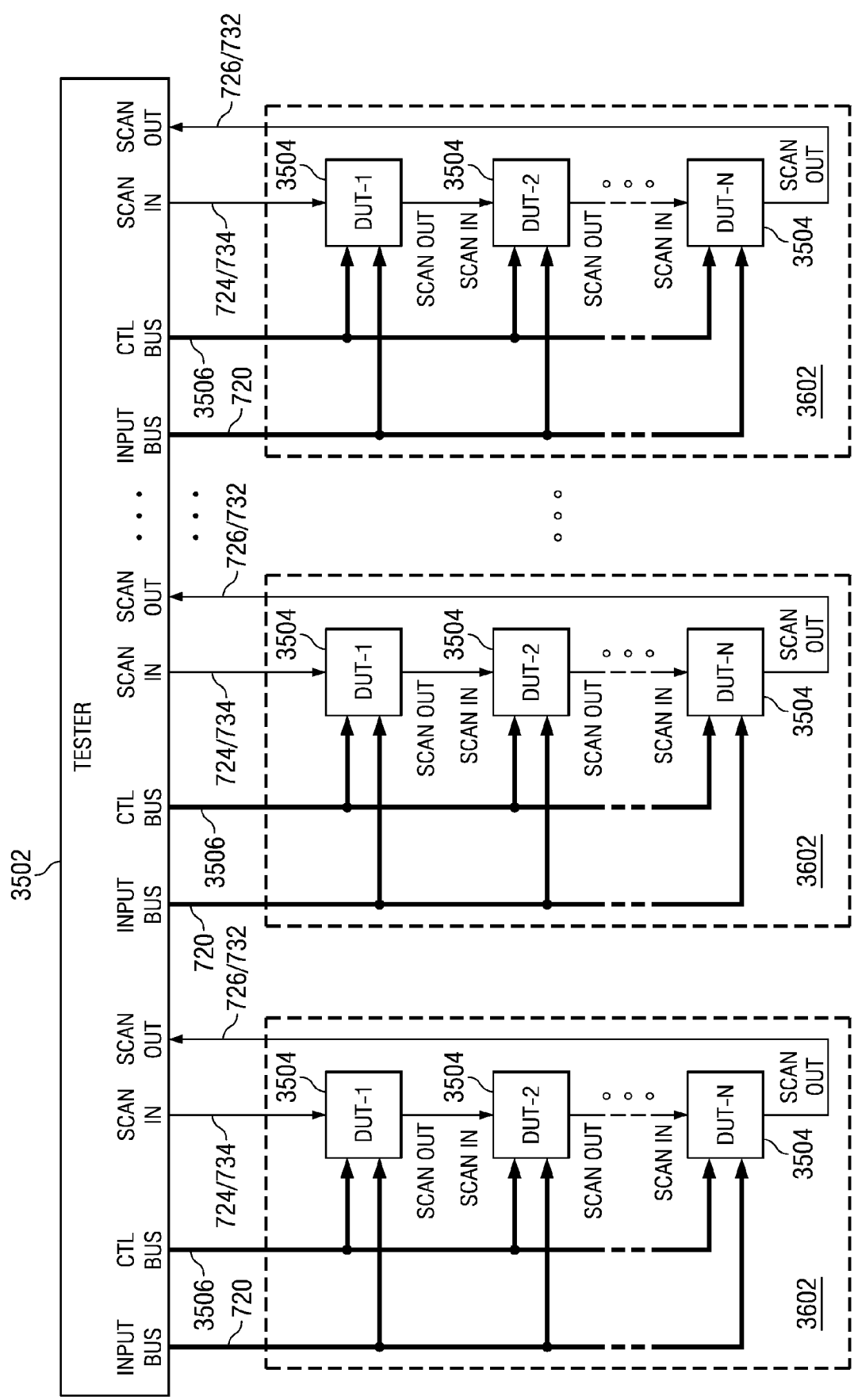
FIG. 36 illustrates a test arrangement between a tester and a plurality of strings of devices.

FIG. 36 illustrates an alternate testing arrangement of the present invention whereby a tester 3502 is interfaced to a plurality of strings 3602 of DUTs 3504. As with FIG. 35, the DUTs 3504 include one of the test architectures described in regard to FIGS. 7, 30, and 32. The tester has an interface to each DUT string 3602 consisting of an input bus 720, a control bus 3506, Scan In 724 or 734, and Scan Out 726 or 732. As with FIG. 35, if the DUTs in the strings 3602 use the architecture of FIG. 7, the control bus 3506 to the strings will consist of Mode 0-2 inputs 1014, Clock 804, and SelectTAM 802 signals. If the LoadTIR signal of FIG. 15 is used to load the TIR 1302 instead of a Mode input pattern, the control bus 3506 to the strings will additionally include the LoadTIR signal 1504. If the DUTs in the strings 3602 use the architecture of FIG. 30 or 32, the control bus 3506 to the strings will consist of Mode 0-2 inputs 1014, Clock 804, and LoadTIR 1504 signals. If a Mode input 1014 pattern is used to load the TIR 1302, the LoadTIR 1504 signal can be deleted from control bus 3506 to the strings. Since the tester has an interface to each DUT string 3602, all DUT strings can be tested simultaneously by the tester operating all the DUT string interfaces in parallel. At the end of test, the tester can operate the DUT string interfaces to scan out the fail data from the compare circuits 750 of each DUT in each DUT string.

In the testing arrangement of FIG. 35 it is seen that if the tester 3502 has M number of DUT interfaces, each interface including input bus 720, control bus 3506, Scan In 724 or 734, and Scan Out 726 or 732, M DUTs may be simultaneously tested. However, in the DUT string testing arrangement of FIG. 36 it is seen that the same tester 3502 with M interfaces can simultaneously test M DUT strings 3602. If each of the M strings 3602 contains N DUTs, the number of DUTs that can be simultaneously tested using the same tester 3502 is M times N. Thus the testing arrangement of FIG. 36 is advantageous over that of FIG. 35 in that it allows for simultaneously testing a larger number of DUTs by placing the DUTs in a string that is interfaced to the tester via one of the tester's M interfaces. While the test architectures and interfaces of the present invention have been designed to allow either the testing arrangement of FIG. 35 or testing arrangement of FIG. 36, the testing arrangement of FIG. 36 may in some cases be preferred since it decreases DUT test time and cost by allowing for more DUTs to be tested simultaneously. The DUTs 3504 of FIGS. 35 and 36 may be die on wafer, singulated die, or packaged integrated circuits.

As seen in FIGS. 35 and 36 a parallel input bus 720 requires N parallel signal connections between the tester and DUTs. In some test arrangements it may be desired to utilize a serial input bus rather than a parallel input bus 720 to decrease the number of signal connections between the tester and DUTs. The following FIGS. 37-45 illustrate how the present invention can use a serial bus instead of a parallel input bus 720 to reduce the number of DUT connections to a tester.

Figure 37:
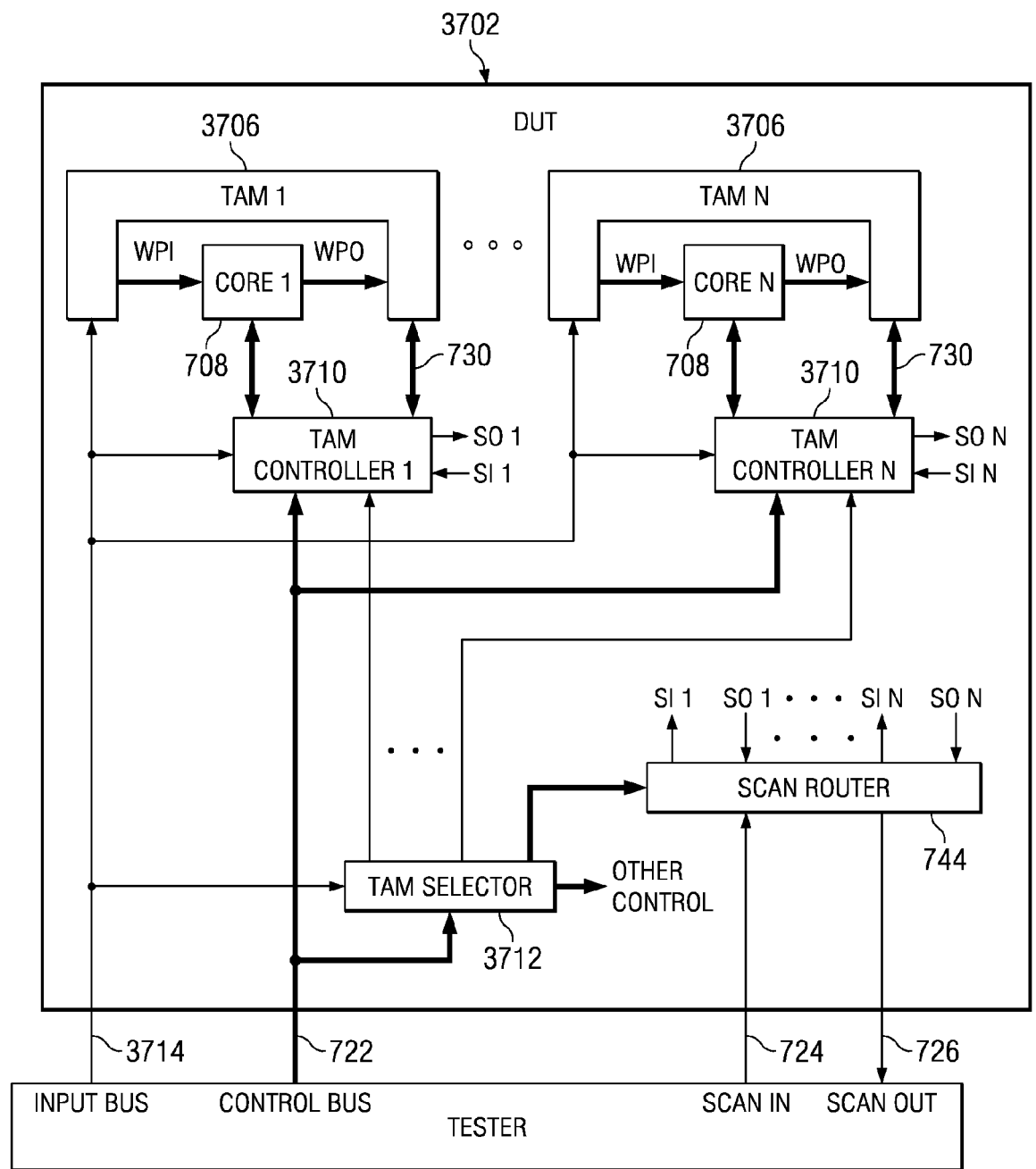
FIG. 37 illustrates a TAM and TAM controller of the present invention interfaced to a serial input bus from a tester.

FIG. 37 illustrates a DUT test architecture having TAMs 3706, TAM controllers 3710, TAM Selector 3712, and Scan Router 744. The DUT test architecture is interfaced to a Tester 3704. The DUT test architecture and interface to the tester is similar to that shown in FIG. 10 with the following exceptions. A serial input bus 3714 is used to input data to the TAMs, 3706 TAM controllers 3710, and TAM Selector 3712 instead of the parallel input bus 720. The data register (3810 of FIG. 38) within the TAM selector 3712 is a serial input data register (i.e. a shift register) instead of the parallel input data register 806/808 of the TAM Selector of FIGS. 8A and 8B. The TIRs (3808 of FIG. 38) within the TAM controllers 3710 are serial input TIRs (i.e. shift registers) instead of the parallel input TIR 1302 shown in TAM controller 706 of FIG. 13. The SDMs (3802 of FIG. 38) of TAMs 3706 are serial input SDMs (i.e. shift registers) instead of the parallel input SDM 742 of FIG. 10. The EDMs (3804 of FIG. 38) of TAMs 3706 are serial input EDMs instead of the parallel input EDM 748 of FIG. 10. The MDMs (3806 of FIG. 38) of TAMs 3706 are serial input MDMs instead of the parallel input MDM 746 of FIG. 10.

Figure 38:
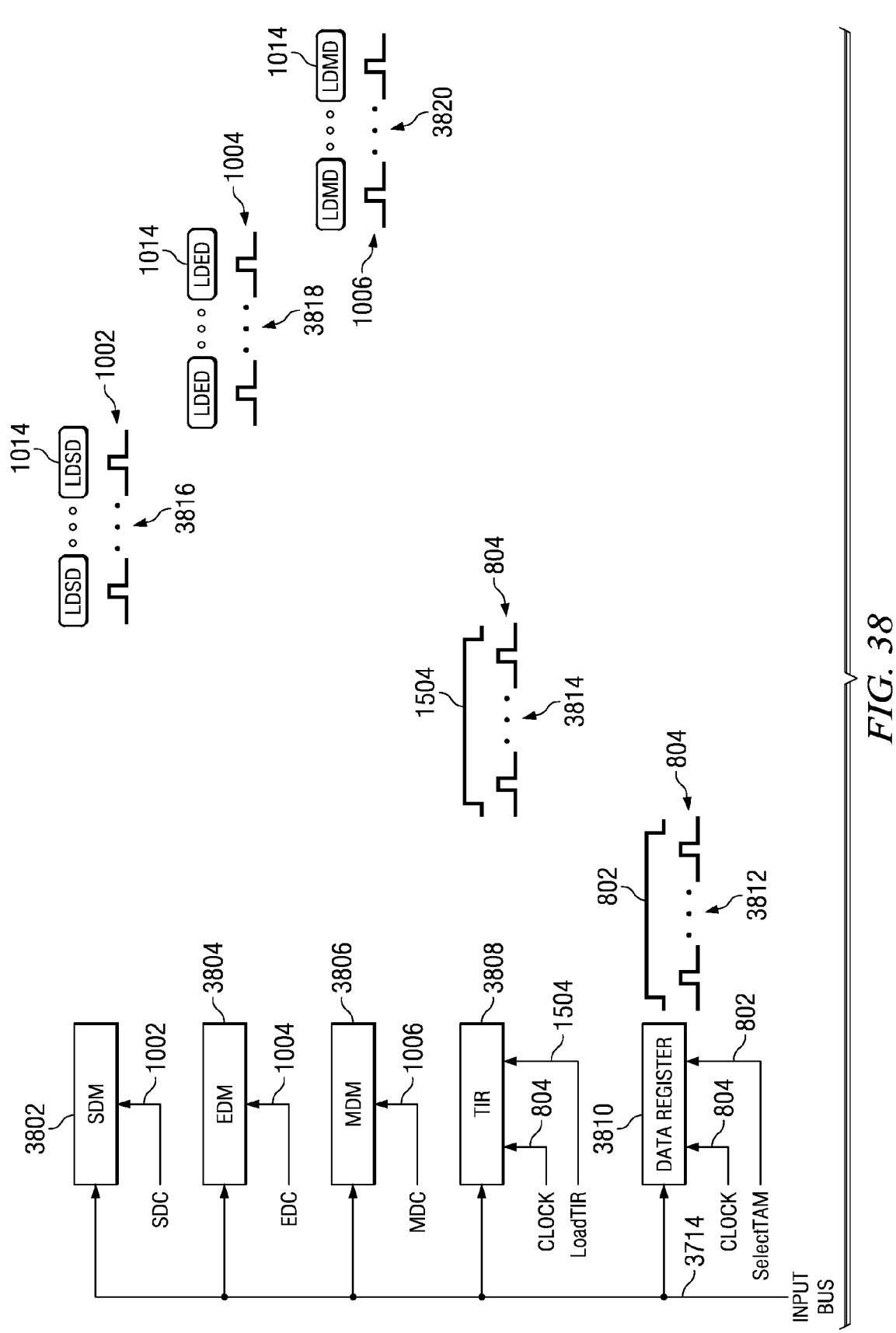
FIG. 38 illustrates the TAM's SDM, EDM, MDM, the TAM controller's TIR, and the TAM Selector's data register interfaced to a single serial input bus according to the present invention.

In FIG. 38 a first example serial input bus 3714 is shown comprising a single serial data input signal. As seen, the serial data input signal of bus 3714 is coupled to the serial inputs of the SDM 3802, EDM 3804, MDM 3806, TIR 3808, and data register 3810. To load a TAM select data pattern into data register 3810, the SelectTAM signal 802 is set high and a number of clock inputs 804 are applied to clock the serial data pattern from the input bus 3714 into the serial input of the data register, as per the timing diagram 3812. To load an instruction into the TIR 3808, the LoadTIR signal 1504 is set high and a number of clock inputs 804 are applied to clock the serial instruction data from the input bus 3714 into the serial input of the TIR, as per timing diagram 3814. To load stimulus data into the SDM 3802, a number of Mode input patterns 1014 (like the single Load Stimulus Data Mode input pattern 2214 of FIG. 22) are input to the TAM controller 3710 to produce the number of SDC outputs 1002 required to clock serial stimulus data from input bus 3714 into the serial input of the SDM, as per timing diagram 3816. To load expected data into the EDM 3804, a number of Mode input patterns 1014 (like the single Load Expected Data Mode input pattern 2216 of FIG. 22) are input to the TAM controller 3710 to produce the number of EDC outputs 1004 required to clock serial expected data from input bus 3714 into the serial input of the EDM, as per timing diagram 3818. To load mask data into the MDM 3806, a number of Mode input patterns 1014 (like the single Load Mask Data Mode input pattern 2218 of FIG. 22) are input to the TAM controller 3710 to produce the number of MDC outputs 1006 required to clock serial mask data from input bus 3714 into the serial input of the MDM, as per timing diagram 3820. Note that each serial operation, i.e. the timing diagrams 3812-3820, occurs at different times since the single input on bus 3714 can only input to one of the shift registers (SDM 3802, EDM 3804, MDM 3806, TIR 3808, and data register 3810) at a time.

The parallel scan test timing of the TAMs 3706 and TAM controllers 3710 of FIG. 37 are similar to that previously described in FIGS. 22 and 23 with the exception that multiple Load Stimulus Data Mode patterns 2214, multiple Expected Data patterns 2216, and multiple Load Mask Data Mode patterns 2218 are required to be executed in the TAMs and TAM controllers of FIG. 37 since the stimulus, expected, and mask data is loaded serially instead of in parallel as in the TAM and TAM controller of FIGS. 10.

Figure 39:
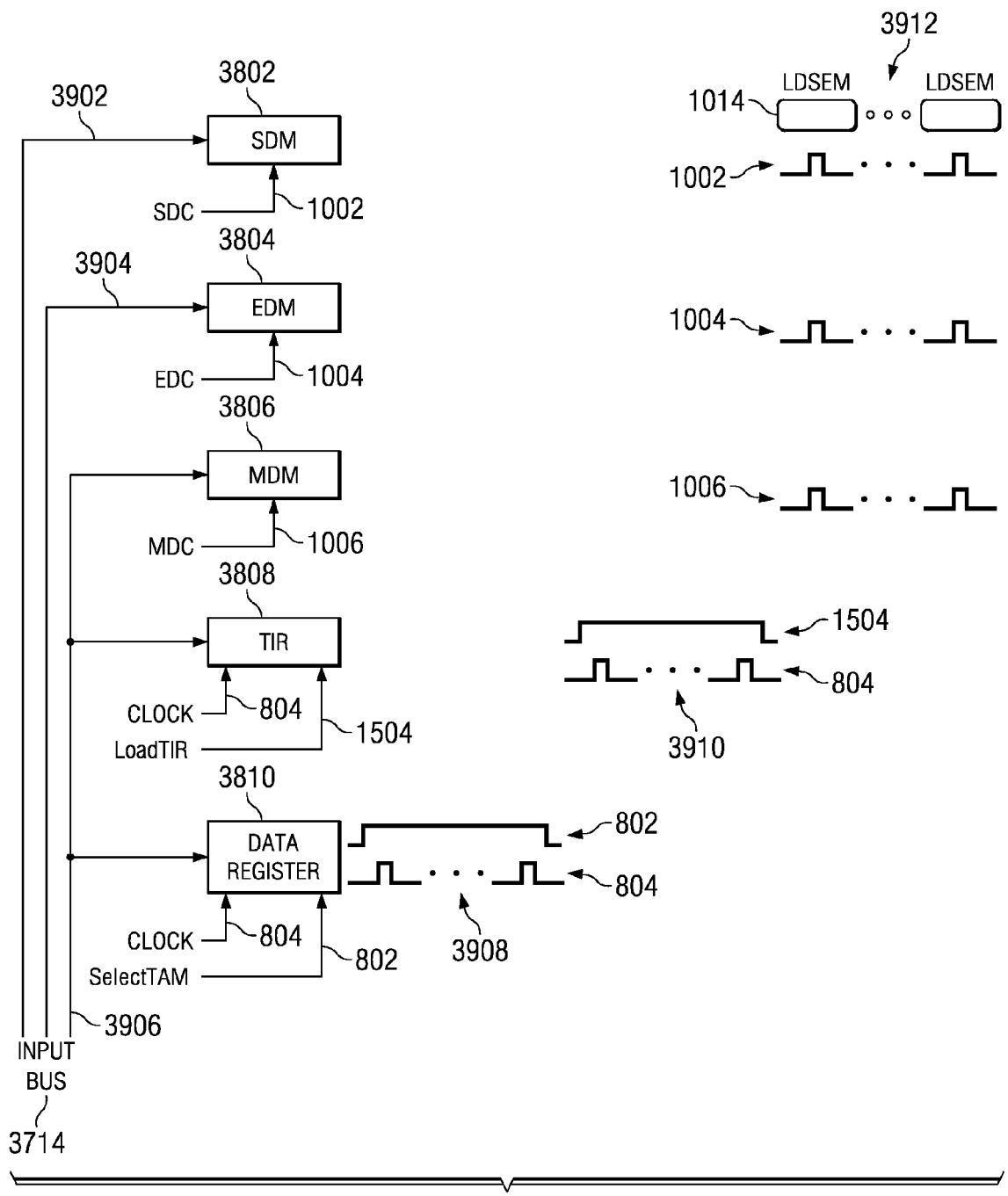
FIG. 39 illustrates the TAM's SDM, EDM, MDM, the TAM controller's TIR, and the TAM Selector's data register interfaced to three separate serial input buses according to the present invention.

In FIG. 39 a second example serial input bus 3714 is shown comprising three serial data input signals 3902-3906. As seen, the serial data input 3902 of bus 3714 is coupled to the serial input of the SDM 3802, the serial data input 3904 of bus 3714 is coupled to EDM 3804, and the serial data input 3906 is coupled to the serial inputs of the MDM 3806, TIR 3808, and data register 3810. To load a TAM select data pattern into data register 3810, the SelectTAM signal 802 is set high and a number of clock inputs 804 are applied to clock the serial data pattern from serial data input 3906 of bus 3714 into the serial input of the data register, as per the timing diagram 3908. To load an instruction into the TIR 3808, the LoadTIR signal 1504 is set high and a number of clock inputs 804 are applied to clock the serial instruction data from serial input 3906 of bus 3714 into the serial input of the TIR, as per timing diagram 3910. To simultaneously load stimulus data into the SDM 3802, expected data into EDM 3804, and mask data into MDM 3806, a number of Mode input patterns 1014 are input to the TAM controller 3710 to produce the number of SDC 1002, EDC 1004, and MDC 1006 outputs required to clock serial stimulus, expected, and mask data from serial data inputs 3902-3906 of bus 3714 into the serial input of the SDM, EDM, and MDM, as per timing diagram 3912. Note that the serial stimulus, expected, and mask data load operations of timing diagram 3912 can occur at the same time since the SDM, EDM, and MDM are each coupled to separate serial data inputs 3902-3906 of bus 3714. An instruction is defined and loaded into to the TIR of TAM controller 3706 to allow the instruction decode circuit 1308 to be programmed to respond to a Mode input pattern to simultaneously output the SDC 1002, EDC 1004, and MDC 1006 signals to SDM, EDM, and MDM as shown in timing diagram 3912. As can be understood, the SDM, EDM, and MDM of FIG. 39 can be loaded in one third the time it takes to load them using the single serial data input bus 3714 of FIG. 38. While the serial inputs to TIR 3808 and data register 3810 are shown coupled to serial data input 3906, any of the serial data inputs 3902-3906 of bus 3714 could be used to load the TIR and data register.

The parallel scan test timing of the TAM 3706 and TAM controller 3710 of FIG. 37 is similar to that previously described for the TAM 704 and TAM controller 706 of FIG. 7 in FIGS. 22 and 23 with the exception that the stimulus, expected, and mask data are loaded into the SDM, EDM, and MDM of TAM 3706 serially using the single serial data input of bus 3714 of FIG. 38 or the three serial data inputs of bus 3714 instead of in parallel using bus 720. Parallel scan testing using the three serial data input bus 3714 of FIG. 39 occurs faster than parallel scan testing using the single serial data input bus 3714 of FIG. 38 since the SDM, EDM, and MDM can all be loaded simultaneously.

While not shown, the TAM and system TAM controller of FIG. 34 can be modified to use SDM 3802, EDM 3804, and TIR 3808 to operate using a one or two serial data input bus 3714. Using a one serial input data bus 3714 allows sequentially loading the SDM 3802 and EDM 3804 as was shown in FIG. 38. Using a two serial data input bus 3714 allows simultaneously loading the SDM 3802 and EDM 3804 as shown in FIG. 39.

Figure 40:
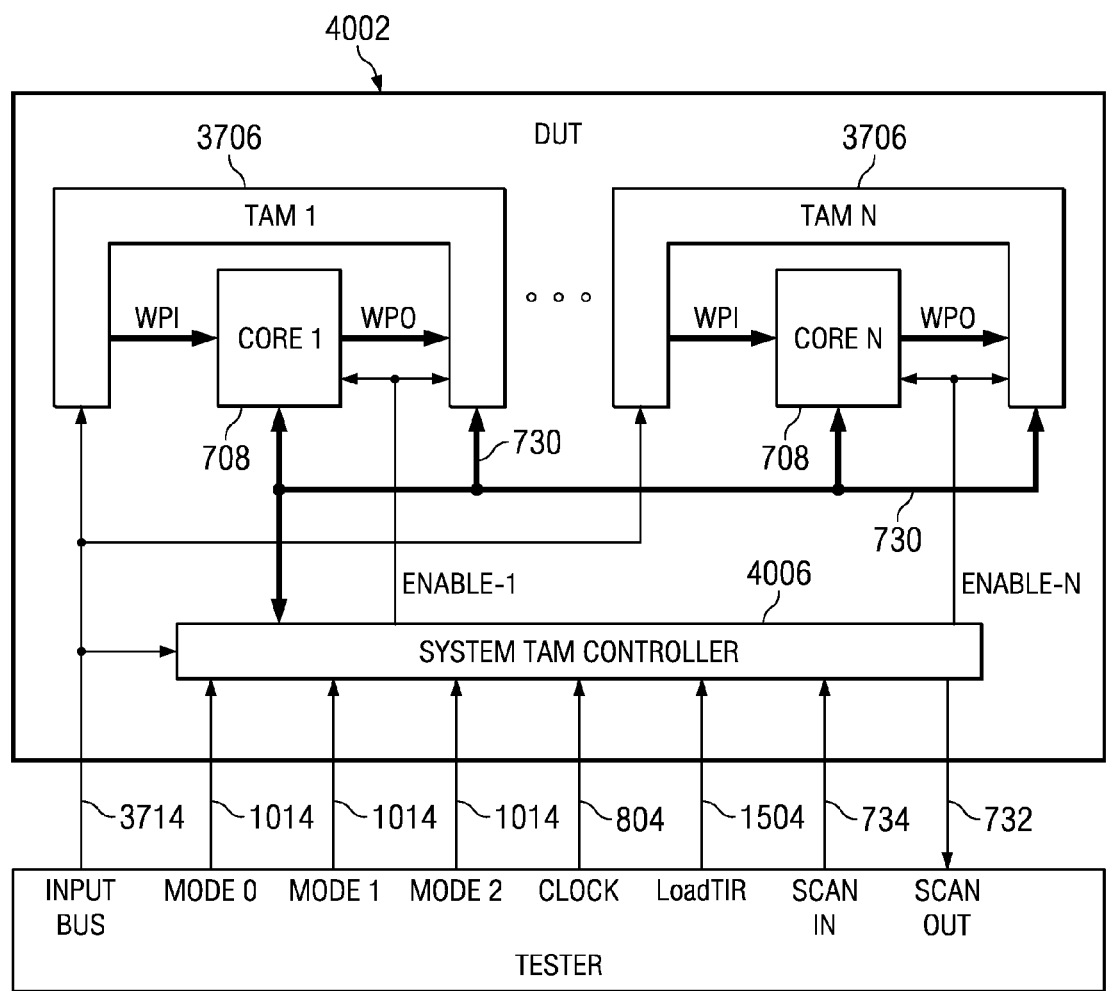
FIG. 40 illustrates a TAM and system TAM controller of the present invention interfaced to a serial input bus from a tester.

FIG. 40 is provided to illustrate how the TAM and system TAM controller within DUT 3202 of FIG. 32 could be modified by the use of SDM 3802, EDM 3804, MDM 3806, and TIR 3808 to operate using a one or three serial data input 3714 instead of the parallel input bus 720. With a one serial input bus 3714, the SDM 3802, EDM 3804, and MDM 3806 of TAM 3706, and the TIR 3808 of system TAM controller 4006 are loaded as described in regard to FIG. 38. With a three serial input bus 3714, the SDM 3802, EDM 3804, and MDM 3806 of TAM 3707, and the TIR 3808 of system TAM 4006 are loaded as described in regard to FIG. 39. While not shown, the TAM and system TAM controller of FIG. 30 can be similarly modified to use SDM 3802, EDM 3804, MDM 3806, and TIR 3808 to operate using a one or three serial data input bus 3714.

There may be times when it is advantageous to be able to test a DUT using either a parallel input bus 720 or a one, two, or three serial input bus. On one hand, if it is desired to reduce test times of the DUT, an N wide parallel input bus 720 can be used to increase the test data bandwidth between the tester and the DUT, according to the present invention. On the other hand, if it is desired to reduce the number of connections between the tester and the DUT, a one, two, or three serial input bus can be used, again according to the present invention. One example of using a one, two, or three serial input bus to test DUTs would be at wafer level testing where a large number of die need to be contacted and tested. Since a large number of die are contacted and tested in parallel, the test can run at a slower rate, due to input data serialization. One example of using the parallel input bus to test DUTs would be at final test where a smaller number of packaged devices need to be contacted and tested. Since a smaller number of devices are contacted and tested, the tester can allocate more of its interface for the parallel bus of each device to allow the test to run at a faster rate, due to input data parallelization.

Figure 41:
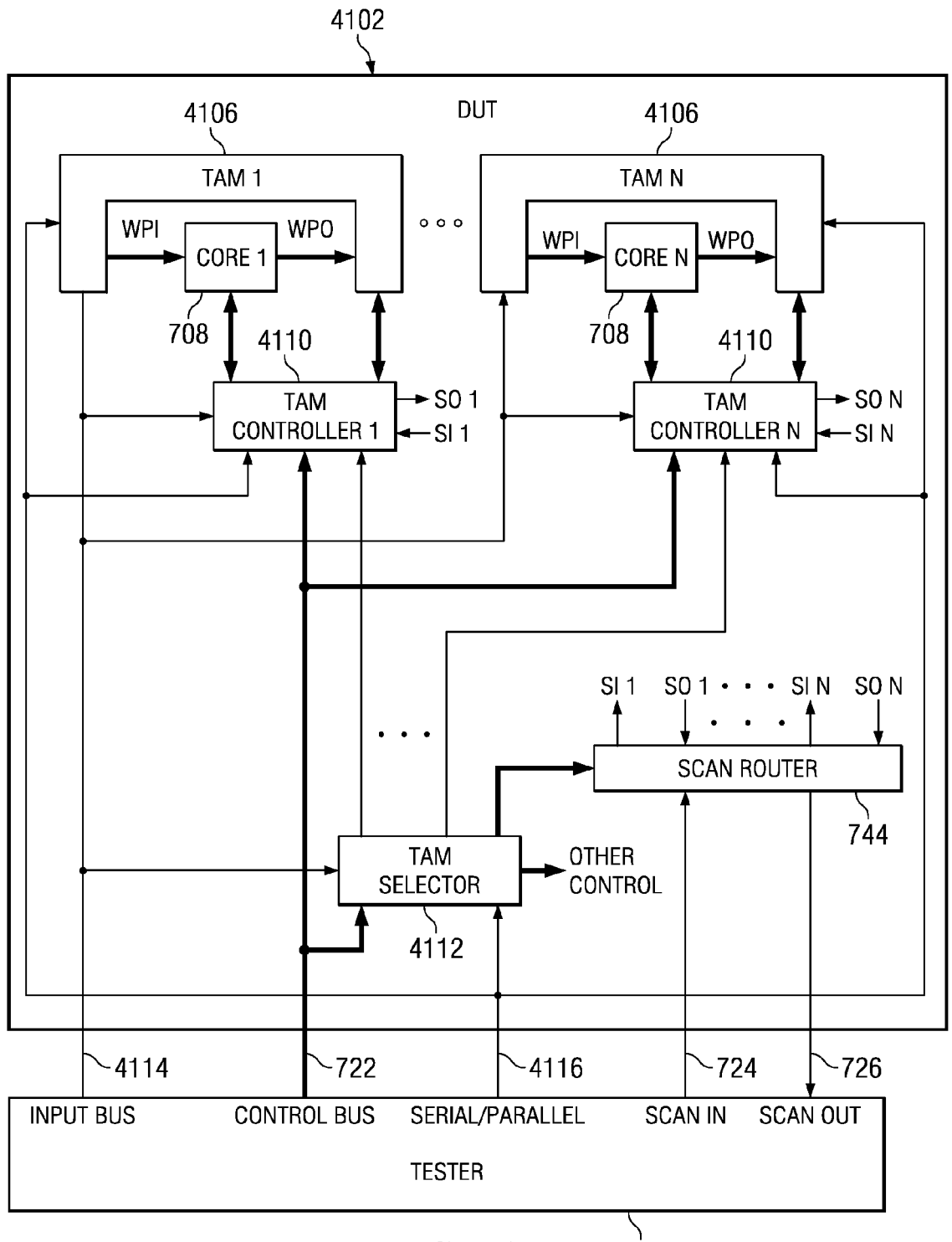
FIG. 41 illustrates a TAM and TAM controller of the present invention selectively interfaced to either a serial or parallel input bus from a tester.

FIG. 41 illustrates a DUT test architecture 4102 having TAMs 4106, TAM controllers 4110. TAM Selector 4112, and Scan Router 744. The DUT test architecture is interfaced to a Tester 4104. The DUT test architecture and interface to the tester is similar to that shown in FIG. 37 with the following exceptions. An input bus 4114 is used to selectively input serial or parallel data to the TAMs 4106, TAM controllers 4110, and TAM Selector 4112. The data register (4402 of FIG. 44) within the TAM selector 4112 is designed to operate as either a serial input register or a parallel input register. The TIRs (4302 of FIG. 43) within the TAM controllers 4110 are designed to operate as either a serial input register or a parallel input register. The SDMs, EDMs, and MDMs (4202 of FIG. 42) of TAMs 4106 are designed to operate as either a serial input register or a parallel input register. A Serial/Parallel select signal 4116 is added to the DUT test interface to allow a tester to control whether the SDMs, EDMs, MDMs 4202, TIRs 4302, and data register 4402 input data serially or in parallel from input bus 4114.

Figure 42:
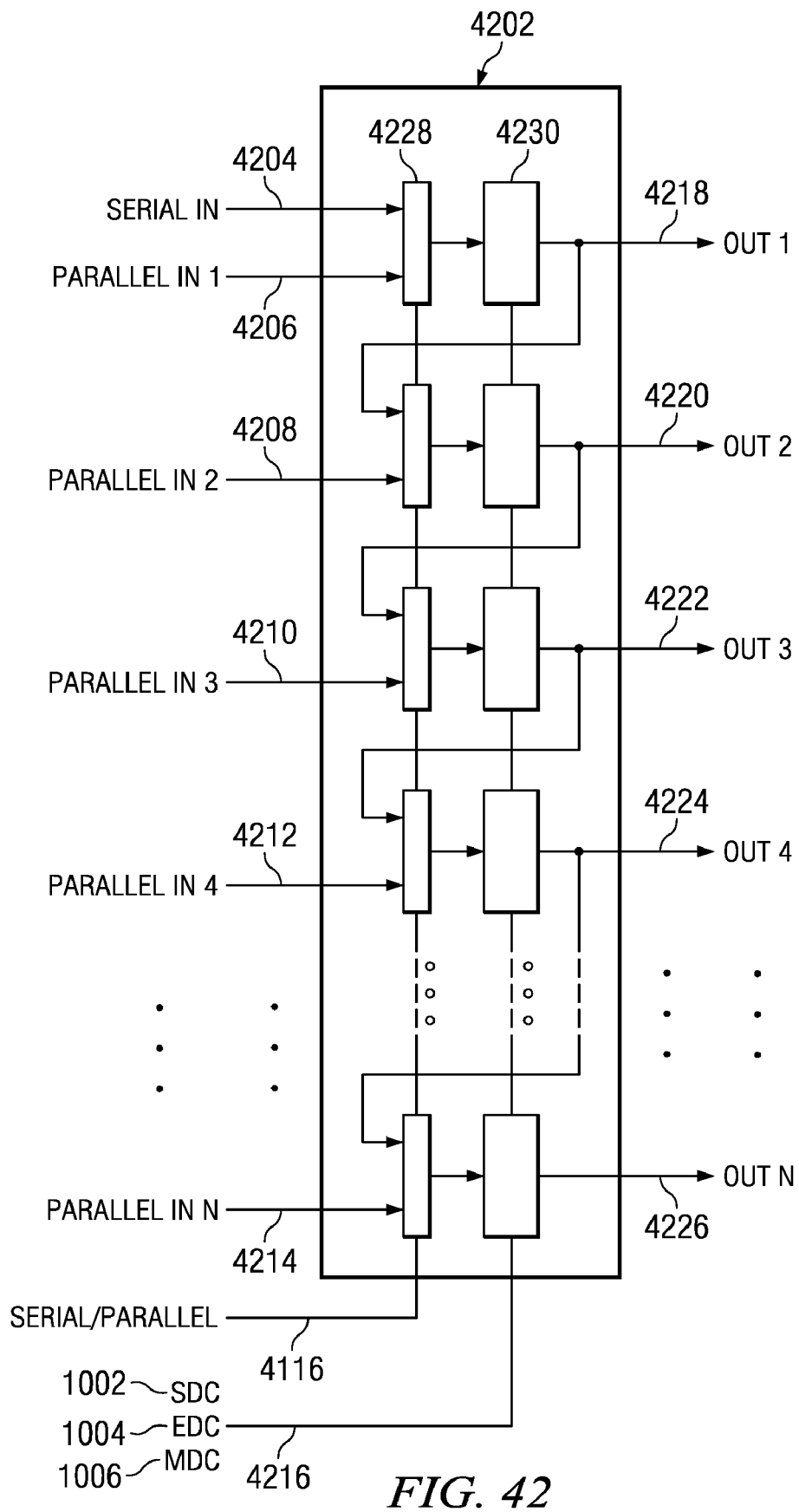
FIG. 42 illustrates an example design for a selectable serial or parallel input SDM, EDM, or MDM circuit.

FIG. 42 illustrates an example circuit design for the TAM's SDM, EDM and MDM circuits 4202 of FIG. 41. Circuit 4202 has a serial input 4204, N parallel inputs 4206-4214, N parallel outputs 4218-4226, Serial/Parallel input 4116, and a clock input 4216. If circuit 4202 is a SDM the clock input 4216 is coupled to SDC 1002. If circuit 4202 is an EDM the clock input 4216 is coupled to EDC 1004. If the circuit 4202 is a MDM the clock input 4216 is coupled to MDC 1006. Within circuit 4202 there are N multiplexer 4228 and flip flop 4230 pairs that form an N bit register. When the Serial/Parallel input 4116 is high, the multiplexers 4228 are set to allow data from the serial input 4204 to be shifted through the flip flops 4230 to serially load the register. When the Serial/Parallel input is low, the multiplexers 4228 are set to allow data from the parallel inputs 4206-4414 to load the flips flops 4230 of the register in parallel. When using a parallel input bus 4114, N inputs will be connected to the parallel inputs 4206-4214 of an SDM, EDM, and MDM circuit 4202 to sequentially load the SDM, EDM, and MDM circuits in parallel as described in FIG. 10. When using a one serial input bus 4114, a single serial input from bus 4114 will be connected to serial inputs 4204 of an SDM, EDM, and MDM circuit 4202 to sequentially load the SDM, EDM, and MDM circuits serially as described in FIG. 38. When using a three serial input bus 4114, a first serial input from input bus 4114 will be connected to the serial input 4204 of an SDM 4202, a second serial input from input bus 4114 will be connected to the serial input 4204 of an EDM 4202, and a third serial input from input bus 4114 will be connected to the serial input 4204 of an MDM 4202 to simultaneously load the SDM, EDM, and MDM circuits serially as described in FIG. 39.

Figure 43:
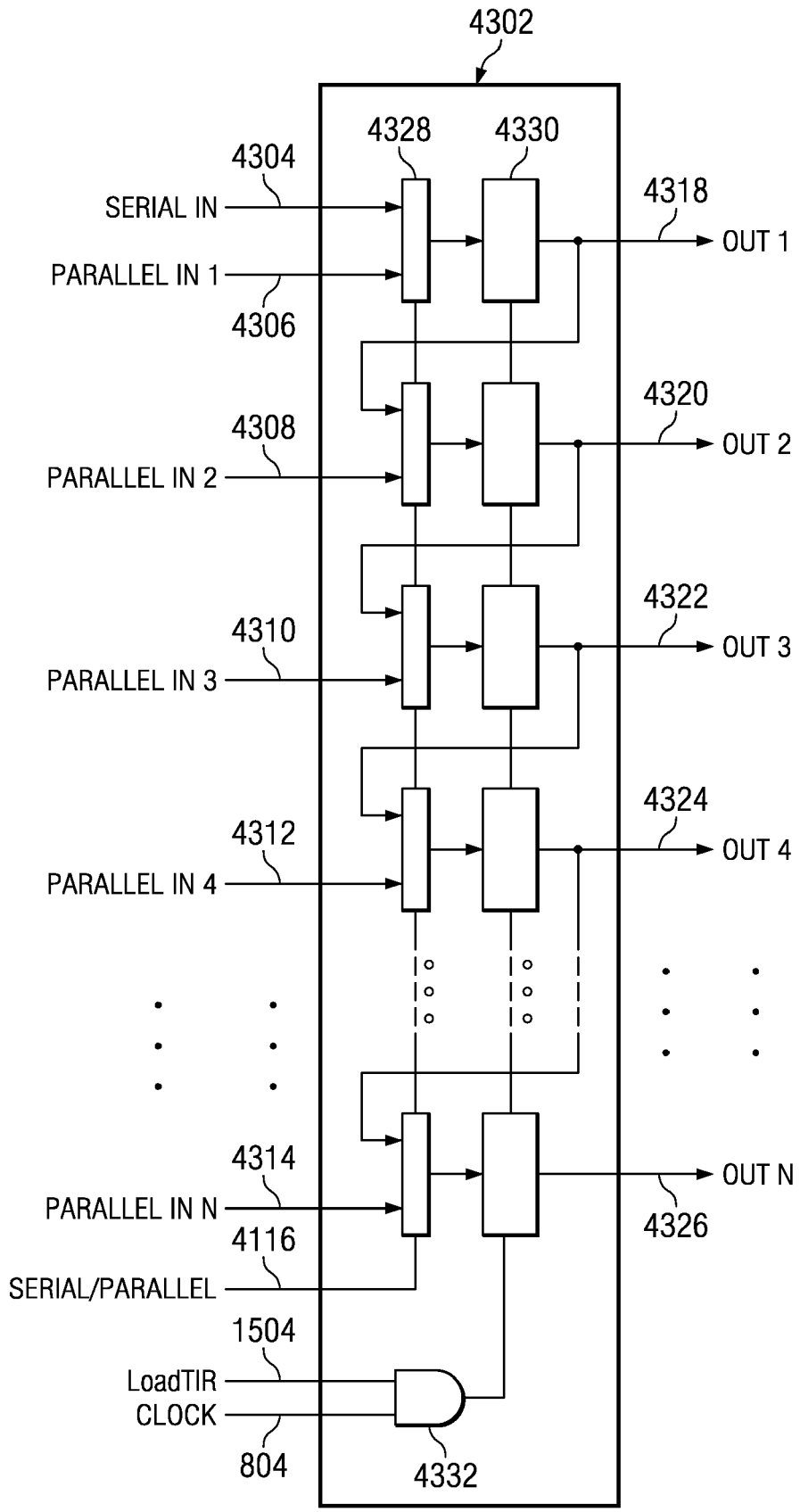
FIG. 43 illustrates an example design for a selectable serial or parallel input TIR circuit.

FIG. 43 illustrates an example circuit design 4302 for the TAM controller's TIR of FIG. 41. The circuit has a serial input 4304, N parallel inputs 4306-4314, N parallel outputs 4318-4326, Serial/Parallel input 4116, LoadTIR input 1504 of FIG. 15, and the clock input 804. Within the circuit there are N multiplexer 4328 and flip flop 4330 pairs that form an N bit register. When LoadTIR is high, gate 4332 allows the clock input 804 to clock the flip flops 4330. When the Serial/Parallel input is high, the multiplexers 4328 are set to allow data from the serial input 4304 to be shifted through the flip flops 4330 to serially load the register. When the Serial/Parallel input is low, the multiplexers 4328 are set to allow data from the parallel inputs 4306-4314 to load the flips flops 4330 of the register in parallel. When using a serial input bus, a serial input from bus 4114 of FIG. 41 will be connected to serial input 4304 of the TIR to serially load the TIR as described in FIGS. 38 and 39. When using a parallel input bus, N inputs from bus 4114 of FIG. 41 will be connected to the parallel inputs 4306-4314 of the TIR to parallel load the TIR as described in FIG. 15.

Figure 44:
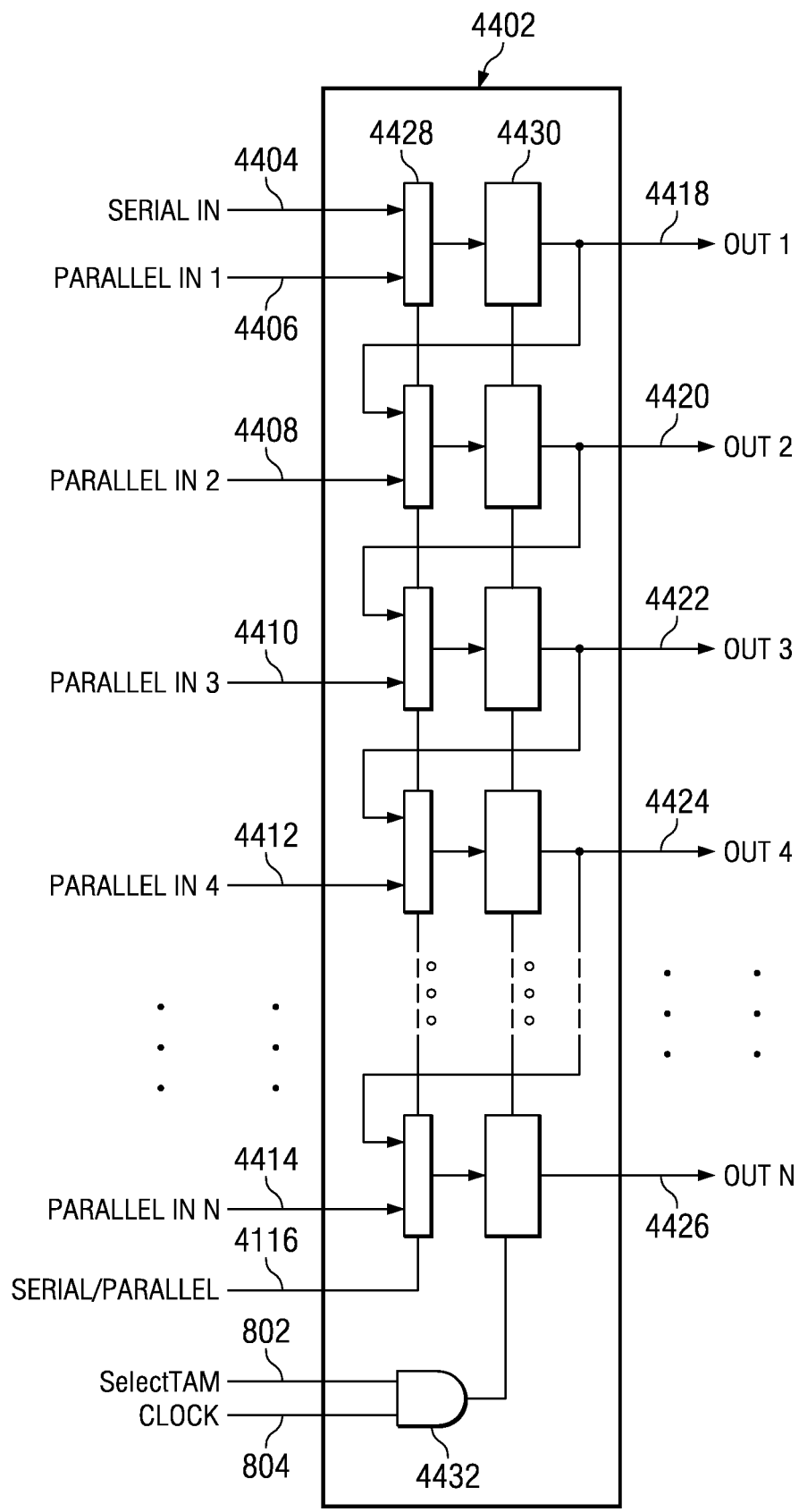
FIG. 44 illustrates an example design for a selectable serial or parallel input TAM Selector data register circuit.

FIG. 44 illustrates an example circuit design 4402 for the TAM Selector's data register of FIG. 41. The circuit has a serial input 4404, N parallel inputs 4406-4414, N parallel outputs 4418-4426, Serial/Parallel input 4116, SelectTAM input 802 of FIGS. 13 and 15, and the clock input 804. Within the circuit there are N multiplexer 4428 and flip flop 4430 pairs that form an N bit register. When SelectTAM is high, gate 4432 allows the clock input 804 to clock the flip flops 4430. When the Serial/Parallel input is high, the multiplexers 4428 are set to allow data from the serial input 4404 to be shifted through the flip flops 4430 to serially load the register. When the Serial/Parallel input is low, the multiplexers 4428 are set to allow data from the parallel inputs 4406-4414 to load the flips flops 4430 of the register in parallel. When using a serial input bus, a serial input from bus 4114 of FIG. 41 will be connected to serial input 4404 of the data register to serially load the data register as described in FIGS. 38 and 39. When using a parallel input bus, N inputs from bus 4114 of FIG. 41 will be connected to the parallel inputs 4406-4414 of the data register to parallel load the data register as described in FIGS. 8A and 8B.

Figure 45:
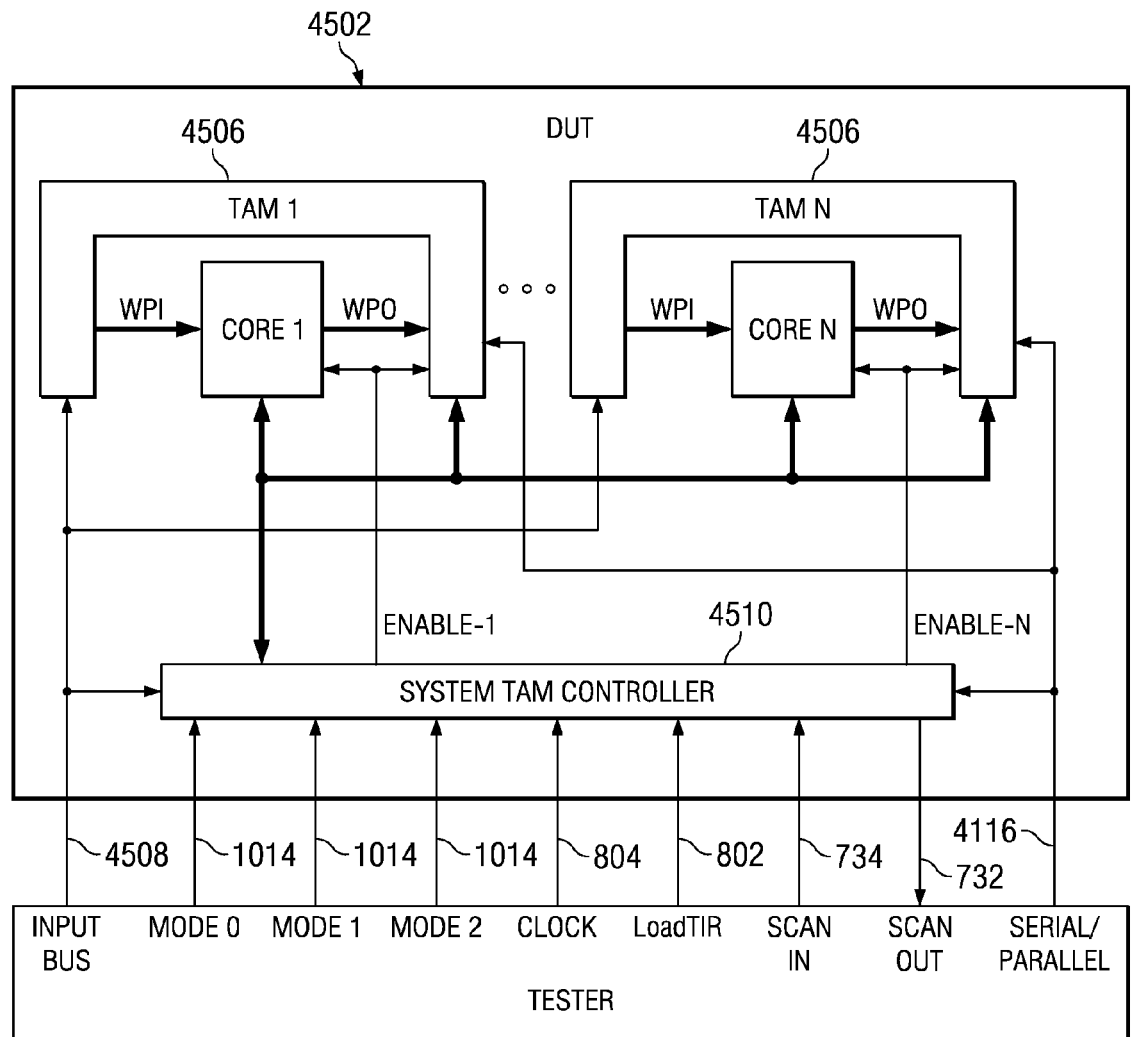
FIG. 45 illustrates a TAM and system TAM controller of the present invention selectively interfaced to either a serial or parallel input bus from a tester.

FIG. 45 is provided to illustrate how the TAMs 3706 and system TAM controller 4006 within DUT 4002 of FIG. 40 could be modified to use either a serial or parallel input bus 4508. The modifications include; (1) using SDM, EDM, and MDM circuits 4202 of FIG. 42 in TAMs 4506, using TIR circuit 4302 of FIG. 43 in system TAM controller 4510, and (3) providing the Serial/Parallel input 4116 for selectively operating the SDM, EDM, MDM, and TIR circuits using either a serial data input bus 4508 or a parallel data input bus 4508. With a one serial input bus 4508, the SDM, EDM, and MDM circuits 4202 of TAM 4506, and the TIR circuit 4302 of system TAM controller 4510 are serially loaded as described in regard to FIG. 38. With a three serial input bus 4508, the SDM, EDM, and MDM circuits 4202 of TAM 4506, and the TIR circuit 4302 of system TAM 4510 are serially loaded as described in regard to FIG. 39. With a parallel bus 4508, the SDM, EDM, MDM circuits 4202 of TAM 4506, and the TIR circuit 4302 of system TAM 4510 are parallel loaded as described in regard to FIGS. 10 and 15. While not shown, the TAM 3006 and system TAM controller 3008 of FIG. 30 can be similarly modified to use either a serial or parallel data input on bus 4508.

As seen in FIGS. 7, 30, 32, 35, and 36, when a parallel input bus is used between a DUT and a Tester the total number of signals in the test interface is the sum of the parallel input bus signals plus the control and scan in and scan out signals. For example, if an 8-bit parallel input bus is used in the test interface of FIG. 32, the total number of signals in the test interface will be 15 signals, i.e. 8 signals for the input bus 720 plus 7 signals for the Mode 0-2 1014, Clock 804, LoadTIR 1504, Scan In 734, and Scan Out 732 signals. While this is not an extreme number of test interface signals, it is beneficial to reduce the number of test interface signals if the reduction does not increase the DUT test time. The following description describes a way to reduce the number of test interface signals between a DUT and tester using a double data rate (DDR) interfacing technique which does not increase test time.

Figure 46:
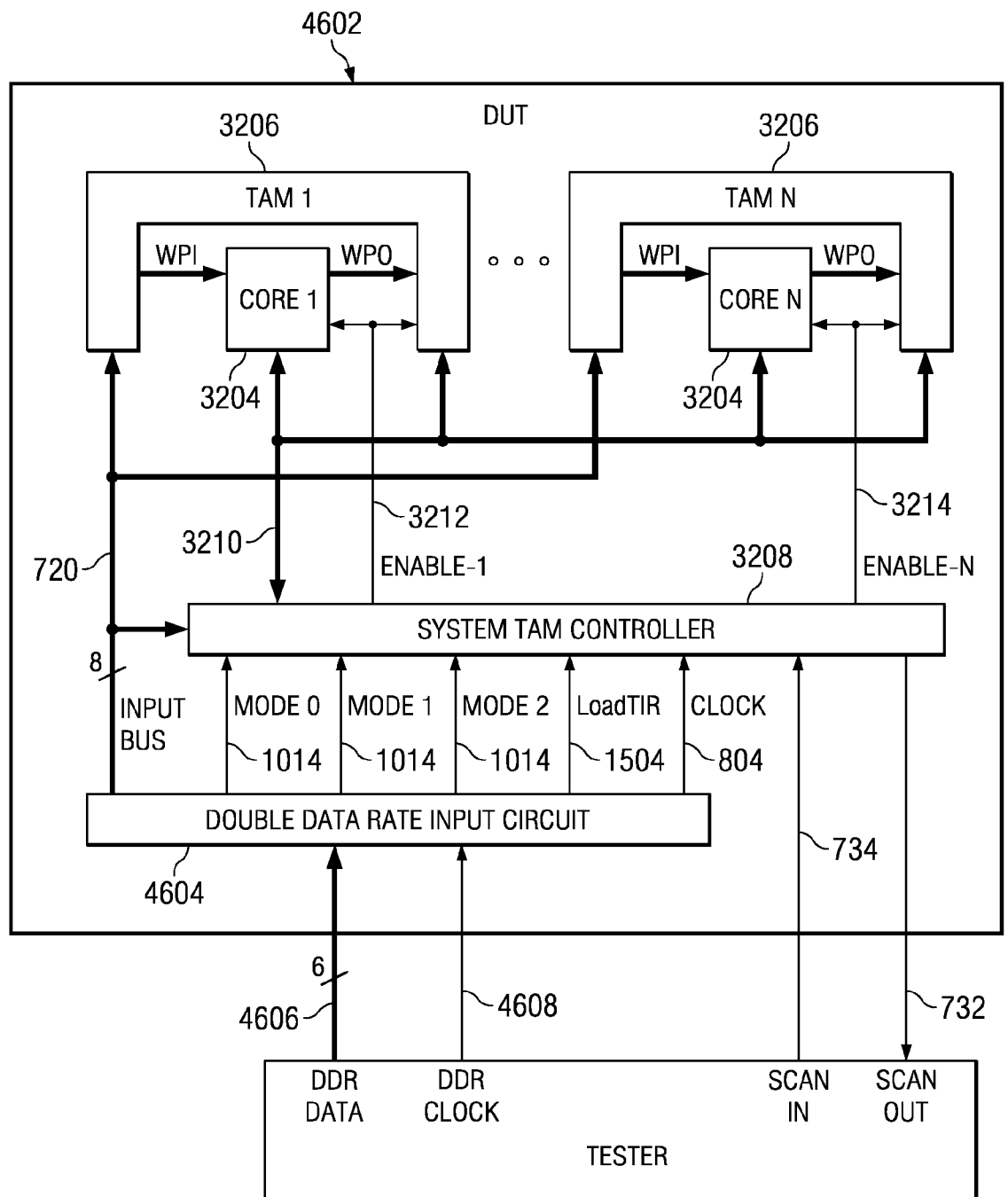
FIG. 46 illustrates TAMs and system TAM controller of the present invention interfaced to a tester using a double data rate (DDR) input circuit.

FIG. 46 illustrates the test architecture of FIG. 32 modified to include a double data rate (DDR) input circuit 4604. As seen, the DDR input circuit has outputs (8-bit Input But 720, Mode 0-2 1014, LoadTIR 1504, and Clock 804) that interface to the TAMs 3206 and system TAM controller 3208 and inputs (6-bit DDR Data 4606 and DDR Clock 4608) that interface to the tester 4610. The operation of the TAMs 3206 and system TAM controller in response to the outputs from the DDR input circuit is the same as previously described in FIG. 32. The only differences between the test architecture of FIG. 32 and the one in FIG. 46 are; (1) the DDR input circuit is used to interface the tester to the TAMs and system TAM controller, and (2) the tester is designed to output a 6-bit DDR data bus 4606 and a DDR clock 4608 instead of the input bus 720, Mode 0-3 1014, LoadTIR 1504, and Clock 804 signals of FIG. 32. As can be seen, using the DDR input circuit of FIG. 46 the interface between the tester and DUT is reduced to only 9 signals (6-bit DDR data 4606, DDR clock 4608, Scan In 734 and Scan Out 732), as opposed to the above mentioned 15 signals for an 8-bit input bus 720 of FIG. 32.

Figure 47:
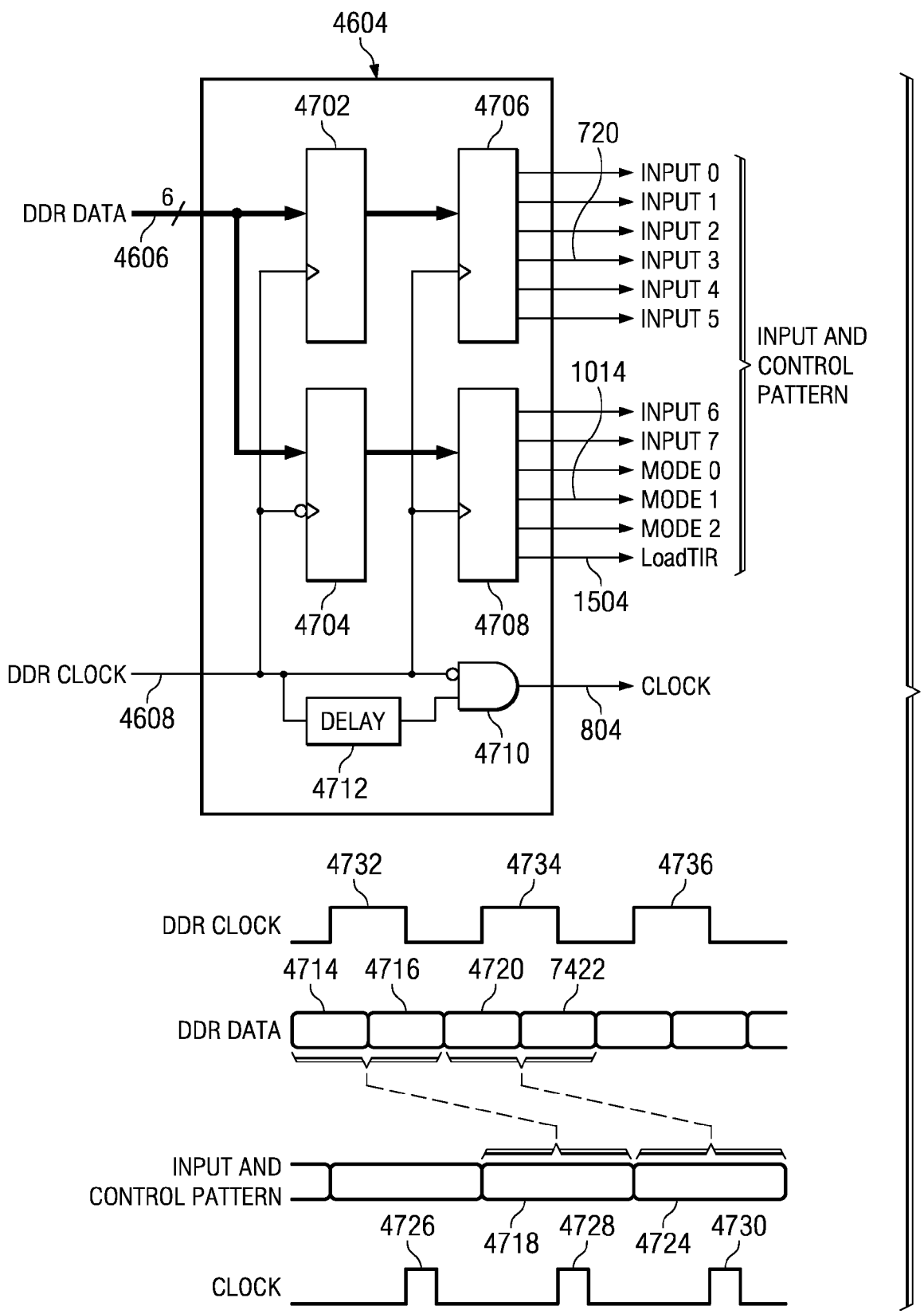
FIG. 47 illustrates an example design for the DDR input circuit of FIG. 46.

FIG. 47 illustrates an example implementation of the DDR input circuit 4604 of FIG. 46. The DDR input circuit inputs the DDR data bus 4606 and DDR clock 4608, and outputs the 8-bit input bus signals (Input 0-7) 720, Mode 0-2 signals 1014, and the LoadTIR signal 1504. The DDR data bus is input to 6-bit registers 4702 and 4704. The outputs of the 6-bit registers 4702 and 4704 are input to 6-bit registers 4706 and 4708, respectively. The outputs of the 6-bit registers 4706 and 4708 provide the 8-bit input bus signals 720, the Modes 0-2 signals 1014, and the LoadTIR signal 1504 shown in FIG. 46. The DDR clock 4608 is input to the non-inverting clock inputs of 6-bit registers 4702, 4706, and 4708 and to the inverting clock input of 6-bit register 4704. The DDR clock is also input to an inverted input of And gate 4710 and to a delay circuit 4712. The output of the delay circuit 4712 is input to a non-inverting input of And gate 4710. The output of the And gate 4710 provides the Clock signal 804 shown in FIG. 46.

The operation of the DDR input circuit is best described using the timing diagram of FIG. 47. The timing diagram shows the DDR clock and DDR data bus inputs from the tester 4610 and the input bus signals 720, Mode 0-2 signals 1014, and LoadTIR signal 1504, indicated as the "Input & Control Pattern", and Clock 804 outputs from the DDR input circuit. As seen in the timing diagram, on the rising edge of DDR clock 4732 the 6-bit data output 4714 from tester 4610 is clocked into register 4702, and on the falling edge of DDR clock 4732 the 6-bit data output 4716 from tester 4610 is clocked into register 4704. The 6-bit data in registers 4702 and 4704 is clocked into registers 4706 and 4708 on the rising edge of DDR clock 4734 and output as "Input and Control Pattern" 4718. Subsequently, the 6-bit data 4720 and 4722 clocked into registers 4702 and 4704 on rising and falling edges of DDR clock 4734 is clocked into registers 4706 and 4708 on the rising edge of DDR clock 4736. This process of inputting 6-bit data from the tester to registers 4702 and 4704 on the rising and falling edges of a DDR clock, respectively, followed by transferring the data in registers 4702 and 4704 to registers 4706 and 4708 on the next rising edge of a DDR clock continues for the duration of the test operation.

As seen in the timing diagram, a Clock 804 output is produced for each "Input & Control Pattern" output from the DDR input circuit 4604. This Clock output is produced by a clock generation circuit which, in this example, comprises an And gate 4710 and a delay circuit 4712. The clock generation circuit produces a Clock 804 output on each falling edge of the DDR clock 4608. The duration of the Clock 804 output can be adjusted by the length of time it takes for the DDR clock 4608 to propagate through the delay circuit 4712 of the clock generation circuit. Producing the Clock 804 on the falling edge of DDR clock 4608 mimics the clock timing of the input bus 720, Mode 0-2 signals 1014, and LoadTIR signal of the timing diagrams in FIGS. 17, 18, 19, 20, 21, 22, 23, 25 and 26, i.e. the Clock 804 occurs when the input bus 720, Mode 0-2 signals 1014, and LoadTIR signal 1504 are in a stable state.

As mentioned the use of the DDR input circuit 4604 to reduce the number of test interface signals between the tester and DUT does not increase the test time of the DUT. For example, if the Clock 804 signal of FIG. 32 and the DDR clock 4608 of FIG. 46 both operate at 200 MHz, the TAMs 3206 and system TAM controller 3208 of FIGS. 32 and 46 will receive input bus 720 and Mode 0-2 and LoadTIR 1504 signal patterns at the same clock rate, i.e. 200 MHz. The reason the TAM and system TAM controller input bus and control pattern rate of FIG. 46 is the same as the TAM and system TAM controller input bus and control pattern rate of FIG. 46 when the frequency of the Clock 804 of FIG. 32 and DDR clock 4608 are the same is because the DDR input circuit 4604 of FIG. 46 inputs data from the DDR data bus 4606 on both the rising and falling edges of each DDR clock 4608. Inputting data from the DDR data bus on both edges of the DDR clock doubles the amount of data to the DDR circuit, which allows the "Input & Control Pattern" output rate from the DDR input circuit of FIG. 46 to match the input bus and control pattern rate from the tester of FIG. 32.

Figure 48:
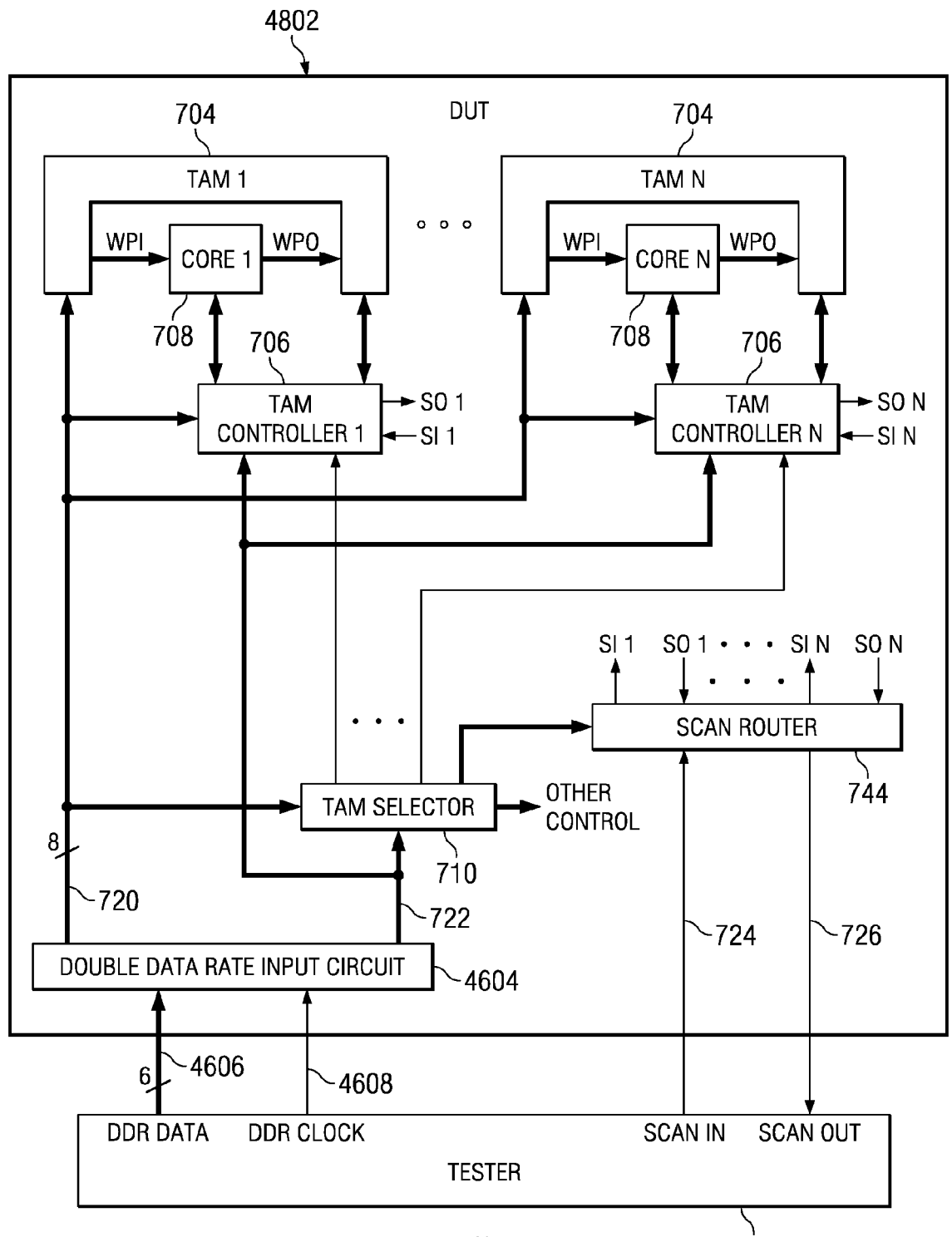
FIG. 48 illustrates a TAM Selector, TAM controllers and TAMs of the present invention interfaced to a tester using a double data rate (DDR) input circuit.
Figure 49:
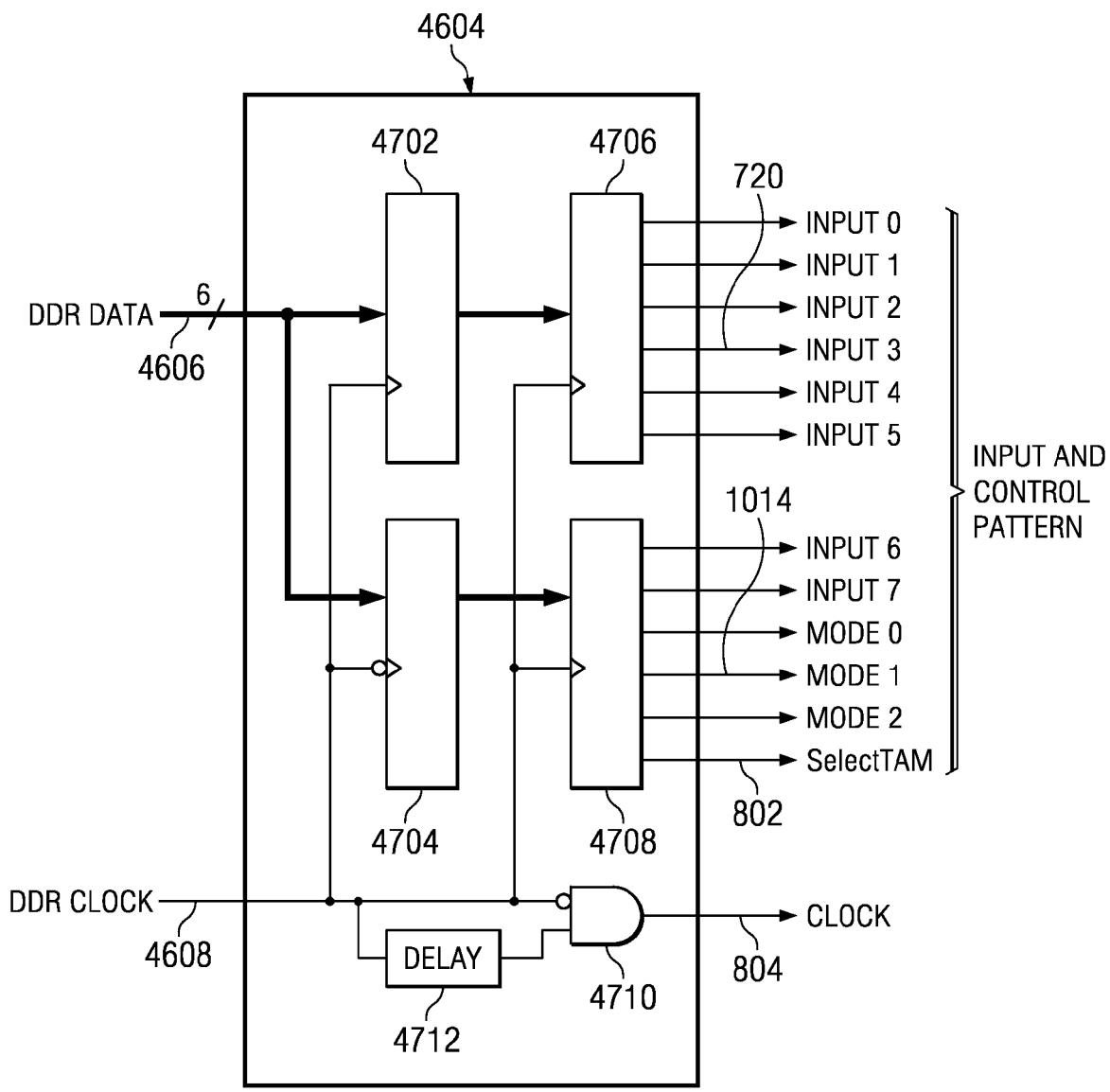
FIG. 49 illustrates an example design for the DDR input circuit of FIG. 48

FIG. 48 is provided to illustrate that the DDR input circuit 4604 can also be used with the test architecture of FIG. 7. As seen the DDR input circuit 4604 inputs DDR data 4606 and DDR clock 4608 signals from tester 4610 and outputs an 8-bit input bus 722 and control bus 722 to the TAM Selector 710, TAM controllers 706, and TAMs 704. The TAM selector, TAM controllers, and TAMs respond to the input bus 722 and control bus 722 as described in regard to FIG. 7 and other related figures. As seen in FIG. 49, the only difference in the DDR input circuit 4604 of FIG. 48 and the DDR input circuit 4604 of FIG. 46 is that the DDR input circuit of FIG. 49 outputs the SelectTAM 802 signal, as described in regard to FIG. 10, instead of the LoadTIR 1504 signal of FIG. 47.

While the FIGS. 46, 47, 48, and 49 examples of using DDR input circuits have used 8-bit input busses 720, input buses of any width may be used. For example, a 16-bit wide input bus 720 may be used or a 4-bit input bus 720 may be used. If a 16-bit wide input bus 720 is used, the DDR data bus width from the tester would increase to 10-bits to allow providing a 20-bit wide "Input & Control Pattern" bus output from the DDR input circuit, i.e. 16 input bus signals plus the Mode 0-2 and LoadTIR 1504 or SelectTAM 802 signals. If a 4-bit wide input bus 720 is used, the DDR data bus width from the tester would decrease to 4-bits to allow providing an 8-bit wide "Input & Control Pattern" bus output from the DDR input circuit, i.e. 4 input bus signals plus the Mode 0-2 and LoadTIR 1504 or SelectTAM 802 signals.

While the test architectures of FIGS. 7 and 32 have been shown modified to use the DDR input circuit, as per FIGS. 46 and 48 respectively, the other test architectures shown and described herein can be similarly modified to use the DDR input circuit. Also if a Mode 0-2 pattern is used to provide the Load enable signal to TIR 1302 instead of using the LoadTIR signal 1504, as shown and described in FIG. 13, the LoadTIR signal 1504 can be removed from the "Input & Control Pattern" output of the DDR input circuit of FIG. 47.

Figure 50:
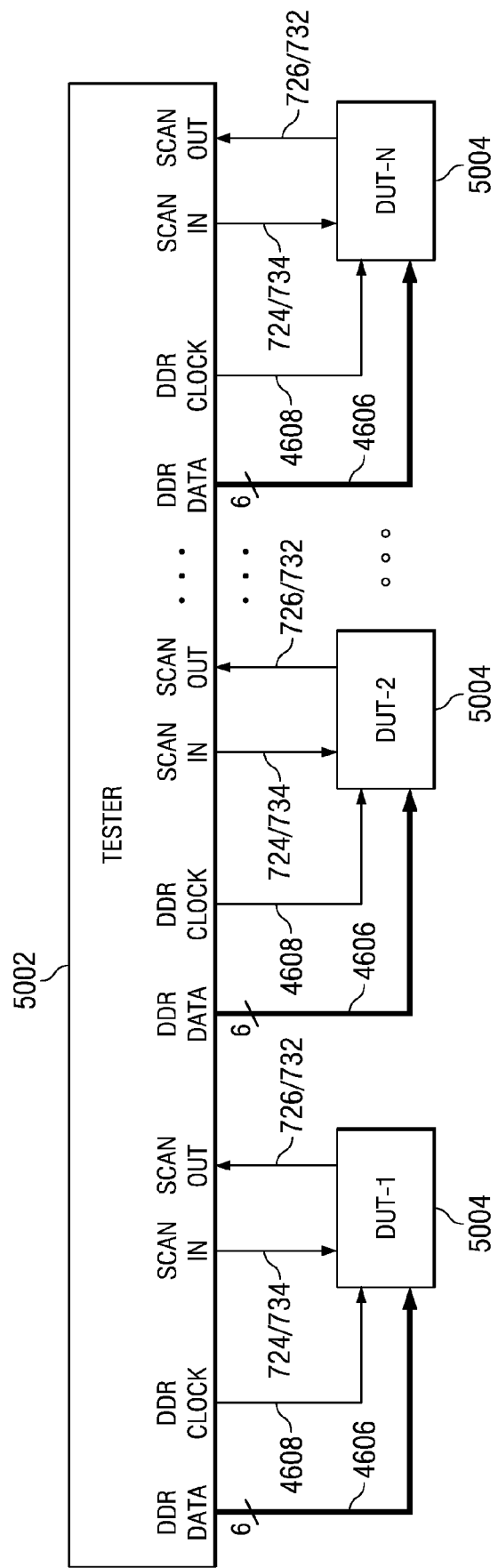
FIG. 50 illustrates a test arrangement between a tester and a plurality of devices using a double data rate (DDR) test interface.

FIG. 50 is provided to illustrate a tester 5002 interfacing to multiple DUTs 5004 using the reduced test interface of FIGS. 46-49, each DUT test interface consisting of 6-bit DDR data bus signals 4606, a DDR clock signal 4608, a Scan In signal 724 or 734 and a Scan Out signal 726 or 732 signal. The operation of the tester and DUTs of FIG. 50 is the same as described in FIG. 35 with the exception that the tester interfaces with the DUTs using the reduced tests interface signals described in FIGS. 46-49.

Figure 51:
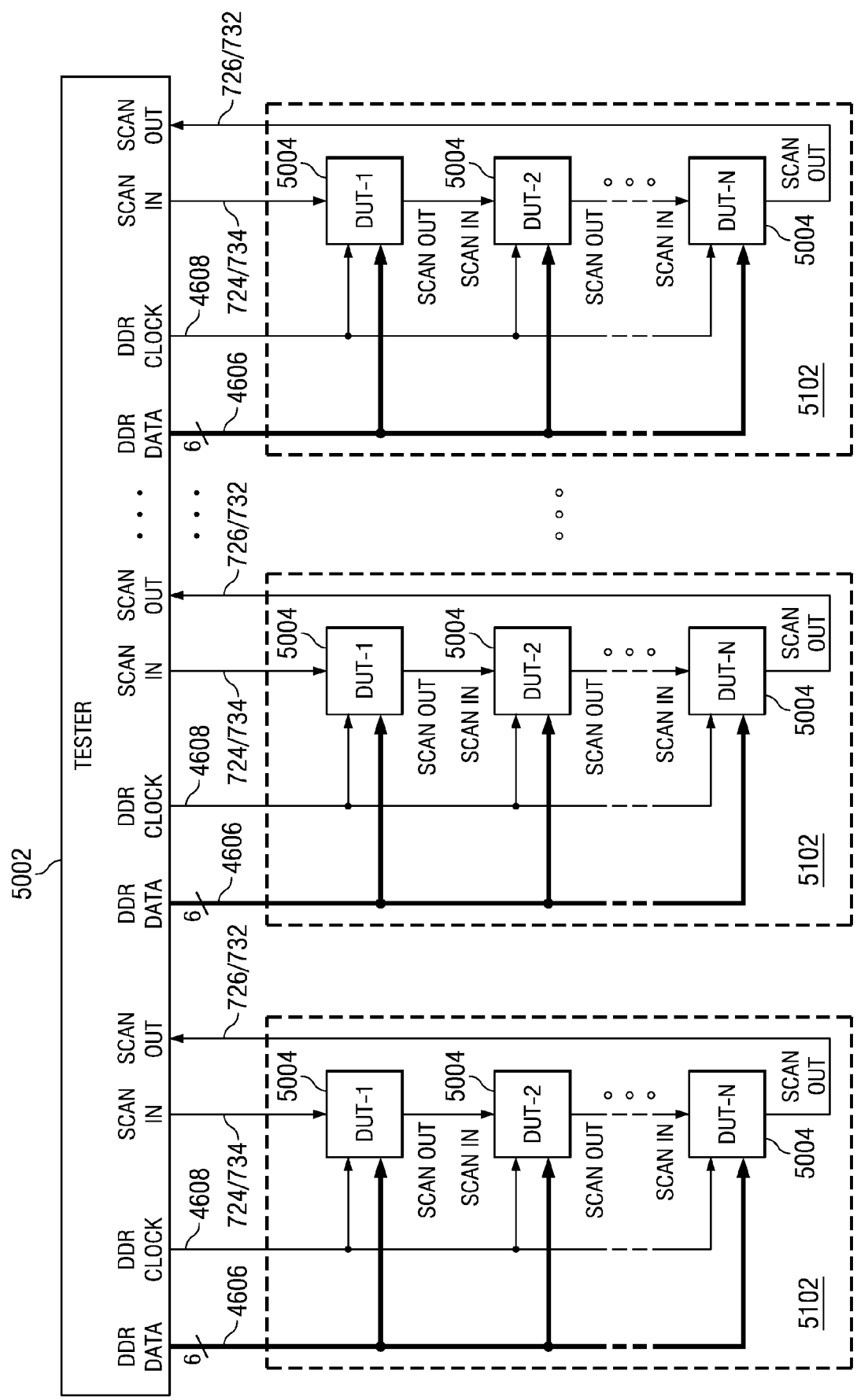
FIG. 51 illustrates a test arrangement between a tester and a plurality of strings of devices using a double data rate (DDR) test interface.

FIG. 51 is provided to illustrate a tester 5002 interfacing to multiple DUT strings 5102 using the reduced test interface of FIGS. 46-49, each DUT string test interface consisting of 6-bit DDR data bus signals 4606, a DDR clock signal 4608, a Scan In signal 724 or 734 and a Scan Out signal 726 or 732 signal. The operation of the tester and DUT strings of FIG. 51 is the same as described in FIG. 36 with the exception that the tester interfaces with the DUT strings using the reduced tests interface signals described in FIGS. 46-49.

Although exemplary embodiments of the present invention are described above, this description does not limit the scope of the invention, which can be practiced in a variety of embodiments.

What is claimed is:

1. An integrated circuit comprising;
   A. functional circuitry for providing the functionality of the integrated circuit; and
   B. test circuitry coupled to the functional circuitry, the test circuitry including:
      (i) controller circuitry coupled to the functional circuitry, and
      (ii) double data rate circuitry, the double data rate circuitry having a double data rate parallel data bus input, a double data rate clock input, a clock output connected to the controller circuitry, a load instruction register output connected to the controller circuitry, mode outputs connected to the controller circuitry, and parallel data bus outputs connected to the controller circuitry and coupled to the functional circuitry.

2. The integrated circuit of claim 1 in which the functional circuitry includes cores of functional circuitry with each core including wrapper circuitry, the wrapper circuitry of each core including:
   i. wrapper control interface circuitry receiving wrapper control inputs and providing interface control outputs;
   ii. a wrapper serial data input and a wrapper serial data output;
   iii. wrapper instruction register circuitry connected to the wrapper serial data input, selectively coupled to the wrapper serial data output, receiving the interface control outputs, and providing instruction control outputs;
   iv. wrapper boundary register circuitry receiving the instruction control outputs, being connected with the wrapper serial data input, inputs to the functional circuitry, and outputs of the functional circuitry, and being selectively coupled to the wrapper serial data output; and
   v. data register scan paths receiving the interface and instruction control outputs, being connected to the functional circuitry and the wrapper serial data input, and being selectively connected with the wrapper serial data output.

3. The integrated circuit of claim 1 in which the test circuitry includes a test access mechanism providing a wrapper parallel input to the functional circuitry, receiving a wrapper parallel output from the functional circuitry, being connected to the parallel data bus outputs of the double data rate circuitry, and being coupled to the controller circuitry.

4. The integrated circuit of claim 1 in which the test circuitry includes a test access mechanism providing a wrapper parallel input to the functional circuitry, receiving a wrapper parallel output from the functional circuitry, being connected to the parallel data bus outputs of the double data rate circuitry, and being coupled to the controller circuitry, the test access mechanism further including a stimulus data memory coupled to the wrapper parallel input to the functional circuitry, and a mask data memory, an expected data memory, and compare circuitry coupled to the wrapper parallel output from the functional circuitry.

* * * * *